US011574958B2

(12) United States Patent
Matsubayashi et al.

(10) Patent No.: US 11,574,958 B2
(45) Date of Patent: Feb. 7, 2023

(54) MEMORY DEVICE

(71) Applicant: Kioxia Corporation, Tokyo (JP)

(72) Inventors: Daisuke Matsubayashi, Sagamihara Kanagawa (JP); Kensuke Ota, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/470,839

(22) Filed: Sep. 9, 2021

(65) Prior Publication Data

US 2022/0271093 A1 Aug. 25, 2022

(30) Foreign Application Priority Data

Feb. 24, 2021 (JP) .............................. JP2021-027896

(51) Int. Cl.
 H01L 27/28 (2006.01)
 H01L 51/05 (2006.01)
 H01L 27/11582 (2017.01)
 G11C 16/06 (2006.01)

(52) U.S. Cl.
 CPC ...... *H01L 27/281* (2013.01); *H01L 27/11582* (2013.01); *H01L 27/283* (2013.01); *H01L 51/055* (2013.01); *H01L 51/0566* (2013.01); *G11C 16/06* (2013.01)

(58) Field of Classification Search
 CPC . G11C 11/5628; G11C 11/5642; G11C 16/06; H01L 27/11582; H01L 27/281; H01L 27/283; H01L 51/055; H01L 51/0566
 See application file for complete search history.

(56) References Cited

U.S. PATENT DOCUMENTS

| 4,481,538 | A | 11/1984 | Battson et al. |
| 6,834,005 | B1 | 12/2004 | Parkin |
| 6,898,132 | B2 | 5/2005 | Parkin |
| 7,031,178 | B2 | 4/2006 | Parkin |
| 10,032,499 | B2 | 7/2018 | Kado et al. |
| 2015/0014752 | A1 | 1/2015 | D'Emic et al. |
| 2015/0276668 | A1* | 10/2015 | Klootwijk .......... G01N 27/4148 |
| | | | 506/13 |
| 2015/0303289 | A1* | 10/2015 | Lee .................... G01N 27/4146 |
| | | | 438/49 |

(Continued)

FOREIGN PATENT DOCUMENTS

JP S48-22369 B1 7/1973

*Primary Examiner* — Ahmed N Sefer
(74) *Attorney, Agent, or Firm* — Foley & Lardner LLP

(57) ABSTRACT

A memory device according to an embodiment includes a fluid layer extending in a first direction, a particle in the fluid layer, a first control electrode made of a first material, a first insulating film provided between the fluid layer and the first control electrode, a second control electrode made of a second material and provided to be spaced apart from the first control electrode in the first direction, a second insulating film provided between the fluid layer and the second control electrode, a third control electrode made of a third material different from the first material and the second material and provided between the first control electrode and the second control electrode, and a third insulating film provided between the fluid layer and the third control electrode.

20 Claims, 58 Drawing Sheets

(56) References Cited

U.S. PATENT DOCUMENTS

| | | | |
|---|---|---|---|
| 2016/0181272 A1* | 6/2016 | Rabkin | H01L 27/11582 |
| | | | 438/268 |
| 2017/0062472 A1* | 3/2017 | Park | H01L 23/5226 |
| 2018/0226424 A1* | 8/2018 | Shin | H01L 27/11582 |
| 2018/0277554 A1* | 9/2018 | Kaneko | H01L 29/1045 |
| 2019/0101524 A1 | 4/2019 | Han et al. | |
| 2019/0115363 A1* | 4/2019 | Choi | H01L 27/11575 |
| 2019/0204294 A1 | 7/2019 | Han et al. | |
| 2019/0242869 A1 | 8/2019 | Mager et al. | |
| 2019/0305096 A1* | 10/2019 | Choi | H01L 27/11582 |
| 2020/0086322 A1* | 3/2020 | Amini | B01F 33/3011 |
| 2021/0159233 A1* | 5/2021 | Lee | H01L 27/1158 |
| 2022/0013529 A1* | 1/2022 | Matsubayashi | G11C 25/00 |
| 2022/0199112 A1* | 6/2022 | Rosmeulen | G11C 25/00 |

\* cited by examiner

AA' CROSS SECTION

BB' CROSS SECTION

CC' CROSS SECTION

FIG.8
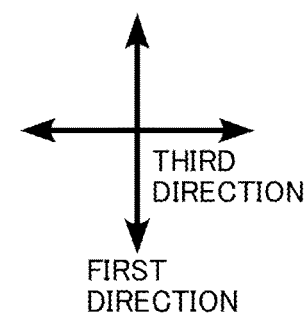
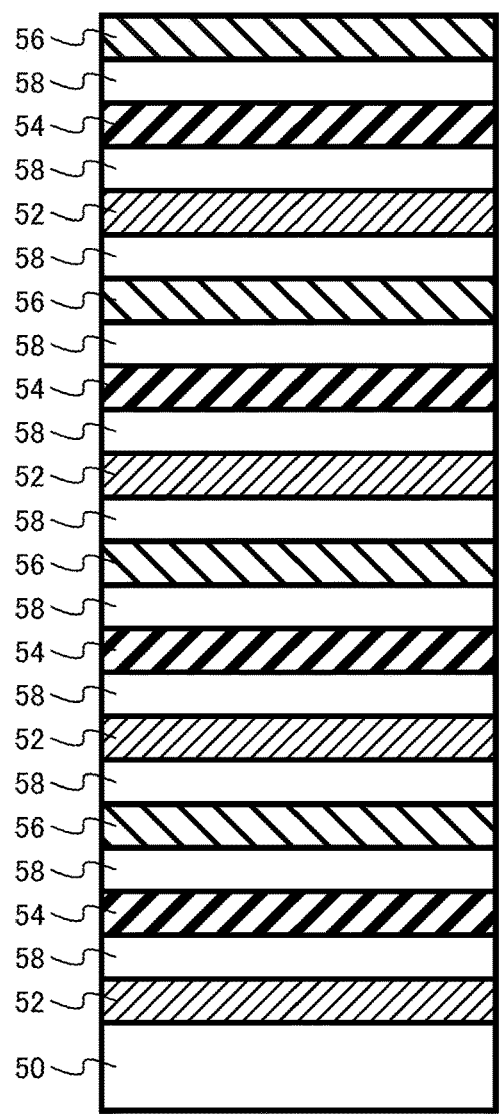

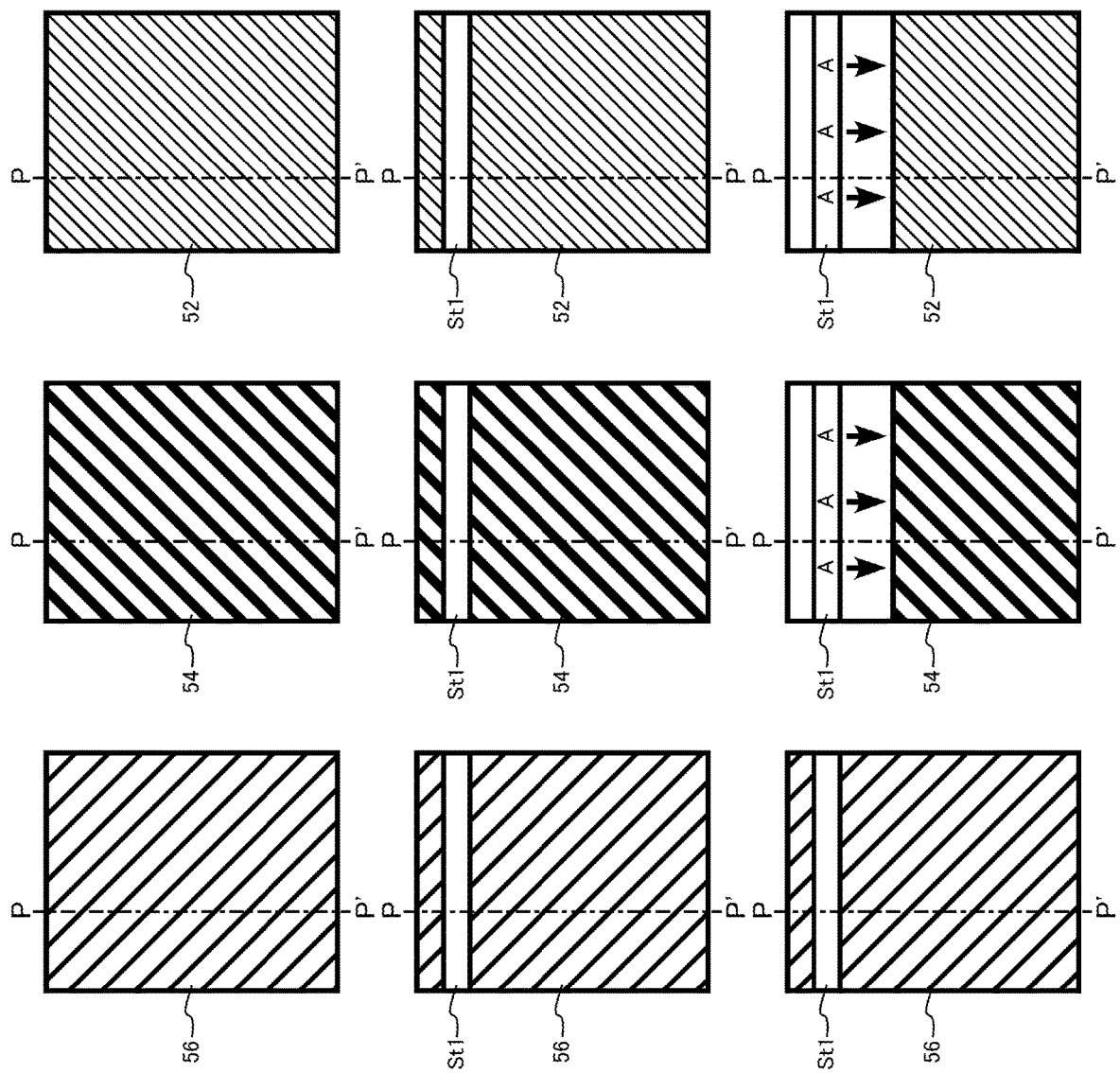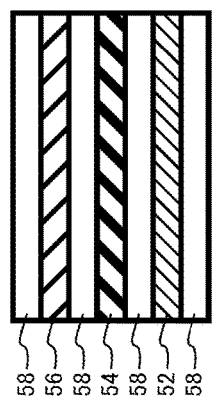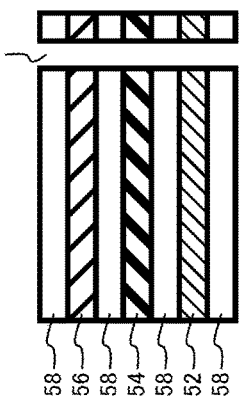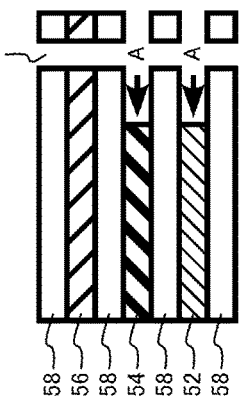
FIG.35A PP' CROSS SECTION
FIG.35B PP' CROSS SECTION
FIG.35C PP' CROSS SECTION

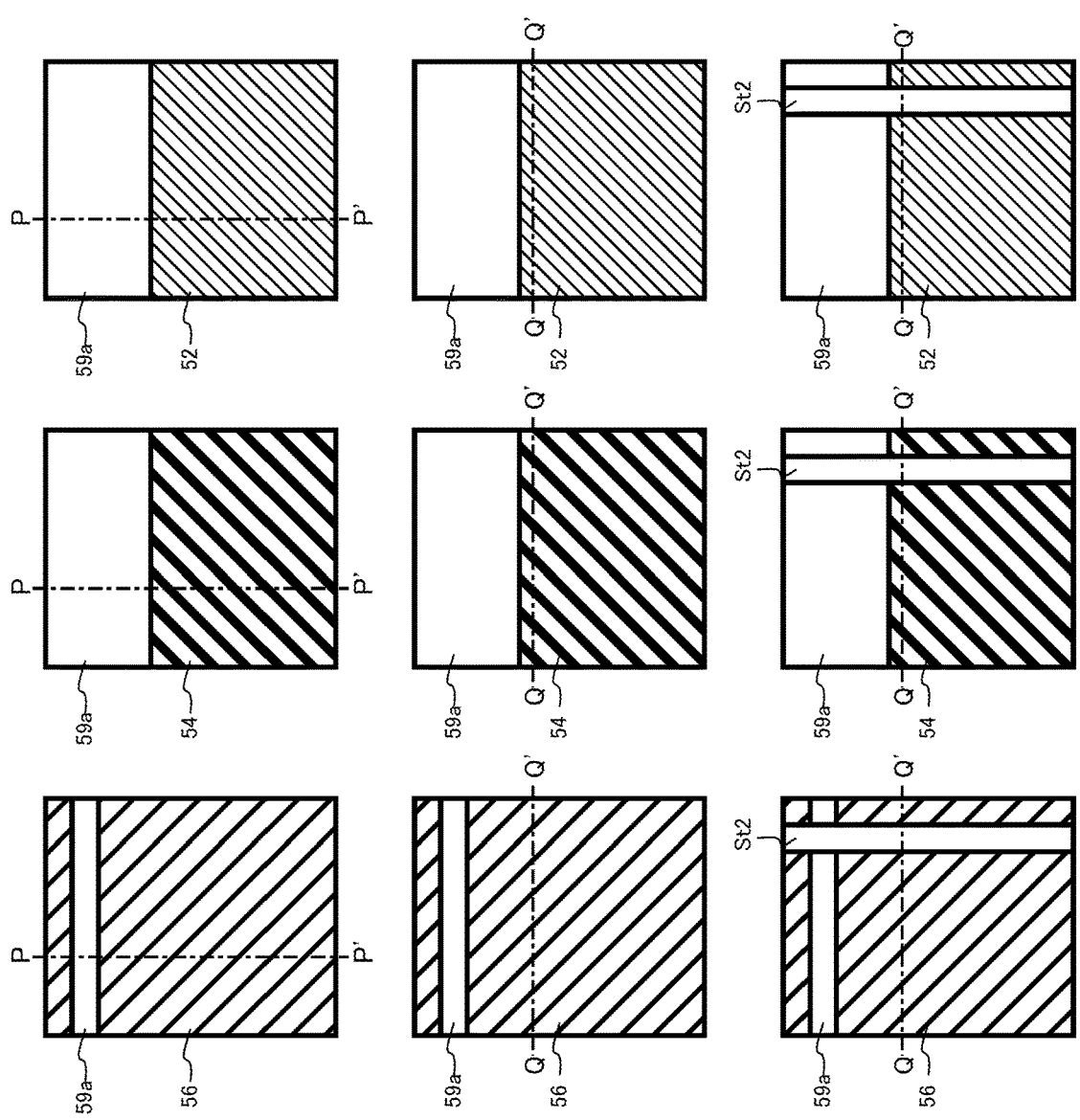
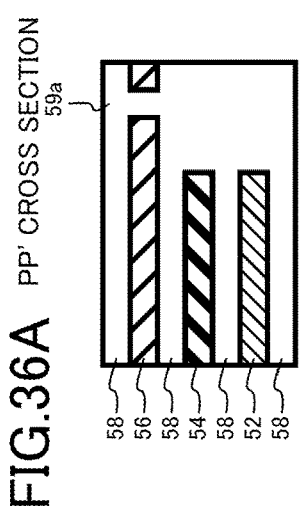
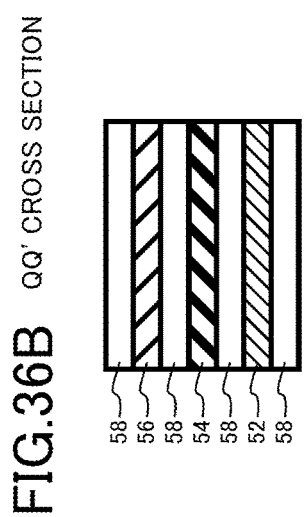
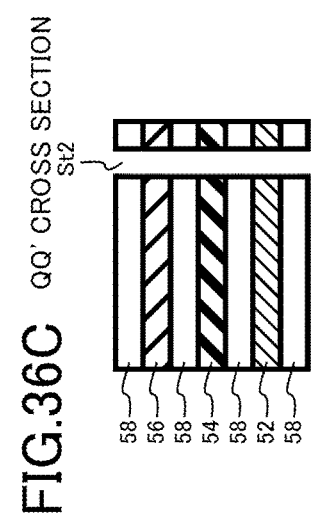
FIG.36A PP' CROSS SECTION
FIG.36B QQ' CROSS SECTION
FIG.36C QQ' CROSS SECTION

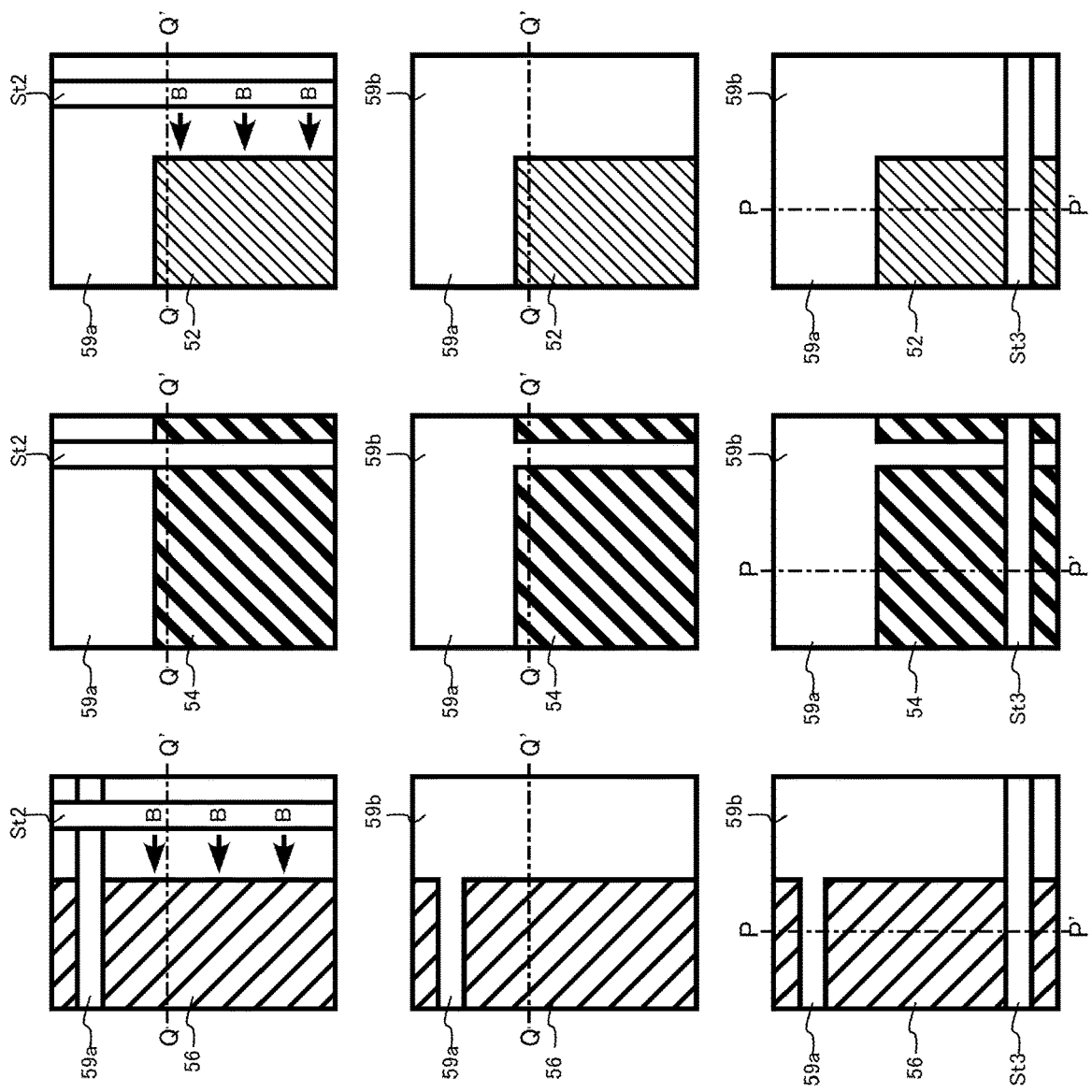
FIG.37A QQ' CROSS SECTION
FIG.37B QQ' CROSS SECTION
FIG.37C PP' CROSS SECTION

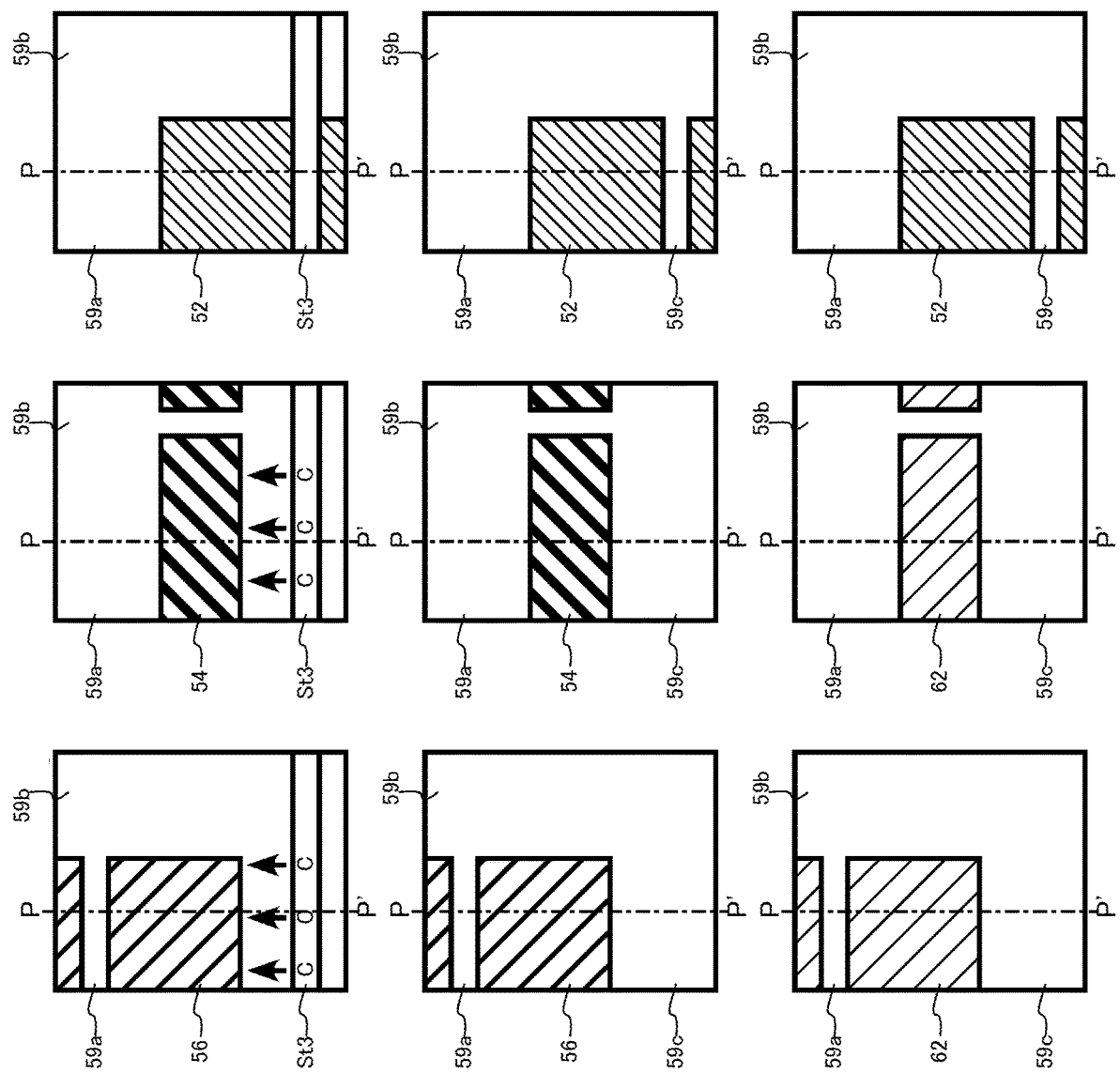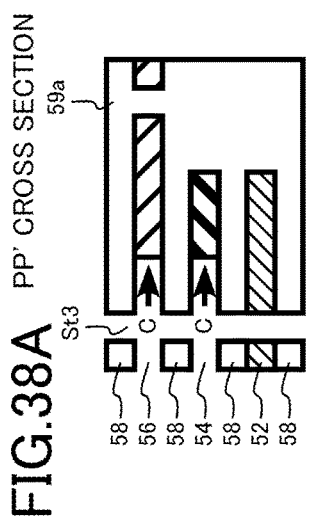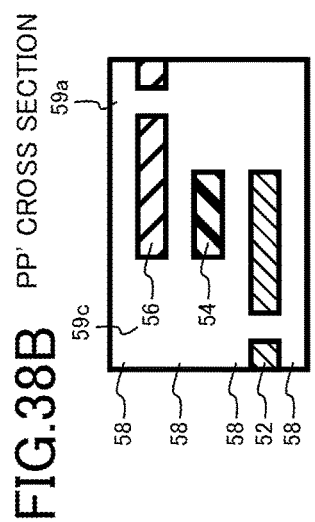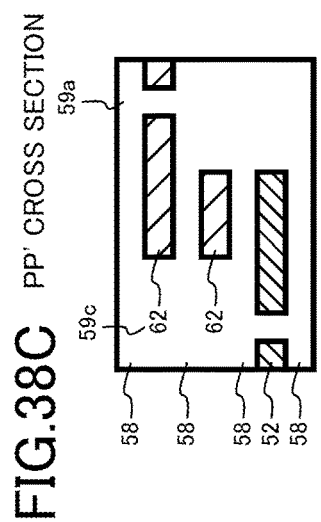
FIG.38A PP' CROSS SECTION
FIG.38B PP' CROSS SECTION
FIG.38C PP' CROSS SECTION

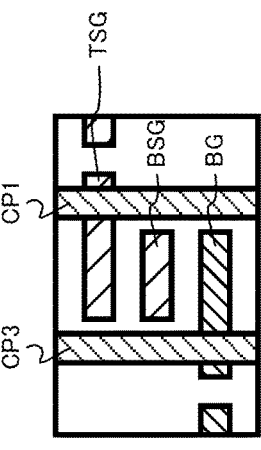
FIG.39A PP' CROSS SECTION
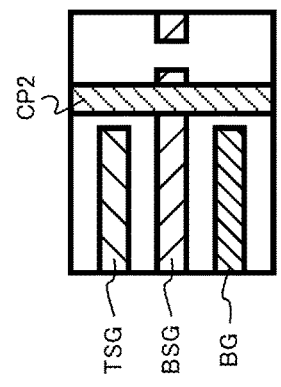
FIG.39B QQ' CROSS SECTION
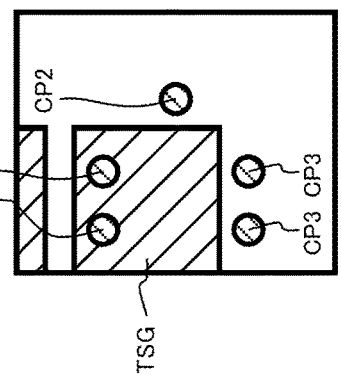
FIG.39C
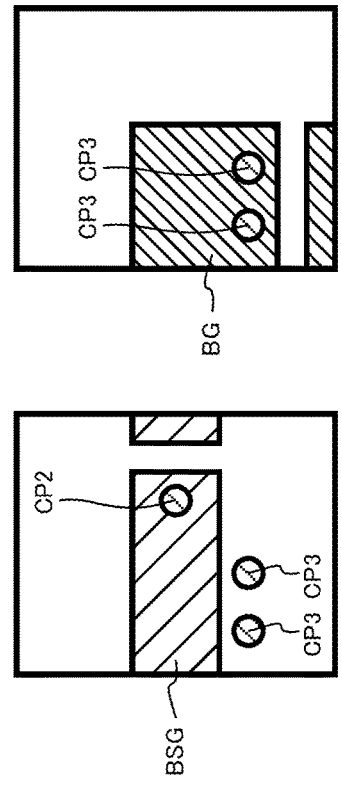

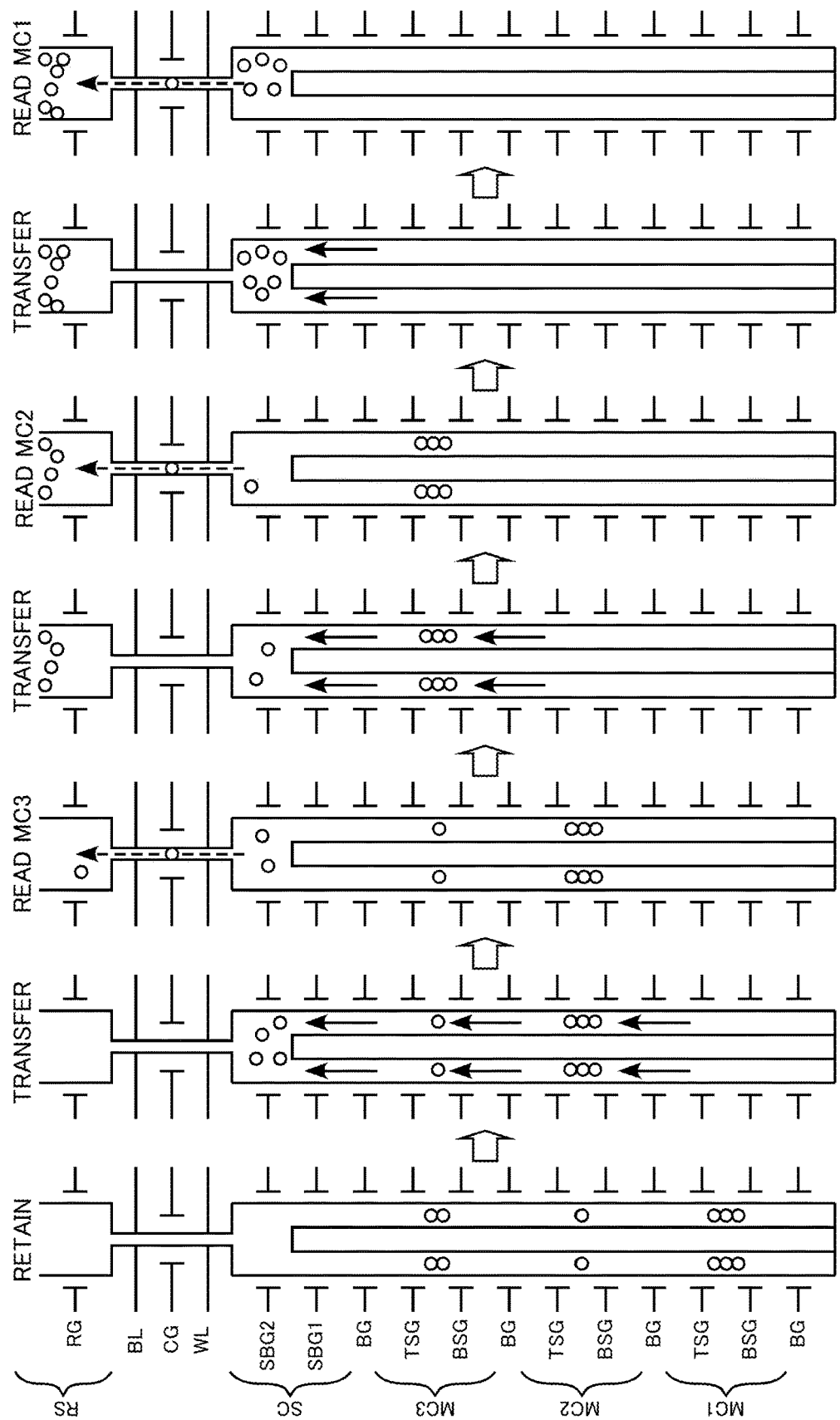

DD' CROSS SECTION

EE' CROSS SECTION

FF' CROSS SECTION

MEMORY DEVICE

CROSS-REFERENCE TO RELATED APPLICATION

This application is based upon and claims the benefit of priority from Japanese Patent Application No. 2021-027896, filed on Feb. 24, 2021, the entire contents of which are incorporated herein by reference.

FIELD

Embodiments described herein relate generally to a memory device.

BACKGROUND

In a three-dimensional NAND flash memory which is one of nonvolatile memories, memory cells are three-dimensionally disposed. The number of memory cells is increased by three-dimensionally disposing the memory cells, and thus, a large capacity of the nonvolatile memory can be realized.

For example, the large capacity of the nonvolatile memory can be realized by setting data to be multivalued by increasing the number of bits of data stored in one memory cell. It is desired to realize a nonvolatile memory capable of setting the data stored in one memory cell to be multivalued.

BRIEF DESCRIPTION OF THE DRAWINGS

FIG. 8 is a schematic cross-sectional view illustrating an example of a method for manufacturing the memory device according to the first embodiment;

FIGS. 35A, 35B, and 35C are schematic diagrams illustrating an example of the method for manufacturing the memory device according to the first embodiment;

FIGS. 36A, 36B, and 36C are schematic diagrams illustrating an example of the method for manufacturing the memory device according to the first embodiment;

FIGS. 37A, 37B, and 37C are schematic diagrams illustrating an example of the method for manufacturing the memory device according to the first embodiment;

FIGS. 38A, 38B, and 38C are schematic diagrams illustrating an example of the method for manufacturing the memory device according to the first embodiment;

FIGS. 39A, 39B, and 39C are schematic diagrams illustrating an example of the method for manufacturing the memory device according to the first embodiment;

FIG. 47 is an explanatory diagram of the read operation of the memory device according to the first embodiment;

DETAILED DESCRIPTION

Figure 1:
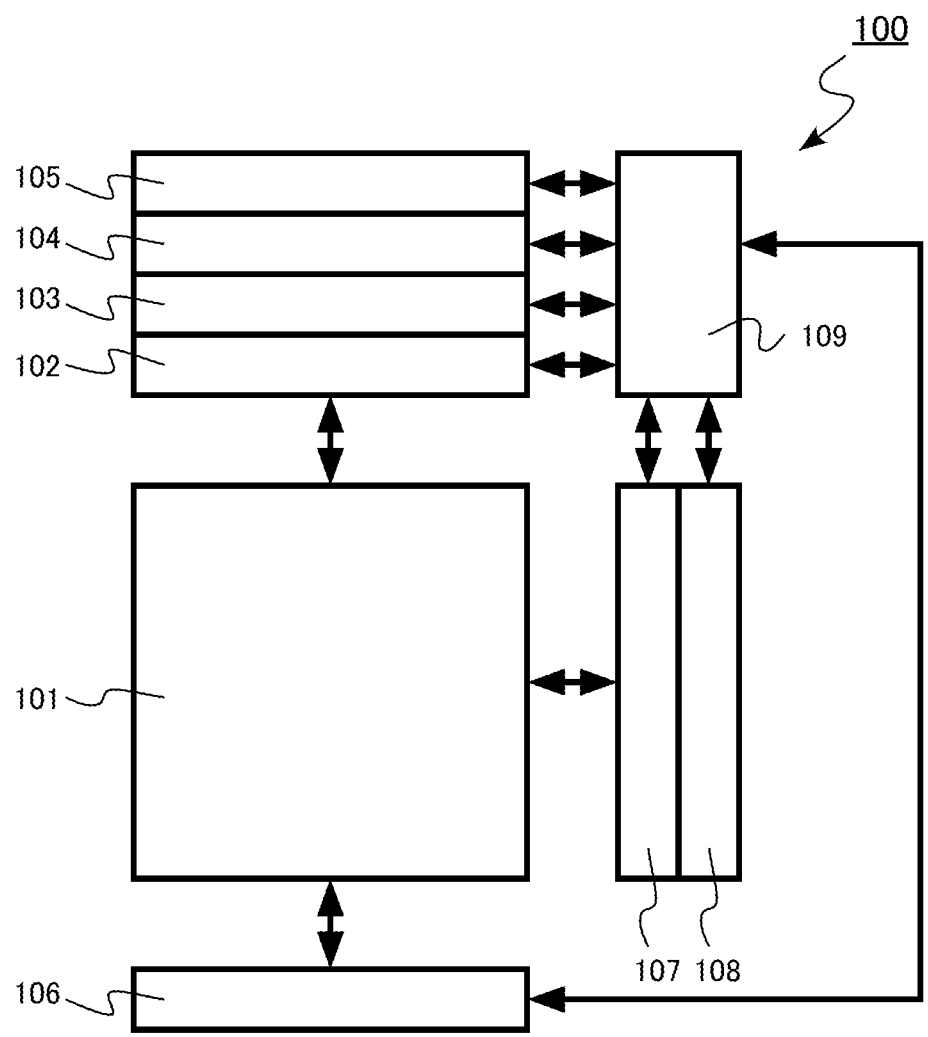
FIG. 1 is a block diagram of a memory device according to a first embodiment.

A memory device according to an embodiment includes a fluid layer extending in a first direction; a particle in the fluid layer; a first control electrode made of a first material; a first insulating film provided between the fluid layer and the first control electrode; a second control electrode made of a second material, the second control electrode being spaced apart from the first control electrode in the first direction; a second insulating film provided between the fluid layer and the second control electrode; a third control electrode made of a third material different from the first material and the second material, the third control electrode provided between the first control electrode and the second control electrode; and a third insulating film provided between the fluid layer and the third control electrode.

Hereinafter, embodiments will be described with reference to the drawings. In the following description, the same or similar members will be denoted by the same reference numerals, and the description of the members once described will be appropriately omitted.

For identification of members constituting a memory device, for example, secondary ion mass spectroscopy (SIMS), energy dispersive X-ray spectroscopy (EDX), X-ray diffraction analysis (XRD), electron beam diffraction (EBD), X-ray photoelectron spectroscopy (XPS), synchrotron radiation X-ray absorption fine structure (XAFS), liquid chromatography, gas chromatography, or ion chromatography can be used.

For example, a transmission electron microscope (TEM) can be used to measure thicknesses of the members constituting the memory device, a distance between the members, and the like.

In the present specification, a case where two materials are different materials means that chemical compositions of the two materials are different. For example, when the two materials are both polycrystalline silicon and an amount ratio of impurities contained is different, the two materials are regarded as different materials. For example, when two materials formed under the same process condition have different chemical compositions within a process variation range, the two materials are regarded as the same material.

First Embodiment

A memory device according to a first embodiment includes a fluid layer extending in a first direction, a particle in the fluid layer, a first control electrode made of a first material, a first insulating film provided between the fluid layer and the first control electrode, a second control electrode made of a second material and provided to be spaced apart from the first control electrode in the first direction, a second insulating film provided between the fluid layer and the second control electrode, a third control electrode made of a third material different from the first material and the second material and provided between the first control electrode and the second control electrode, and a third insulating film provided between the fluid layer and the third control electrode.

The memory device according to the first embodiment is a nonvolatile memory 100 in which memory cells are three-dimensionally disposed. The nonvolatile memory 100 stores data in memory cells by using charged particles in a fluid layer.

Figure 2:
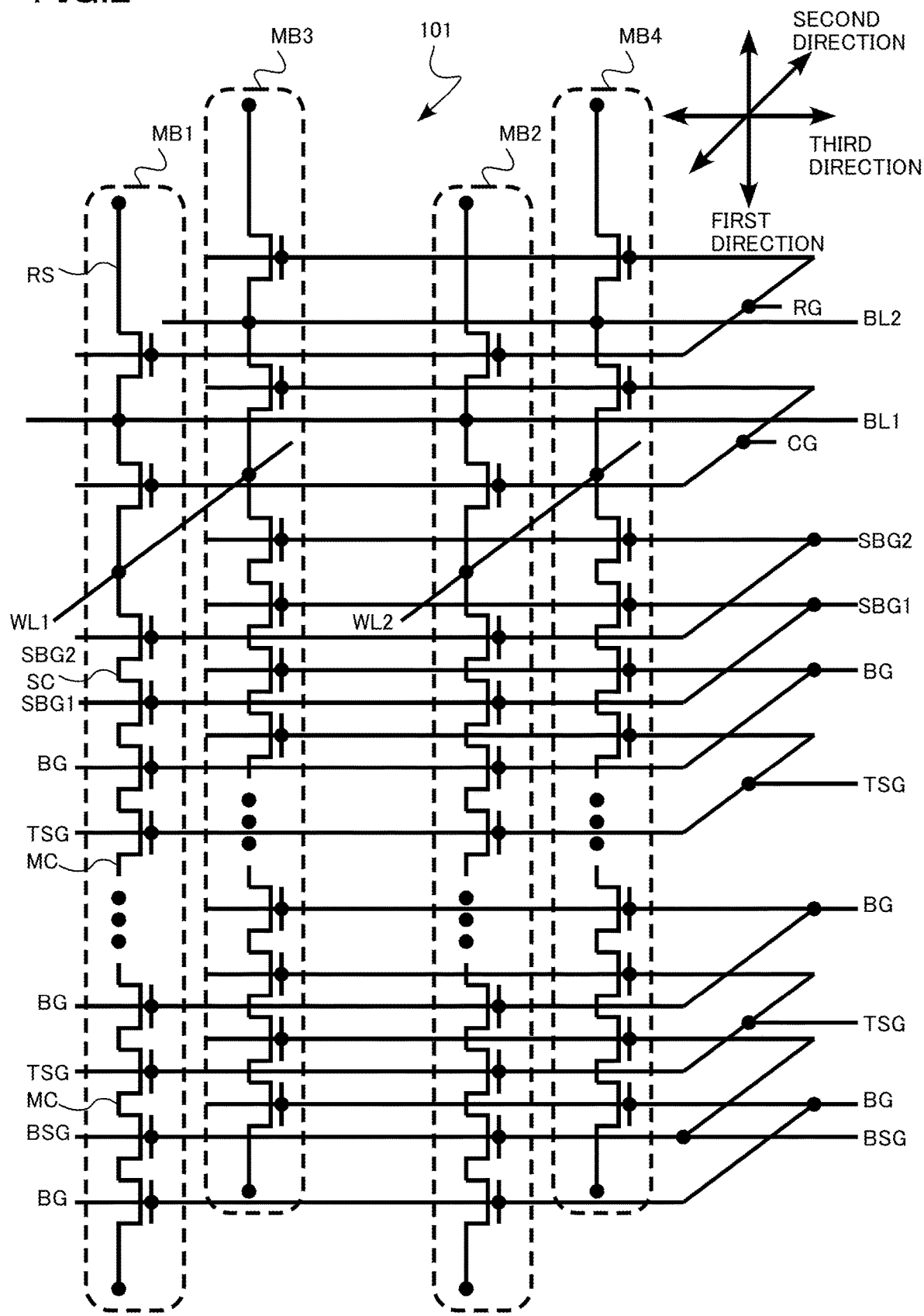
FIG. 2 is an equivalent circuit diagram of a memory cell array of the memory device according to the first embodiment.

FIG. 1 is a block diagram of the memory device according to the first embodiment. FIG. 2 is an equivalent circuit diagram of a memory cell array of the memory device according to the first embodiment.

As illustrated in FIG. 1, the nonvolatile memory 100 includes a memory cell array 101, a cell gate control circuit 102, a stand-by gate control circuit 103, a cock gate control circuit 104, a reservoir gate control circuit 105, a word line control circuit 106, a bit line control circuit 107, a sense amplifier circuit 108, and a central control circuit 109.

As illustrated in FIG. 2, the memory cell array 101 includes a first word line WL1, a second word line WL2, a first bit line BL1, a second bit line BL2, a reservoir gate electrode RG, a cock gate electrode CG, a first stand-by electrode SBG1, a second stand-by electrode SBG2, barrier gate electrodes BG, lower storage gate electrodes BSG, upper storage gate electrodes TSG, a first memory bottle MB1, a second memory bottle MB2, a third memory bottle MB3, and a fourth memory bottle MB4.

Hereinafter, the first word line WL1 and the second word line WL2 may be individually or collectively referred to as a word line WL. The first bit line BL1 and the second bit line BL2 may be individually or collectively referred to as a bit line BL. The first memory bottle MB1, the second memory bottle MB2, the third memory bottle MB3, and the fourth memory bottle MB4 may be individually or collectively referred to as a memory bottle MB.

Each memory bottle MB includes a plurality of memory cells MC, a stand-by cell SC, and a reservoir RS.

In the memory cell array 101, a plurality of barrier gate electrodes BG, a plurality of lower storage gate electrodes BSG, and a plurality of upper storage gate electrodes TSG are stacked in a first direction. The first direction is, for example, a direction from the word line WL to the bit line BL. A direction from the bit line BL to the word line WL is also referred to as the first direction.

The barrier gate electrodes BG, the lower storage gate electrodes BSG, and the upper storage gate electrodes TSG are repeatedly stacked in the above order. The lower storage gate electrode BSG and the upper storage gate electrode TSG are provided between two barrier gate electrodes BG. In the memory bottle MB, a region sandwiched between two barrier gates is the memory cell MC.

The barrier gate electrode BG and the lower storage gate electrode BSG are electrically isolated from each other. The barrier gate electrode BG and the upper storage gate electrode TSG are electrically isolated from each other. The lower storage gate electrode BSG and the upper storage gate electrode TSG are electrically isolated from each other.

The plurality of barrier gate electrodes BG is electrically connected to each other. The plurality of lower storage gate electrodes BSG is electrically connected to each other. The plurality of upper storage gate electrodes TSG is electrically connected to each other.

The first stand-by electrode SBG1 and the second stand-by electrode SBG2 are provided in the first direction of the uppermost barrier gate electrode BG. The first stand-by electrode SBG1 and the second stand-by electrode SBG2 are provided on the uppermost barrier gate electrode BG.

The first stand-by electrode SBG1 and the second stand-by electrode SBG2 are provided between the barrier gate electrode BG and the word line WL. A region between the barrier gate electrode BG of the memory bottle MB and the word line WL is the stand-by cell SC.

The first stand-by electrode SBG1 and the second stand-by electrode SBG2 are electrically isolated from each other.

The plurality of word lines WL extends in a second direction. The second direction intersects the first direction. The second direction is, for example, a direction perpendicular to the first direction. The first word line WL1 is shared between the first memory bottle MB1 and the third memory bottle MB3. The second word line WL2 is shared between the second memory bottle MB2 and the fourth memory bottle MB4.

The plurality of bit lines BL extends in a third direction. The third direction intersects the first direction. The third direction intersects the second direction. The third direction is a direction perpendicular to the first direction and the second direction. The first bit line BL1 is shared between the first memory bottle MB1 and the second memory bottle MB2. The second bit line BL2 is shared between the third memory bottle MB3 and the fourth memory bottle MB4.

The cock gate electrode CG is provided between the word line WL and the bit line BL.

The reservoir gate electrode RG is provided in the first direction of the bit line BL. The reservoir gate electrode RG is provided on the bit line BL.

The reservoir RS is provided in the first direction of the reservoir gate electrode RG. The reservoir RS is provided on the reservoir gate electrode RG.

The memory bottle MB extends in the first direction. One word line and one bit line BL are connected to one memory bottle MB.

The memory bottle MB includes the plurality of memory cells MC, the stand-by cell SC, and the reservoir RS connected in series.

In FIG. 2, although a case where the number of memory bottles MB in the memory cell array 101 is four has been described as an example, the number of memory bottles MB is not limited to four.

The barrier gate electrodes BG, the lower storage gate electrodes BSG, and the upper storage gate electrodes TSG are connected to the cell gate control circuit 102. The cell gate control circuit 102 has a function of applying voltages to the barrier gate electrodes BG, the lower storage gate electrodes BSG, and the upper storage gate electrodes TSG at predetermined timings.

The first stand-by electrode SBG1 and the second stand-by electrode SBG2 are connected to the stand-by gate control circuit 103. The stand-by gate control circuit 103 has a function of applying voltages to the first stand-by electrode SBG1 and the second stand-by electrode SBG2 at predetermined timings.

The cock gate electrode CG is connected to the cock gate control circuit 104. The cock gate control circuit 104 has a function of applying a voltage to the cock gate electrode CG at a predetermined timing.

The reservoir gate electrode RG is connected to the reservoir gate control circuit 105. The reservoir gate control circuit 105 has a function of applying a voltage to the reservoir gate electrode RG at a predetermined timing.

The plurality of word lines WL is connected to the word line control circuit 106. The word line control circuit 106 has a function of applying a voltage to the word line WL at a predetermined timing.

The plurality of bit lines BL is connected to the bit line control circuit 107. The bit line control circuit 107 has a function of applying a voltage to the bit line BL at a predetermined timing.

The sense amplifier circuit 108 is connected to the bit line BL. The sense amplifier circuit 108 has a function of amplifying and detecting data stored in the memory cell MC based on a current flowing through the bit line BL. For example, after the data stored in the memory cell MC is transferred to the stand-by cell SC, the sense amplifier circuit 108 amplifies and detects the data stored in the memory cell MC based on the current flowing through the bit line BL.

The central control circuit 109 controls a read operation and a write operation of the nonvolatile memory 100. The central control circuit 109 controls the cell gate control circuit 102, the stand-by gate control circuit 103, the cock gate control circuit 104, the reservoir gate control circuit 105, the word line control circuit 106, the bit line control circuit 107, and the sense amplifier circuit 108.

FIGS. 3, 4, 5A, 5B, and 5C are schematic cross-sectional views of the memory device according to the first embodiment. FIGS. 3, 4, 5A, 5B, and 5C are schematic cross-sectional views of the memory cell array 101. FIGS. 3, 4, 5A, 5B, and 5C are schematic cross-sectional views including the first memory bottle MB1.

Figure 3:
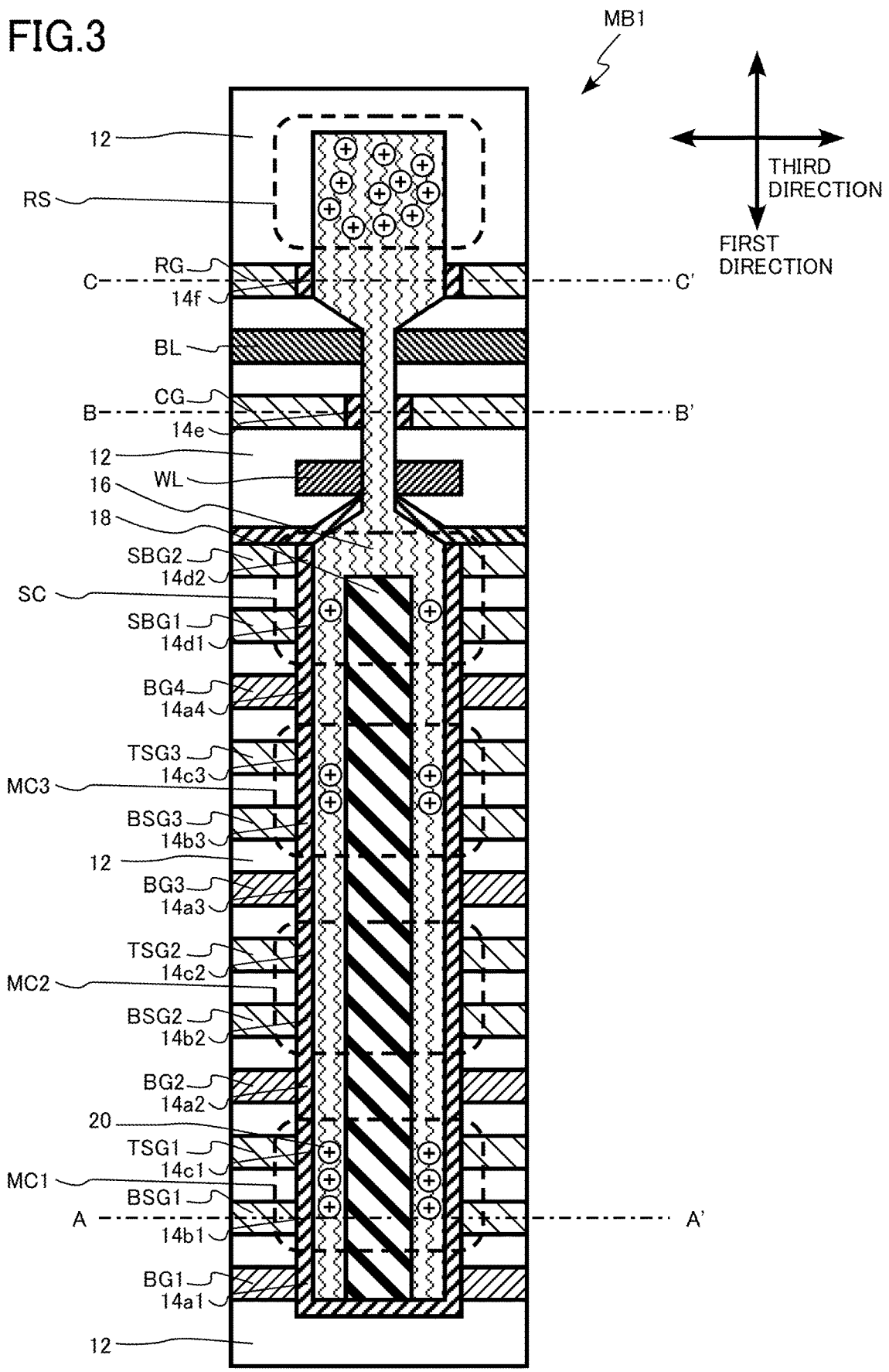
FIG. 3 is a schematic cross-sectional view of the memory device according to the first embodiment.
Figure 4:
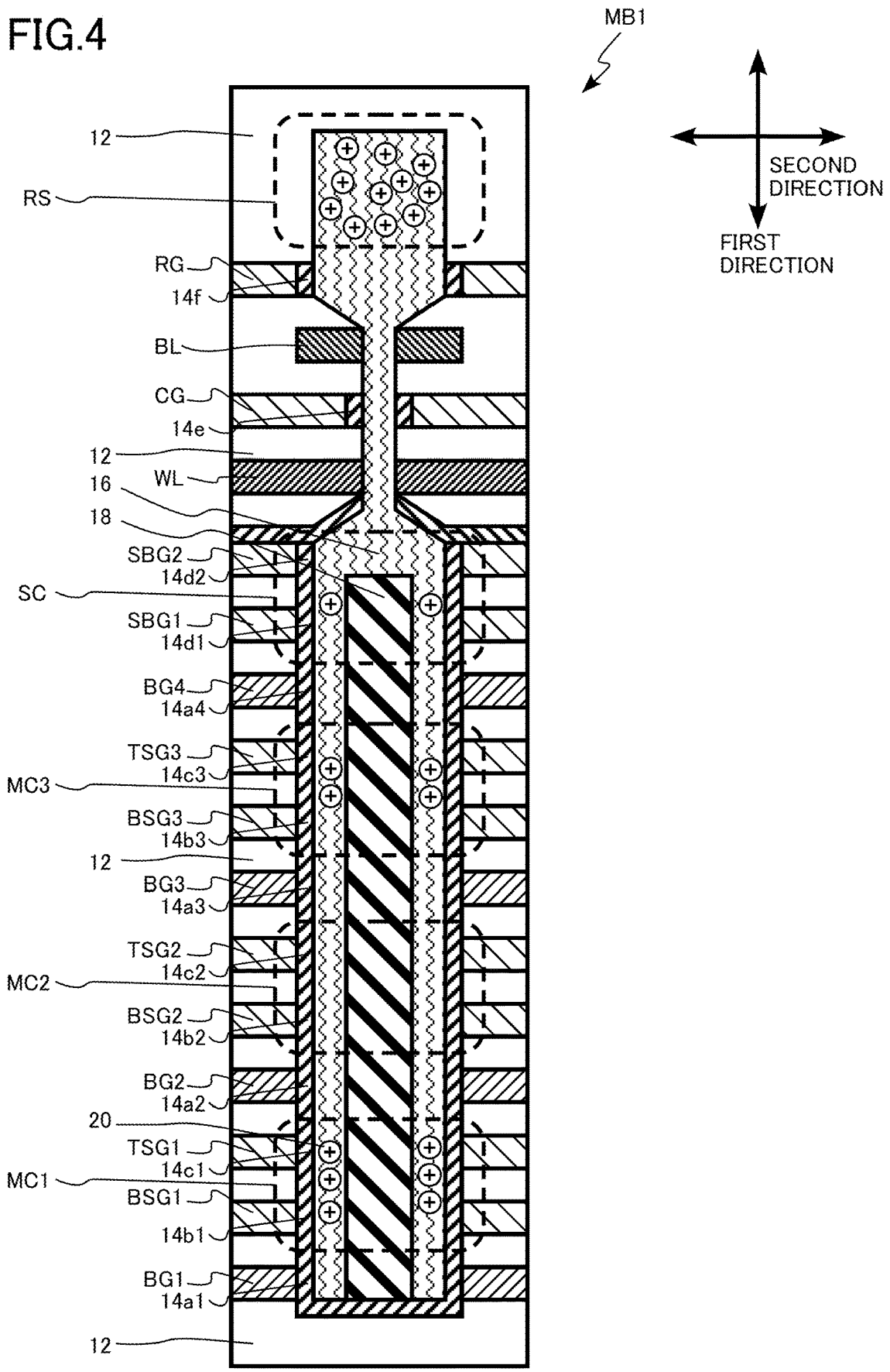
FIG. 4 is a schematic cross-sectional view of the memory device according to the first embodiment.
Figure 5A:
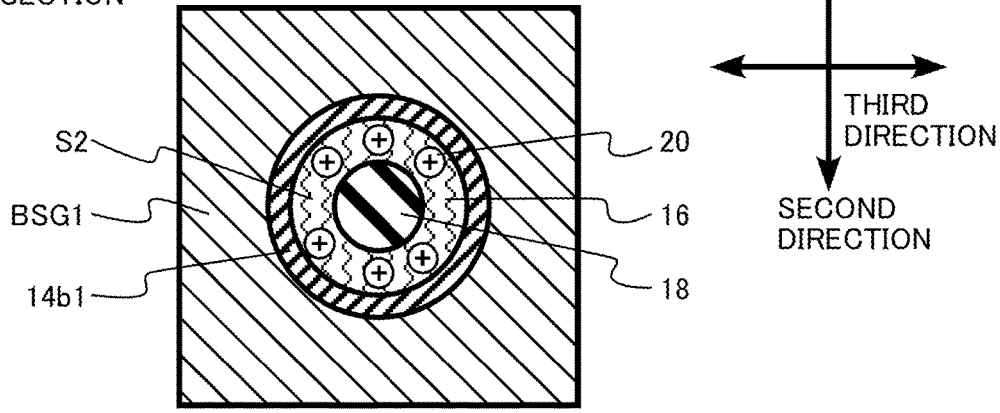
FIGS. 5A, 5B, and 5C are schematic cross-sectional views of the memory device according to the first embodiment.
Figure 5B:
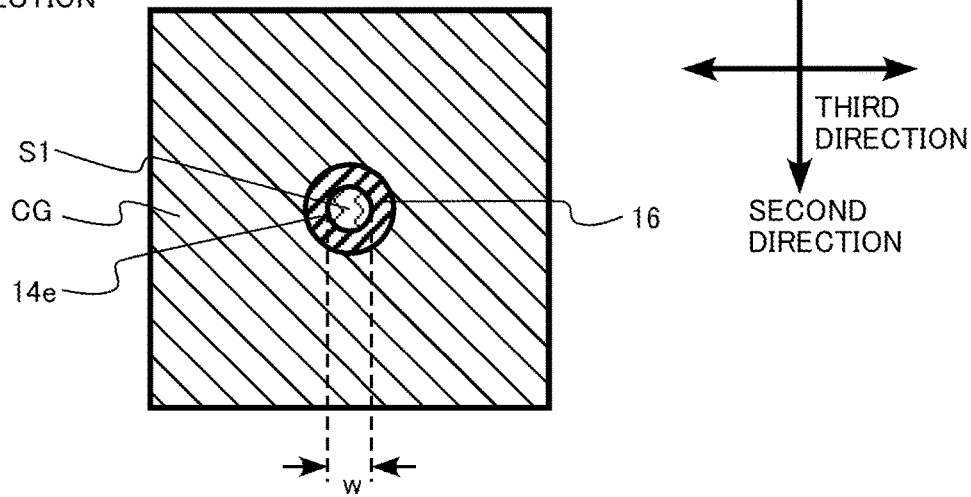
Figure 5C:
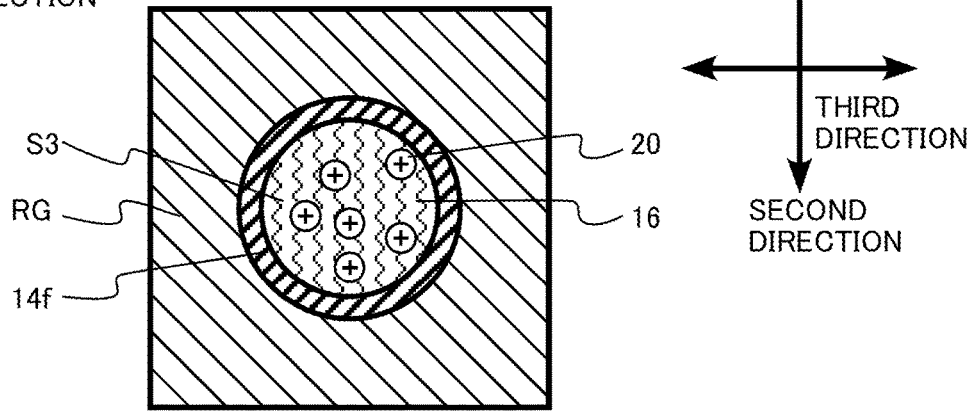

FIG. 3 is a cross section parallel to the first direction and the third direction. FIG. 4 is a cross section parallel to the first direction and the second direction. FIGS. 5A, 5B, and 5C are cross sections perpendicular to the first direction. FIG. 5A is a cross section taken along a line AA' in FIG. 3, FIG. 5B is a cross section taken along a line BB' in FIG. 3, and FIG. 5C is a cross section taken along a line CC' in FIG. 3.

The memory cell array 101 includes a first barrier gate electrode BG1, a second barrier gate electrode BG2, a third barrier gate electrode BG3, a fourth barrier gate electrode BG4, a first lower storage gate electrode BSG1, a second lower storage gate electrode BSG2, a third lower storage gate electrode BSG3, a first upper storage gate electrode TSG1, a second upper storage gate electrode TSG2, a third upper storage gate electrode TSG3, the first stand-by electrode SBG1, the second stand-by electrode SBG2, the word line WL, the cock gate electrode CG, the bit line BL, and the reservoir gate electrode RG.

Hereinafter, the first barrier gate electrode BG1, the second barrier gate electrode BG2, the third barrier gate electrode BG3, and the fourth barrier gate electrode BG4 may be individually or collectively referred to as the barrier gate electrode BG. The first lower storage gate electrode BSG1, the second lower storage gate electrode BSG2, and the third lower storage gate electrode BSG3 may be individually or collectively referred to as the lower storage gate electrode BSG. The first upper storage gate electrode TSG1, the second upper storage gate electrode TSG2, and the third upper storage gate electrode TSG3 may be individually or collectively referred to as the upper storage gate electrode TSG.

The memory cell array 101 includes interlayer insulating layers 12, a first barrier gate insulating film 14$a$1, a second barrier gate insulating film 14$a$2, a third barrier gate insulating film 14$a$3, a fourth barrier gate insulating film 14$a$4, a first lower storage gate insulating film 14$b$1, a second lower storage gate insulating film 14$b$2, a third lower storage gate insulating film 14$b$3, a first upper storage gate insulating film 14$c$1, a second upper storage gate insulating film 14$c$2, a third upper storage gate insulating film 14$c$3, a first stand-by gate insulating film 14$d$1, a second stand-by gate insulating film 14$d$2, a cock gate insulating film 14$e$, a reservoir gate insulating film 14$f$, a fluid layer 16, a core insulator 18, and charged particles 20.

Hereinafter, the first barrier gate insulating film 14$a$1, the second barrier gate insulating film 14$a$2, the third barrier gate insulating film 14$a$3, the fourth barrier gate insulating film 14$a$4, the first lower storage gate insulating film 14$b$1, the second lower storage gate insulating film 14$b$2, the third lower storage gate insulating film 14$b$3, the first upper storage gate insulating film 14$c$1, the second upper storage gate insulating film 14$c$2, the third upper storage gate insulating film 14$c$3, the first stand-by gate insulating film 14$d$1, the second stand-by gate insulating film 14$d$2, the cock gate insulating film 14$e$, and the reservoir gate insulating film 14$f$ may be individually or collectively referred to as a gate insulating film 14.

The memory bottle MB includes a first memory cell MC1, a second memory cell MC2, a third memory cell MC3, the stand-by cell SC, and the reservoir RS. Hereinafter, the first memory cell MC1, the second memory cell MC2, and the third memory cell MC3 may be individually or collectively referred to as the memory cell MC. The number of memory cells MC included in one memory bottle MB is not limited to three.

The first barrier gate electrode BG1 is an example of a first control electrode. The second barrier gate electrode BG2 is an example of a second control electrode. The first lower storage gate electrode BSG1 is an example of a third control electrode. The first upper storage gate electrode TSG1 is an example of a fourth control electrode. The cock gate electrode CG is an example of a fifth control electrode. The first stand-by electrode SBG1 is an example of a sixth control electrode. The reservoir gate electrode RG is an example of a seventh control electrode. The third barrier gate electrode BG3 is an example of an eighth control electrode. The second lower storage gate electrode BSG2 is an example of a ninth control electrode.

The word line WL is an example of a first conductive layer. The bit line BL is an example of a second conductive layer.

The core insulator 18 is an example of an insulator. The charged particles 20 are an example of particles.

The first barrier gate insulating film 14$a$1 is an example of a first insulating film. The second barrier gate insulating film 14$a$2 is an example of a second insulating film. The first lower storage gate insulating film 14$b$1 is an example of a third insulating film. The first upper storage gate insulating film 14$c$1 is an example of a fourth insulating film. The cock gate insulating film 14$e$ is an example of a fifth insulating film. The first stand-by gate insulating film 14$d$1 is an example of a sixth insulating film. The reservoir gate insulating film 14$f$ is an example of a seventh insulating film. The third barrier gate insulating film 14$a$3 is an example of an eighth insulating film. The second lower storage gate insulating film 14$b$2 is an example of a ninth insulating film.

The fluid layer 16 extends in the first direction. The fluid layer 16 is surrounded by the barrier gate electrode BG. The fluid layer 16 is surrounded by the lower storage gate electrode BSG. The fluid layer 16 is surrounded by the upper storage gate electrode TSG. The fluid layer 16 is surrounded by the first stand-by electrode SBG1 and the second stand-by electrode SBG2. The fluid layer 16 is surrounded by the cock gate electrode CG. The fluid layer 16 is surrounded by the reservoir gate electrode RG.

The fluid layer 16 is surrounded by, for example, the word line WL. The fluid layer 16 is surrounded by, for example, the bit line BL.

The fluid layer 16 is electrically connected to the word line WL and the bit line BL. The fluid layer 16 is in contact with the word line WL and the bit line BL.

The fluid layer 16 is surrounded by the interlayer insulating layers 12. The fluid layer 16 is surrounded by the gate insulating film 14. The fluid layer 16 is in contact with, for example, the interlayer insulating layer 12 and the gate insulating film 14.

The fluid layer 16 surrounds the core insulator 18.

The fluid layer 16 has a function of causing a current to flow between the word line WL and the bit line BL.

The fluid layer 16 includes a liquid. A melting point of the liquid contained in the fluid layer 16 is, for example, equal to or more than minus 100° C. and equal to or less than 0° C. A boiling point of the liquid contained in the fluid layer 16 is, for example, equal to or more than 400° C. and equal to or less than 2000° C.

The fluid layer 16 contains, for example, charges. The liquid contained in the fluid layer 16 is, for example, an ionic liquid or an electrolyte solution. The liquid contained in the fluid layer 16 contains, for example, ions.

The charged particles 20 are contained in the fluid layer 16. The charged particles 20 are particles with charges. The charged particles 20 are an example of particles. The memory cell MC stores data by using the charged particles 20.

Hereinafter, although a case where the charged particles 20 have positive charges will be described as an example, the charged particles 20 may have negative charges.

The charged particles 20 are, for example, spherical. A particle size of the charged particle 20 is, for example, equal to or more than 1 nm and equal to or less than 10 nm.

The charged particles 20 are, for example, metal nanoparticles, dielectric nanoparticles, colloidal particles, or molecules.

The plurality of barrier gate electrodes BG is stacked in the first direction. The second barrier gate electrode BG2 is provided to be spaced apart from the first barrier gate electrode BG1 in the first direction. The third barrier gate electrode BG3 is provided to be spaced apart from the second barrier gate electrode BG2 in the first direction.

The barrier gate electrode BG surrounds the fluid layer 16. The barrier gate electrode BG is, for example, a plate-like conductor. The barrier gate electrode BG has a function of retaining the charged particles 20 in the memory cell MC. The barrier gate electrode BG has a function of moving the charged particles 20 by changing an electrostatic potential of the fluid layer 16.

The first barrier gate electrode BG1 is made of a first material. The first material has a first work function. The second barrier gate electrode BG2 is made of a second material. The second material has a second work function. The third barrier gate electrode BG3 is made of an eighth material. The eighth material has an eighth work function.

The first material, the second material, and the eighth material are, for example, a metal, a metal nitride, a metal carbide, or a semiconductor. The first material, the second material, and the eighth material are, for example, n-type polycrystalline silicon. The first material, the second material, and the eighth material are, for example, polycrystalline silicon containing phosphorus (P) or arsenic (As) as n-type impurities.

The first material, the second material, and the eighth material are, for example, the same. The first work function, the second work function, and the eighth work function are, for example, the same.

The fourth barrier gate electrode BG4 is made of, for example, the first material, the second material, or the eighth material.

A thickness of the barrier gate electrode BG in the first direction is, for example, equal to or more than 10 nm and equal to or less than 50 nm.

The plurality of lower storage gate electrodes BSG is stacked in the first direction. The lower storage gate electrode BSG is provided between the two barrier gate electrodes BG. The first lower storage gate electrode BSG1 is provided between the first barrier gate electrode BG1 and the second barrier gate electrode BG2.

The lower storage gate electrode BSG surrounds the fluid layer 16. The lower storage gate electrode BSG has a function of moving the charged particles 20 by changing the electrostatic potential of the fluid layer 16. The lower storage gate electrode BSG is, for example, a plate-like conductor.

The first lower storage gate electrode BSG1 is made of a third material. The third material has a third work function. The second lower storage gate electrode BSG2 is made of a ninth material. The ninth material has a ninth work function.

The third material is different from the first material and the second material. The ninth material is different from the eighth material. The third material and the ninth material are, for example, the same.

A chemical composition of the third material is different from chemical compositions of the first material and the second material. A chemical composition of the ninth material is different from a chemical composition of the eighth material. The chemical compositions of the third material and the ninth material are, for example, the same.

The third work function is different from the first work function and the second work function. The third work function is larger than, for example, the first work function and the second work function. The ninth work function is larger than the eighth work function. The third work function and the ninth work function are, for example, the same.

A difference between the third work function and the first work function is, for example, equal to or more than 0.5 eV. A difference between the third work function and the second work function is, for example, equal to or more than 0.5 eV. A difference between the ninth work function and the eighth work function is, for example, equal to or more than 0.5 eV.

The third material and the ninth material are, for example, a metal, a metal nitride, a metal carbide, or a semiconductor. The third material and the ninth material are, for example, p-type polycrystalline silicon. The third material is, for example, polycrystalline silicon containing boron (B) as a p-type impurity.

The third lower storage gate electrode BSG3 is made of, for example, the third material or the ninth material.

A thickness of the lower storage gate electrode BSG in the first direction is, for example, equal to or more than 10 nm and equal to or less than 50 nm.

The plurality of upper storage gate electrodes TSG is stacked in the first direction. The upper storage gate electrode TSG is provided between the lower storage gate electrode BSG and the barrier gate electrode BG. The first upper storage gate electrode TSG1 is provided between the second barrier gate electrode BG2 and the first lower storage gate electrode BSG1.

The upper storage gate electrode TSG surrounds the fluid layer 16. The upper storage gate electrode TSG has a function of moving the charged particles 20 by changing the electrostatic potential of the fluid layer 16. The upper storage gate electrode TSG is, for example, a plate-like conductor.

The first upper storage gate electrode TSG1 is made of a fourth material. The fourth material has a fourth work function.

The fourth material is different from the first material and the second material. The fourth material is, for example, the same as the third material.

A chemical composition of the fourth material is different from the chemical compositions of the first material and the second material. The chemical composition of the fourth material and the chemical composition of the third material are, for example, the same.

The fourth work function is different from the first work function and the second work function. The fourth work function is larger than, for example, the first work function and the second work function. The fourth work function and the third work function are, for example, the same.

A difference between the fourth work function and the first work function is, for example, equal to or more than 0.5 eV. A difference between the fourth work function and the second work function is, for example, equal to or more than 0.5 eV.

The fourth material is, for example, a metal, a metal nitride, a metal carbide, or a semiconductor. The fourth material is, for example, p-type polycrystalline silicon. The fourth material is, for example, polycrystalline silicon containing boron (B) as a p-type impurity.

The second upper storage gate electrode TSG2 and the third upper storage gate electrode TSG3 are made of, for example, the fourth material.

A thickness of the upper storage gate electrode TSG in the first direction is, for example, equal to or more than 10 nm and equal to or less than 50 nm.

The first stand-by electrode SBG1 is provided to be spaced apart from the fourth barrier gate electrode BG4 in the first direction. The first stand-by electrode SBG1 is provided between the fourth barrier gate electrode BG4 and the second stand-by electrode SBG2. The first stand-by electrode SBG1 is provided between the second barrier gate electrode BG2 and the word line WL.

The first stand-by electrode SBG1 surrounds the fluid layer 16. The first stand-by electrode SBG1 has a function of moving the charged particles 20 by changing the electrostatic potential of the fluid layer 16.

The first stand-by electrode SBG1 is made of a sixth material. The sixth material has a sixth work function.

The sixth material is different from the first material and the second material. The sixth material is, for example, the same as the third material.

A chemical composition of the sixth material is different from the chemical compositions of the first material and the second material. The chemical composition of the sixth material and the chemical composition of the third material are, for example, the same.

The sixth work function is different from the first work function and the second work function. The sixth work function is larger than, for example, the first work function and the second work function. The sixth work function and the third work function are, for example, the same.

A difference between the sixth work function and the first work function is, for example, equal to or more than 0.5 eV. A difference between the sixth work function and the second work function is, for example, equal to or more than 0.5 eV.

The sixth material is, for example, a metal, a metal nitride, a metal carbide, or a semiconductor. The sixth material is, for example, p-type polycrystalline silicon. The sixth material is, for example, polycrystalline silicon containing boron (B) as a p-type impurity.

A thickness of the first stand-by electrode SBG1 in the first direction is, for example, equal to or more than 10 nm and equal to or less than 50 nm.

The second stand-by electrode SBG2 is provided to be spaced apart from the first stand-by electrode SBG1 in the first direction. The second stand-by electrode SBG2 is provided between the first stand-by electrode SBG1 and the word line WL.

The second stand-by electrode SBG2 surrounds the fluid layer 16. The second stand-by electrode SBG2 has a function of moving the charged particles 20 by changing the electrostatic potential of the fluid layer 16.

The second stand-by electrode SBG2 is made of a tenth material. The tenth material has a tenth work function.

The tenth material is different from the first material and the second material. The tenth material is, for example, the same as the third material and the sixth material.

A chemical composition of the tenth material is different from the chemical compositions of the first material and the second material. The chemical composition of the tenth material and the chemical compositions of the third material and the sixth material are, for example, the same.

The tenth work function is different from the first work function and the second work function. The tenth work function is larger than, for example, the first work function and the second work function. The tenth work function, the third work function, and the sixth work function are, for example, the same.

The tenth material is, for example, a metal, a metal nitride, a metal carbide, or a semiconductor. The tenth material is, for example, p-type polycrystalline silicon. The tenth material is, for example, polycrystalline silicon containing boron (B) as a p-type impurity.

A thickness of the second stand-by electrode SBG2 in the first direction is, for example, equal to or more than 10 nm and equal to or less than 50 nm.

The word line WL is provided, for example, between the second stand-by electrode SBG2 and the cock gate electrode CG. The word line WL is provided to be spaced apart from the second barrier gate electrode BG2 in the first direction. The word line WL extends in the second direction.

The word line WL surrounds the fluid layer 16, for example. The word line WL is electrically connected to the fluid layer 16. The word line WL is in contact with the fluid layer 16.

The word line WL is, for example, a linear conductor. The word line WL includes, for example, a metal, a metal nitride, a metal carbide, or a semiconductor. The word line WL includes, for example, tungsten (W).

A thickness of the word line WL in the first direction is, for example, equal to or more than 10 nm and equal to or less than 50 nm.

The cock gate electrode CG is provided between the word line WL and the bit line BL. The cock gate electrode CG is, for example, a plate-like conductor. The cock gate electrode CG surrounds the fluid layer 16. The cock gate electrode CG has a function of controlling the movement of the charged particles 20 by changing the electrostatic potential of the fluid layer 16. The cock gate electrode CG has a function of controlling a current flowing between the word line WL and the bit line BL by changing the electrostatic potential of the fluid layer 16.

The cock gate electrode CG functions as a gate electrode of a cock transistor. The cock transistor includes the cock gate electrode CG, the cock gate insulating film 14e, and the fluid layer 16. The fluid layer 16 serves as a channel region of the cock transistor.

The cock gate electrode CG contains, for example, a metal, a metal nitride, a metal carbide, or a semiconductor. The cock gate electrode CG contains, for example, tungsten (W). The cock gate electrode CG is, for example, p-type polycrystalline silicon.

A thickness of the cock gate electrode CG in the first direction is, for example, equal to or more than 10 nm and equal to or less than 50 nm.

The bit line BL is provided to be spaced apart from the word line WL in the first direction. The bit line BL is provided, for example, between the cock gate electrode CG and the reservoir gate electrode RG. The bit line BL extends in the third direction.

The bit line BL surrounds the fluid layer 16, for example. The bit line BL is electrically connected to the fluid layer 16. The bit line BL is in contact with the fluid layer 16.

The bit line BL is, for example, a linear conductor. The bit line BL includes, for example, a metal, a metal nitride, a metal carbide, or a semiconductor. The bit line BL includes, for example, tungsten (W). The material of the bit line BL may be the same as or different from the material of the word line WL.

A thickness of the bit line BL in the first direction is, for example, equal to or more than 10 nm and equal to or less than 50 nm. The thickness of the bit line BL in the first direction may be the same as or different from the thickness of the word line WL in the first direction. A resistance of the bit line BL can be lower than a resistance of the word line WL, but may be the same or higher.

The reservoir gate electrode RG is provided to be spaced apart from the bit line BL in the first direction. The bit line BL is provided between the reservoir gate electrode RG and the cock gate electrode CG.

The reservoir gate electrode RG is, for example, a plate-like conductor. The reservoir gate electrode RG surrounds the fluid layer 16. The reservoir gate electrode RG has a function of moving the charged particles 20 by changing the electrostatic potential of the fluid layer 16.

The reservoir gate electrode RG contains, for example, a metal, a metal nitride, a metal carbide, or a semiconductor. The reservoir gate electrode RG contains, for example, tungsten (W). The reservoir gate electrode RG is, for example, n-type polycrystalline silicon.

A thickness of the reservoir gate electrode RG in the first direction is, for example, equal to or more than 10 nm and equal to or less than 50 nm.

The gate insulating film 14 is provided between the barrier gate electrode BG and the fluid layer 16. The gate insulating film 14 is provided between the lower storage gate electrode BSG and the fluid layer 16. The gate insulating film 14 is provided between the upper storage gate electrode TSG and the fluid layer 16. The gate insulating film 14 is provided, for example, between the interlayer insulating layer 12 and the fluid layer 16.

The gate insulating film 14 surrounds the fluid layer 16. The gate insulating film 14 is in contact with the fluid layer 16, for example.

The first barrier gate insulating film 14$a$1 is provided between the fluid layer 16 and the first barrier gate electrode BG1. The second barrier gate insulating film 14$a$2 is provided between the fluid layer 16 and the second barrier gate electrode BG2. The third barrier gate insulating film 14$a$3 is provided between the fluid layer 16 and the third barrier gate electrode BG3. The fourth barrier gate insulating film 14$a$4 is provided between the fluid layer 16 and the fourth barrier gate electrode BG4.

The first lower storage gate insulating film 14$b$1 is provided between the fluid layer 16 and the first lower storage gate electrode BSG1. The second lower storage gate insulating film 14$b$2 is provided between the fluid layer 16 and the second lower storage gate electrode BSG2. The third lower storage gate insulating film 14$b$3 is provided between the fluid layer 16 and the third lower storage gate electrode BSG3.

The first upper storage gate insulating film 14$c$1 is provided between the fluid layer 16 and the first upper storage gate electrode TSG1. The second upper storage gate insulating film 14$c$2 is provided between the fluid layer 16 and the second upper storage gate electrode TSG2. The third upper storage gate insulating film 14$c$3 is provided between the fluid layer 16 and the third upper storage gate electrode TSG3.

The first stand-by gate insulating film 14$d$1 is provided between the fluid layer 16 and the first stand-by electrode SBG1. The second stand-by gate insulating film 14$d$2 is provided between the fluid layer 16 and the second stand-by electrode SBG2.

The cock gate insulating film 14$e$ is provided between the fluid layer 16 and the cock gate electrode CG. The reservoir gate insulating film 14$f$ is provided between the fluid layer 16 and the reservoir gate electrode RG.

The gate insulating film 14 is, for example, an oxide, a nitride, or an oxynitride. The gate insulating film 14 is, for example, a stacked film of materials selected from an oxide, a nitride, and an oxynitride. The gate insulating film 14 is, for example, an aluminum oxide, a hafnium oxide, or a silicon oxide. The gate insulating film 14 is, for example, a stacked film of materials selected from an aluminum oxide, a hafnium oxide, and a silicon oxide.

A thickness of the gate insulating film 14 in the second direction and the third direction is, for example, equal to or more than 1 nm and equal to or less than 10 nm.

The interlayer insulating layer 12 is provided between the barrier gate electrode BG and the lower storage gate electrode BSG. The interlayer insulating layer 12 is provided between the lower storage gate electrode BSG and the upper storage gate electrode TSG. The interlayer insulating layer 12 is provided between the upper storage gate electrode TSG and the barrier gate electrode BG. The interlayer insulating layer 12 is provided between the barrier gate electrode BG and the first stand-by electrode SBG1. The interlayer insulating layer 12 is provided between the first stand-by electrode SBG1 and the second stand-by electrode SBG2. The interlayer insulating layer 12 is provided in a lower portion of the memory bottle MB. The interlayer insulating layer 12 is provided on the reservoir gate electrode RG.

The interlayer insulating layer 12 is provided between the second stand-by electrode SBG2 and the word line WL. The interlayer insulating layer 12 is provided between the word line WL and the cock gate electrode CG. The interlayer insulating layer 12 is provided between the cock gate electrode CG and the bit line BL. The interlayer insulating layer 12 is provided between the bit line BL and the reservoir gate electrode RG.

The interlayer insulating layer 12 surrounds the fluid layer 16.

The interlayer insulating layer 12 is, for example, an oxide, an oxynitride, or a nitride. The interlayer insulating layer 12 is, for example, a silicon oxide.

The core insulator 18 extends in the first direction. The core insulator 18 is surrounded by the fluid layer 16. The core insulator 18 is an example of an insulator.

The core insulator 18 is, for example, an oxide, an oxynitride, or a nitride. The interlayer insulating layer 12 is, for example, a silicon oxide.

A region sandwiched between the two barrier gate electrodes BG is the memory cell MC. The memory cell MC has a function of storing data by accumulating the charged particles 20.

For example, a region sandwiched between the first barrier gate electrode BG1 and the second barrier gate electrode BG2 is the first memory cell MC1. For example, a region sandwiched between the second barrier gate electrode BG2 and the third barrier gate electrode BG3 is the second memory cell MC2. For example, a region sandwiched between the third barrier gate electrode BG3 and the fourth barrier gate electrode BG4 is the third memory cell MC3.

A region sandwiched between the fourth barrier gate electrode BG4 and the word line WL is the stand-by cell SC. The stand-by cell SC has a function of temporarily retaining the charged particles 20 to be transferred from the memory cell MC when data is read from the memory cell MC. The stand-by cell has a function of temporarily retaining the charged particles 20 to be transferred to the memory cell MC when data is written to the memory cell MC.

A region of the bit line BL opposite to the cock gate electrode CG serves as the reservoir RS. The reservoir RS has a function of storing the charged particles 20 accumulated in the memory cell MC.

As illustrated in FIG. 5B, a cross-sectional area of the fluid layer 16 in a first cross section perpendicular to the first direction and including the cock gate electrode CG is defined as a first cross-sectional area S1. As illustrated in FIG. 5A, a cross-sectional area of the fluid layer 16 in a second cross section perpendicular to the first direction and including the lower storage gate electrode BSG is defined as a second cross-sectional area S2. As illustrated in FIG. 5C, a cross-sectional area of the fluid layer 16 in a third cross section perpendicular to the first direction and including the reservoir gate electrode RG is defined as a third cross-sectional area S3.

The first cross-sectional area S1 is smaller than the second cross-sectional area S2. The first cross-sectional area S1 is smaller than the third cross-sectional area S3.

A width (w in FIG. 5S) of the fluid layer 16 in the first cross section is smaller than, for example, twice a diameter of the charged particle 20.

Figure 6:
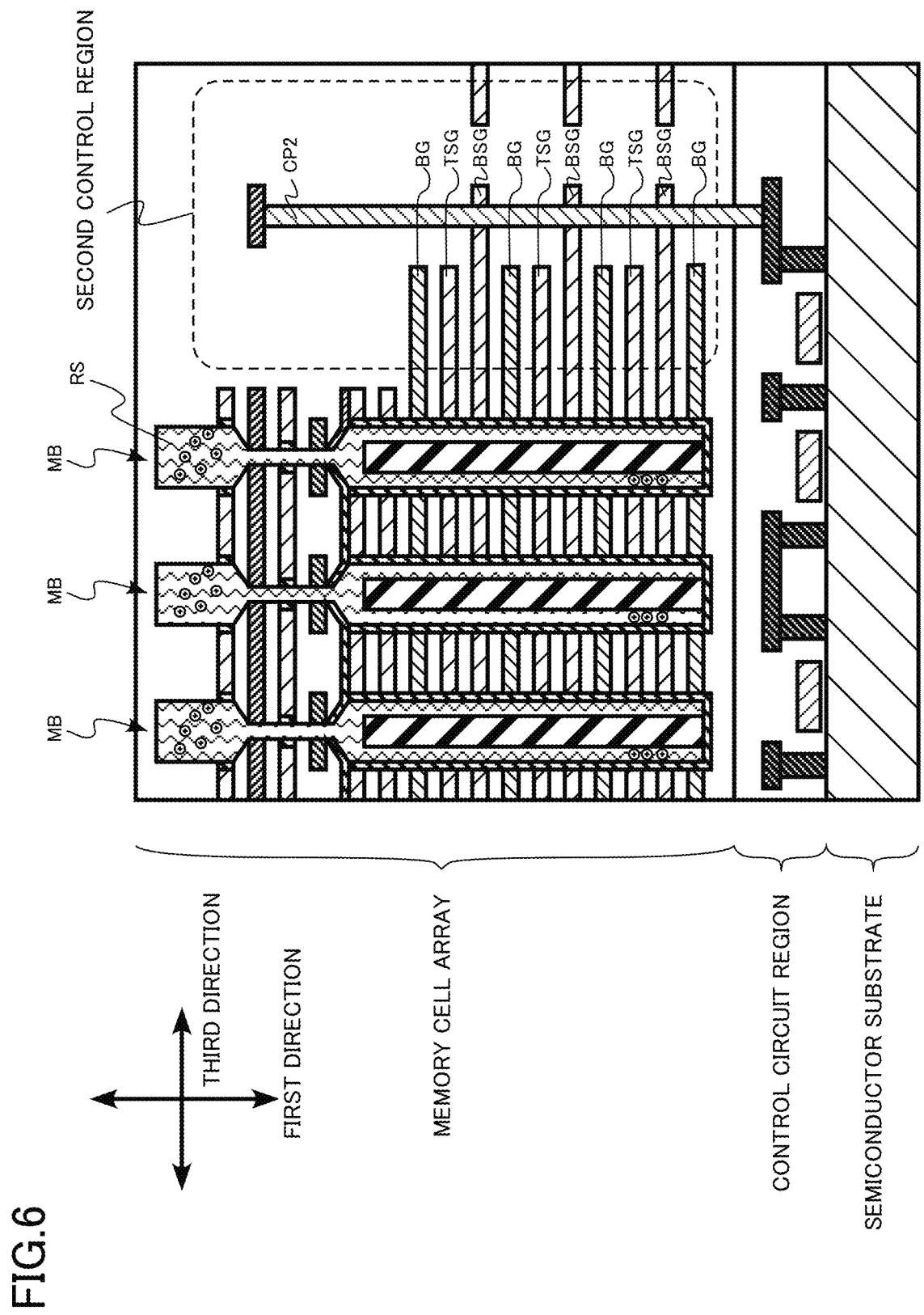
FIG. 6 is a schematic cross-sectional view of the memory device according to the first embodiment.
Figure 7:
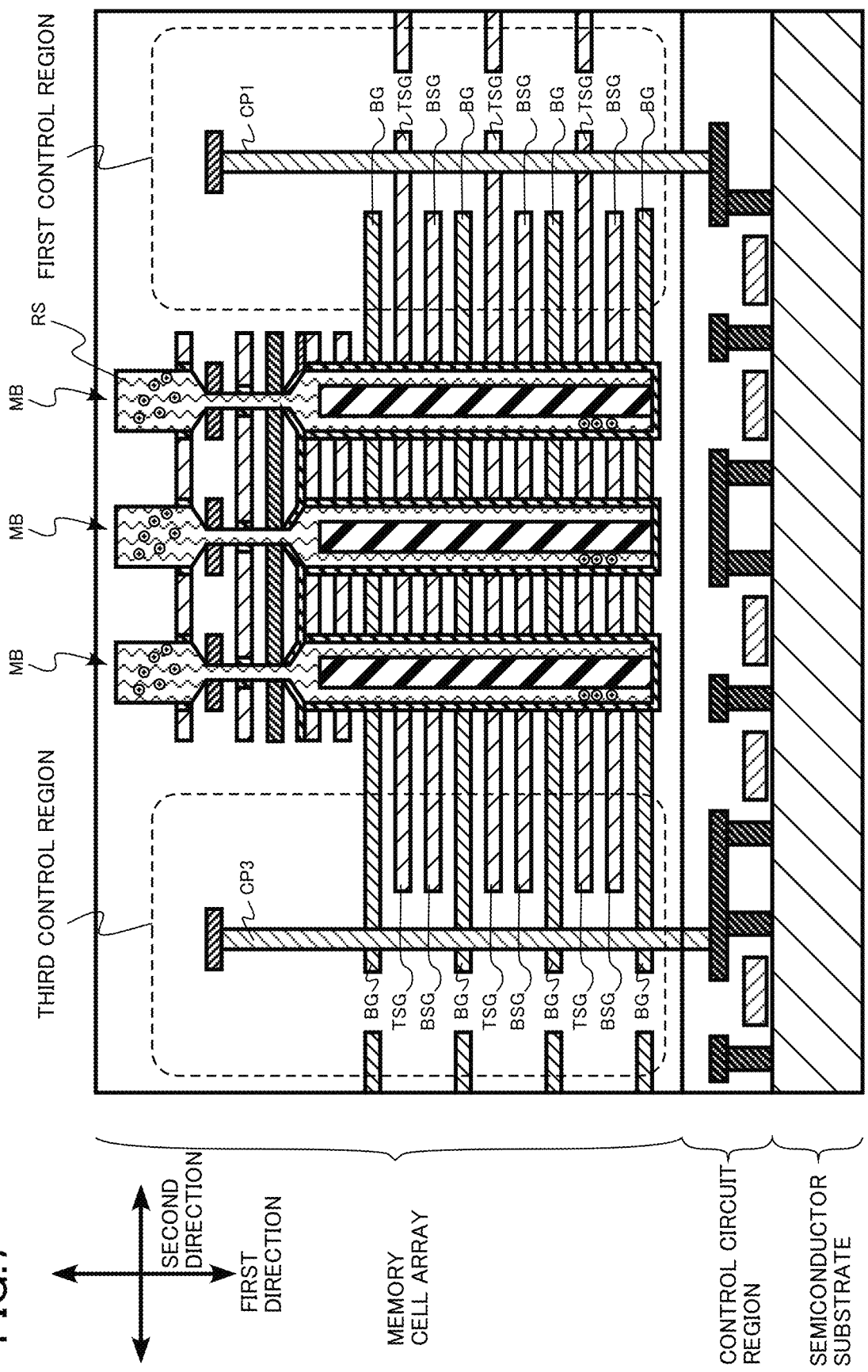
FIG. 7 is a schematic cross-sectional view of the memory device according to the first embodiment.

FIGS. 6 and 7 are schematic cross-sectional views of the memory device according to the first embodiment. FIGS. 6 and 7 are schematic cross-sectional views including a part of the memory cell array 101. FIG. 6 is a cross section parallel to the first direction and the third direction. FIG. 7 is a cross section parallel to the first direction and the second direction.

As illustrated in FIGS. 6 and 7, the memory cell array 101 is provided, for example, on a semiconductor substrate. A control circuit region is provided between the semiconductor substrate and the memory cell array 101.

The control circuit region includes a plurality of transistors. The plurality of transistors includes, for example, an n-channel transistor and a p-channel transistor. The control circuit region includes, for example, a CMOS circuit.

The control circuit region includes, for example, the cell gate control circuit 102, the stand-by gate control circuit 103, the cock gate control circuit 104, the reservoir gate control circuit 105, the word line control circuit 106, the bit line control circuit 107, the sense amplifier circuit 108, and the central control circuit 109.

As illustrated in FIG. 6, a second contact region is provided at an end of the memory cell array 101 in the third direction. The second contact region includes a second contact plug CP2 extending in the first direction.

The second contact plug CP2 is electrically connected to the plurality of lower storage gate electrodes BSG. The second contact plug CP2 is in contact with the plurality of lower storage gate electrodes BSG. The second contact plug CP2 has a function of applying a voltage to the plurality of lower storage gate electrodes BSG.

The second contact plug CP2 is, for example, a columnar conductor. The second contact plug CP2 includes, for example, a metal, a metal nitride, a metal carbide, or a semiconductor. The second contact plug CP2 contains, for example, tungsten (W).

As illustrated in FIG. 7, a first contact region and a third contact region are provided at an end of the memory cell array 101 in the second direction. The plurality of memory bottles MB is provided between the first contact region and the third contact region.

The first contact region includes a first contact plug CP1 extending in the first direction. The first contact plug CP1 is electrically connected to the plurality of upper storage gate electrodes TSG. The first contact plug CP1 is in contact with the plurality of upper storage gate electrodes TSG. The first contact plug CP1 has a function of applying a voltage to the plurality of upper storage gate electrodes TSG.

The third contact region includes a third contact plug CP3 extending in the first direction. The third contact plug CP3 is electrically connected to the plurality of barrier gate electrodes BG. The third contact plug CP3 is in contact with the plurality of barrier gate electrodes BG. The third contact plug CP3 has a function of applying a voltage to the plurality of barrier gate electrodes BG.

The first contact plug CP1 and the third contact plug CP3 are, for example, columnar conductors. The first contact plug CP1 and the third contact plug CP3 contain, for example, a metal, a metal nitride, a metal carbide, or a semiconductor. The first contact plug CP1 and the third contact plug CP3 include, for example, tungsten (W).

Next, an example of a method for manufacturing the memory device according to the first embodiment will be described. Hereinafter, an example of a method for manufacturing the memory cell array 101 of the nonvolatile memory 100 will be described.

FIGS. 8, 9, 10, 11, 12, 13, 14, 15, 16, 17, 18, 19, 20, 21, 22, 23, 24, 25, 26, 27, 28, 29, 30, 31, 32, 33, and 34 are schematic cross-sectional views illustrating an example of the method for manufacturing the memory device according to the first embodiment. FIGS. 8 to 34 illustrate cross sections corresponding to FIG. 3.

First, the first silicon oxide layer 50 is formed on the semiconductor substrate (not illustrated). A plurality of n-type polycrystalline silicon layers 52, a plurality of first silicon nitride layers 54, and a plurality of second silicon nitride layers 56 are formed on the first silicon oxide layer 50. Second silicon oxide layers 58 are formed between these layers (FIG. 8).

The first silicon oxide layer 50, the n-type polycrystalline silicon layers 52, the first silicon nitride layers 54, the second silicon nitride layers 56, and the second silicon oxide layers 58 are formed by, for example, a chemical vapor deposition method (CVD method).

The first silicon nitride layers 54 and the second silicon nitride layers 56 are made of a silicon nitride having different wet etching resistance.

The n-type polycrystalline silicon layers 52 finally become the barrier gate electrodes BG. The first silicon oxide layer 50 and the second silicon oxide layers 58 finally become the interlayer insulating layers 12.

Figure 9:
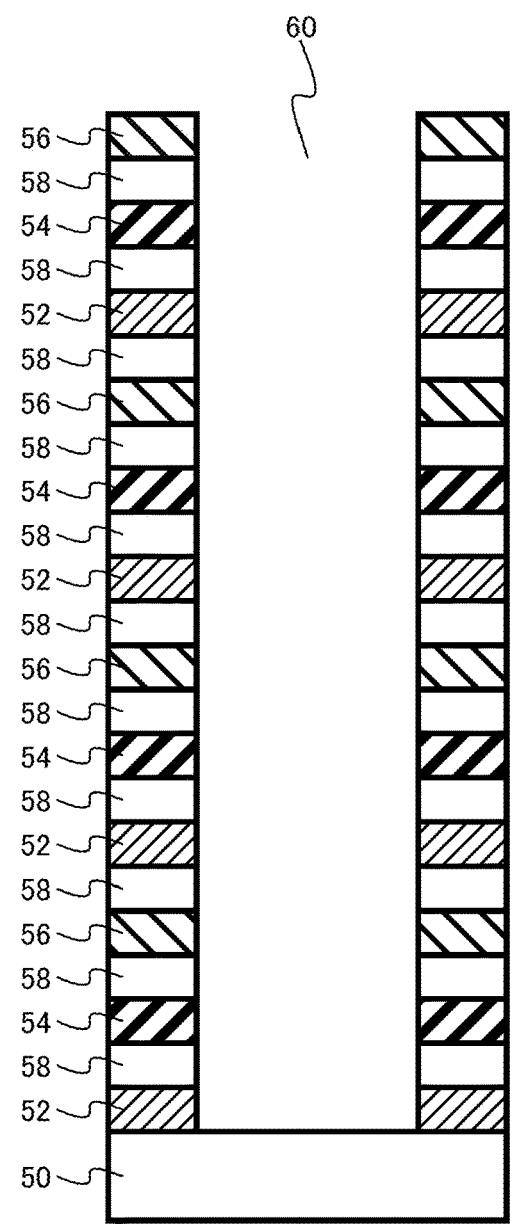
FIG. 9 is a schematic cross-sectional view illustrating an example of the method for manufacturing the memory device according to the first embodiment.

Subsequently, a first opening 60 is formed in the n-type polycrystalline silicon layers 52, the first silicon nitride layers 54, the second silicon nitride layers 56, and the second silicon oxide layers 58 (FIG. 9). The first opening 60 is formed by, for example, a lithography method and a reactive ion etching method (RIE method).

Figure 10:
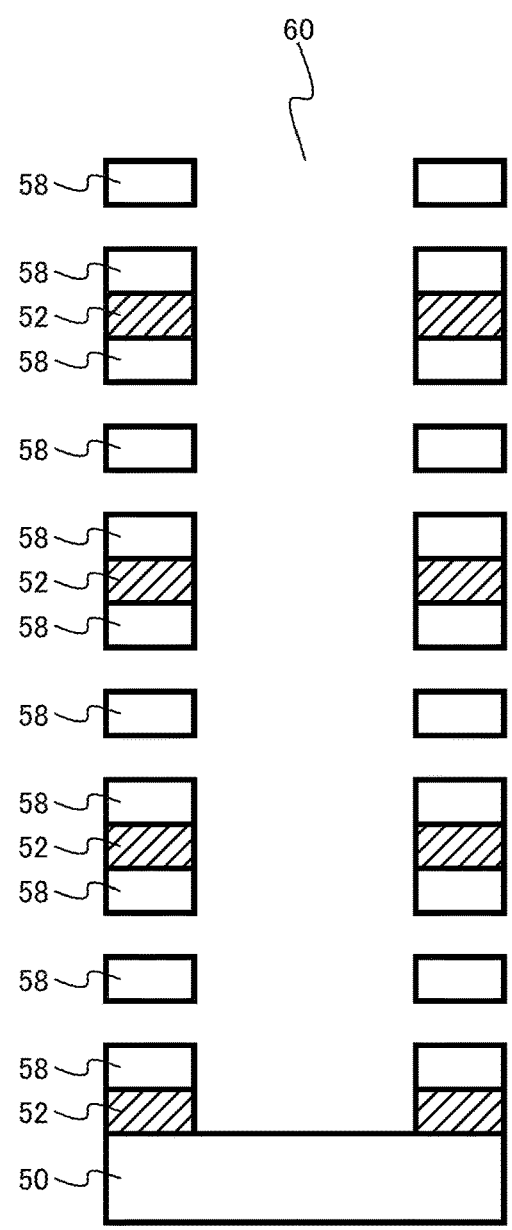
FIG. 10 is a schematic cross-sectional view illustrating an example of the method for manufacturing the memory device according to the first embodiment.
Figure 11:
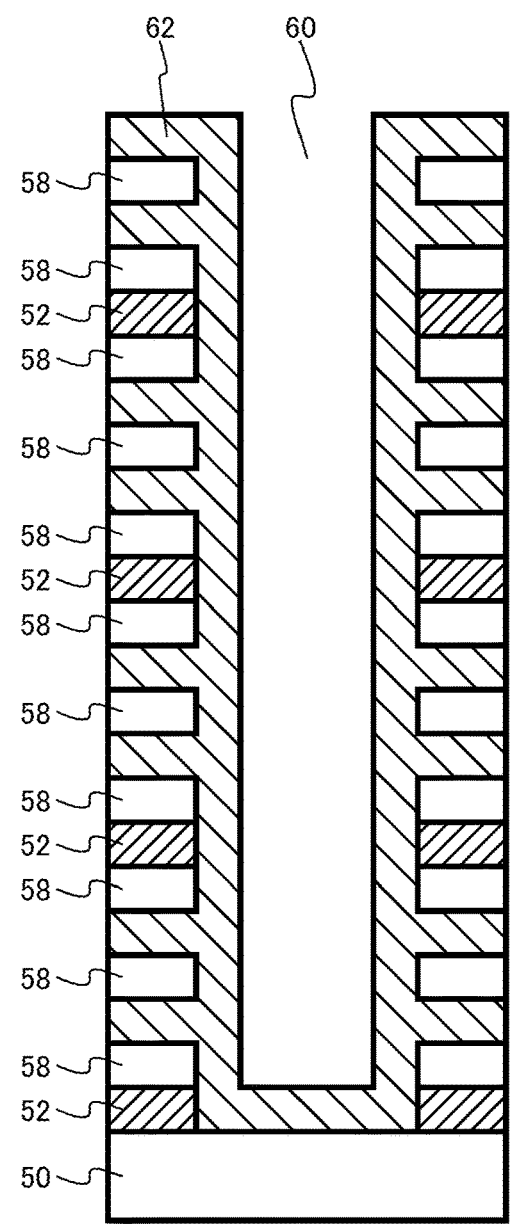
FIG. 11 is a schematic cross-sectional view illustrating an example of the method for manufacturing the memory device according to the first embodiment.

Subsequently, the first silicon nitride layers 54 are removed from an inner surface side of the first opening 60 by first wet etching. Subsequently, the second silicon nitride layers 56 are removed from the inner surface side of the first opening 60 by second wet etching (FIG. 10). Since the first silicon nitride layers 54 and the second silicon nitride layers 56 have different wet etching resistances, these layers are removed by, for example, wet etching using different chemical liquids.

Subsequently, a first p-type polycrystalline silicon layer 62 is formed on an inner surface of the first opening 60 (FIG.

11). The first p-type polycrystalline silicon layer 62 is formed by, for example, a CVD method.

Figure 12:
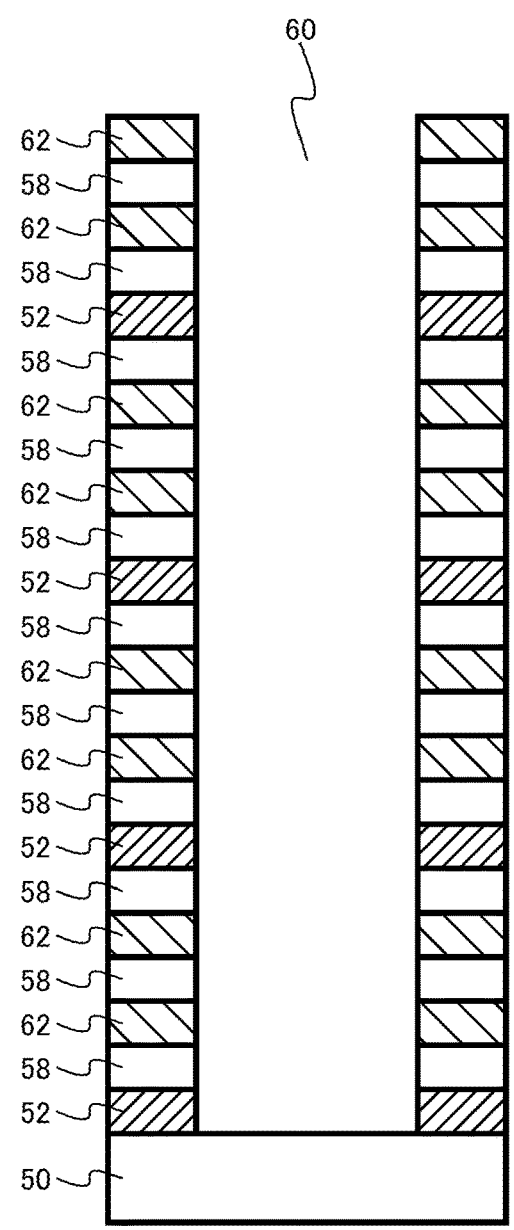
FIG. 12 is a schematic cross-sectional view illustrating an example of the method for manufacturing the memory device according to the first embodiment.

Subsequently, the first p-type polycrystalline silicon layer 62 in the first opening 60 is removed (FIG. 12). The first p-type polycrystalline silicon layer 62 is removed by, for example, an RIE method. The first p-type polycrystalline silicon layers 62 sandwiched between the second silicon oxide layers 58 finally become the lower storage gate electrode BSG, the upper storage gate electrode TSG, the first stand-by electrode SBG1, and the second stand-by electrode SBG2.

Subsequently, a first hafnium oxide film 64 is formed on the inner surface of the first opening 60. The first hafnium oxide film 64 is formed by, for example, an atomic layer deposition method (ALD method). A part of the hafnium oxide film 64 finally becomes the gate insulating film 14.

Figure 13:
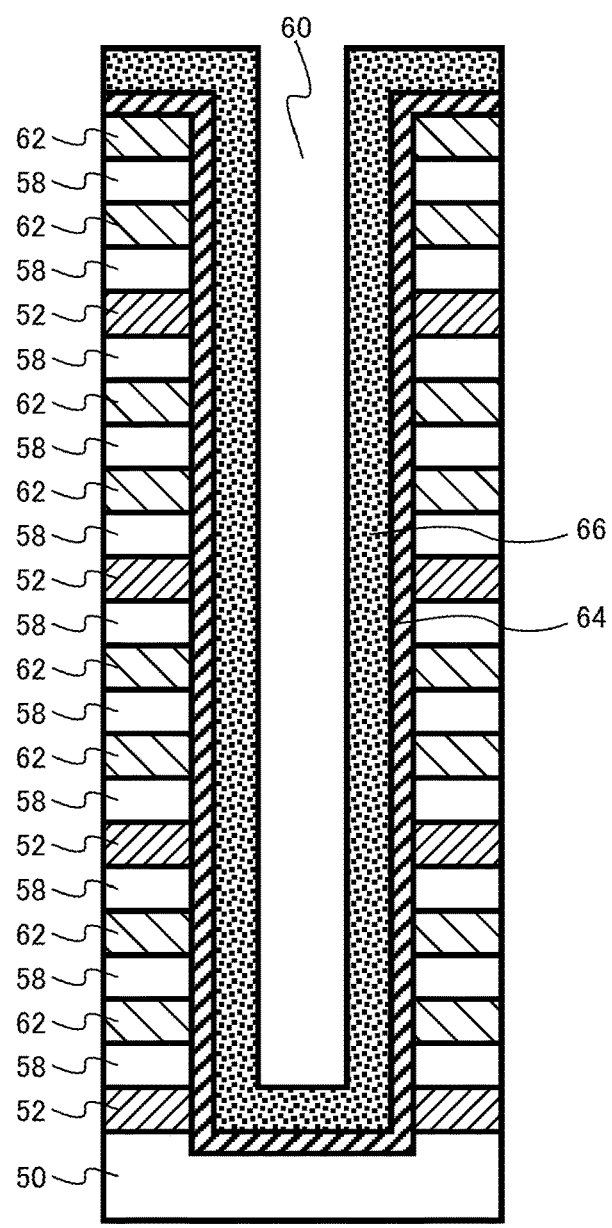
FIG. 13 is a schematic cross-sectional view illustrating an example of the method for manufacturing the memory device according to the first embodiment.

Subsequently, a first amorphous silicon film 66 is formed on the first hafnium oxide film 64 (FIG. 13). The first amorphous silicon film 66 is formed by, for example, a CVD method.

Figure 14:
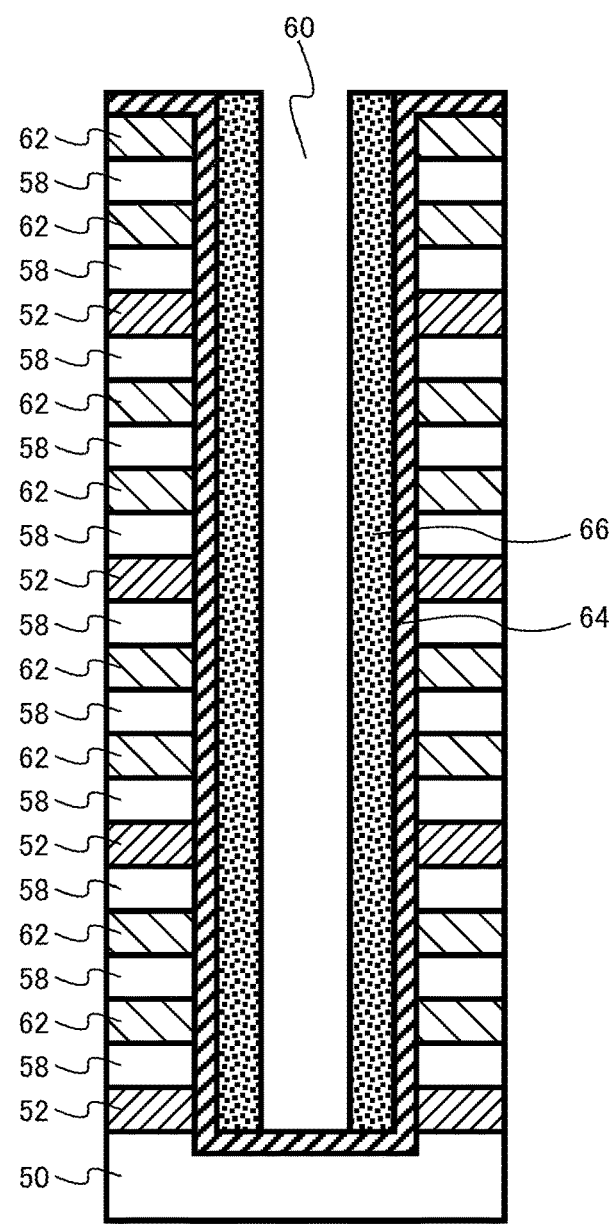
FIG. 14 is a schematic cross-sectional view illustrating an example of the method for manufacturing the memory device according to the first embodiment.

Subsequently, the first amorphous silicon film 66 at a bottom of the first opening 60 is removed (FIG. 14). The first amorphous silicon film 66 at the bottom of the first opening 60 is removed by, for example, an RIE method.

Figure 15:
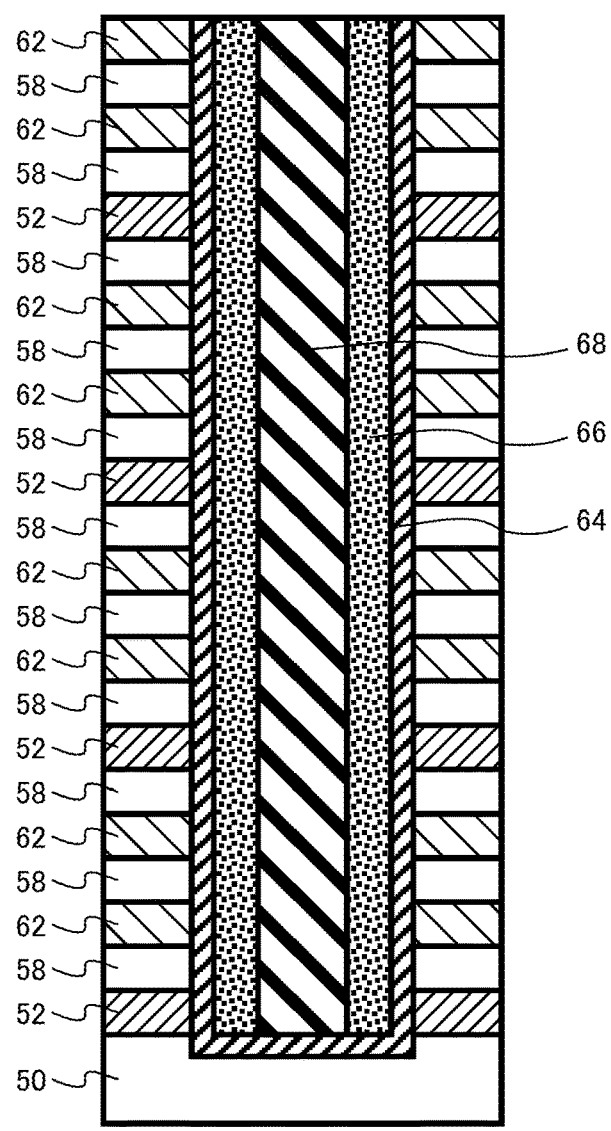
FIG. 15 is a schematic cross-sectional view illustrating an example of the method for manufacturing the memory device according to the first embodiment.

Subsequently, the first opening 60 is filled with a third silicon oxide layer 68 (FIG. 15). For example, the first opening 60 is filled with the third silicon oxide layer 68 by forming the third silicon oxide layer 68 by a CVD method and removing a part of the third silicon oxide layer 68 using a chemical mechanical polishing method (CMP method). The third silicon oxide layer 68 finally becomes the core insulator 18.

Figure 16:
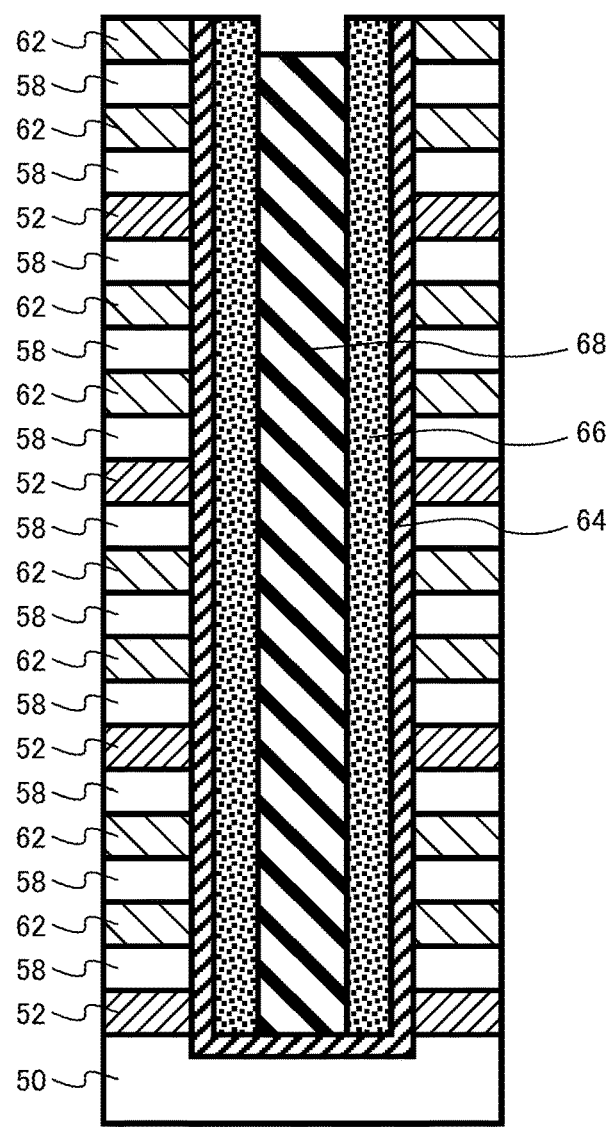
FIG. 16 is a schematic cross-sectional view illustrating an example of the method for manufacturing the memory device according to the first embodiment.

Subsequently, an upper portion of the third silicon oxide layer 68 is removed (FIG. 16). The upper portion of the third silicon oxide layer 68 is removed by, for example, an RIE method.

Figure 17:
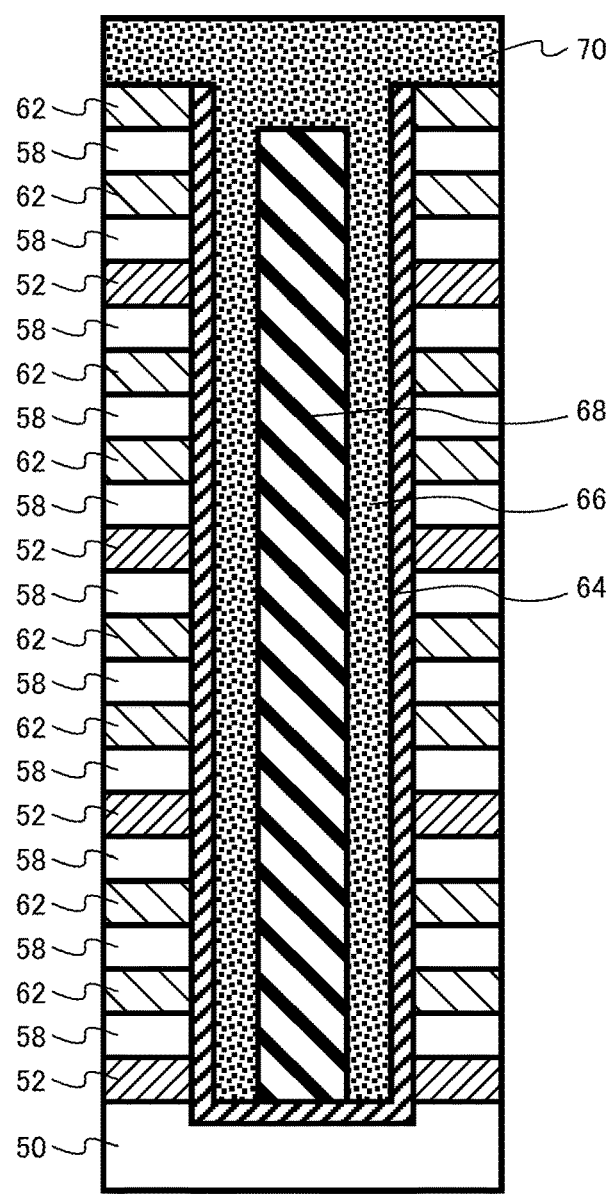
FIG. 17 is a schematic cross-sectional view illustrating an example of the method for manufacturing the memory device according to the first embodiment.

Subsequently, a second amorphous silicon film 70 is formed (FIG. 17). The second amorphous silicon film 70 is formed by, for example, a CVD method.

Figure 18:
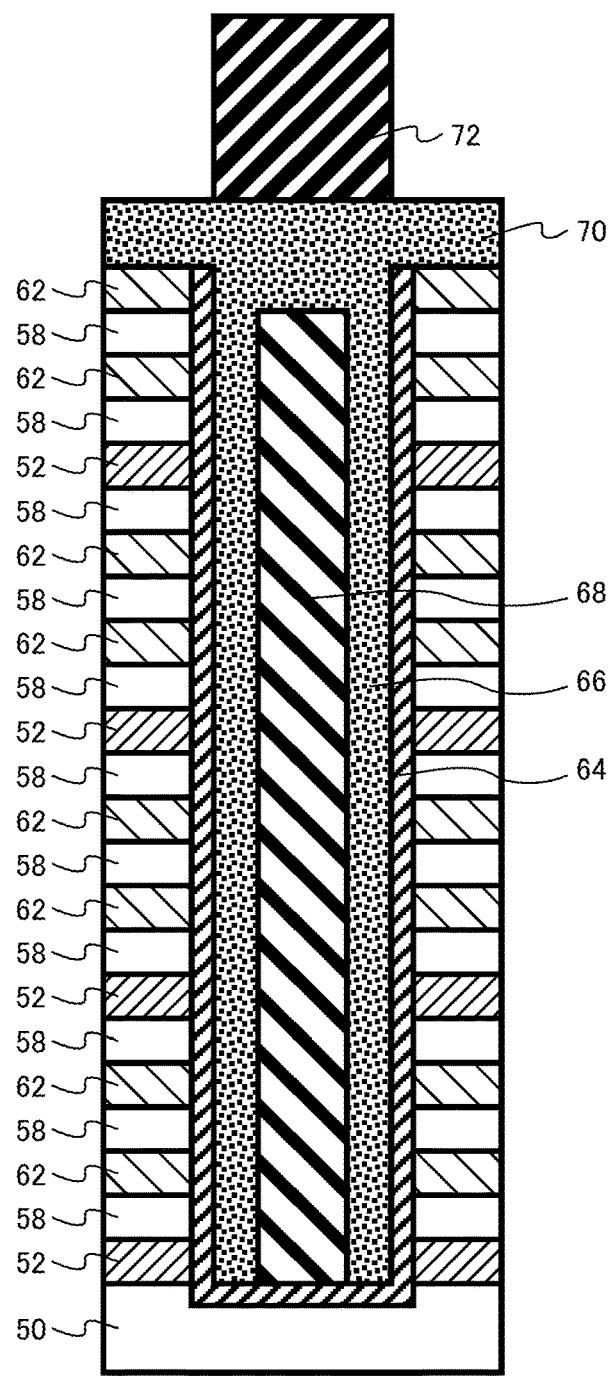
FIG. 18 is a schematic cross-sectional view illustrating an example of the method for manufacturing the memory device according to the first embodiment.

Subsequently, a mask material 72 is formed on the second amorphous silicon film 70 (FIG. 18). The mask material 72 is, for example, a silicon nitride.

Figure 19:
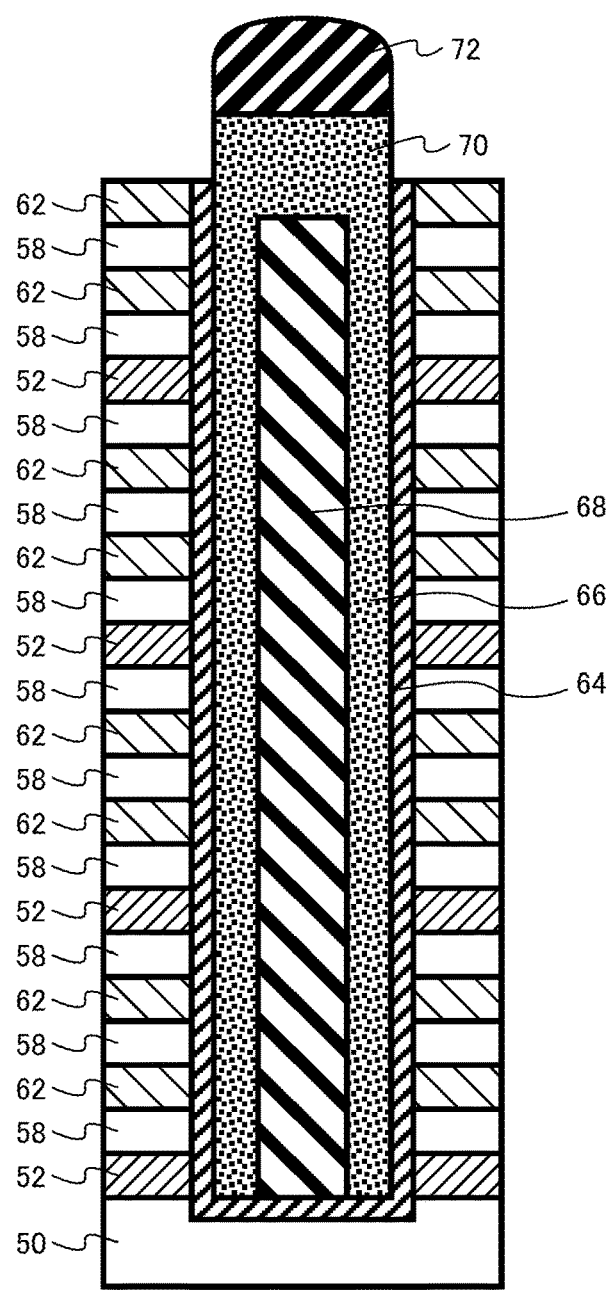
FIG. 19 is a schematic cross-sectional view illustrating an example of the method for manufacturing the memory device according to the first embodiment.

Subsequently, a part of the second amorphous silicon film 70 is removed by using the mask material 72 as a mask (FIG. 19). A part of the second amorphous silicon film 70 is removed by, for example, an RIE method.

Figure 20:
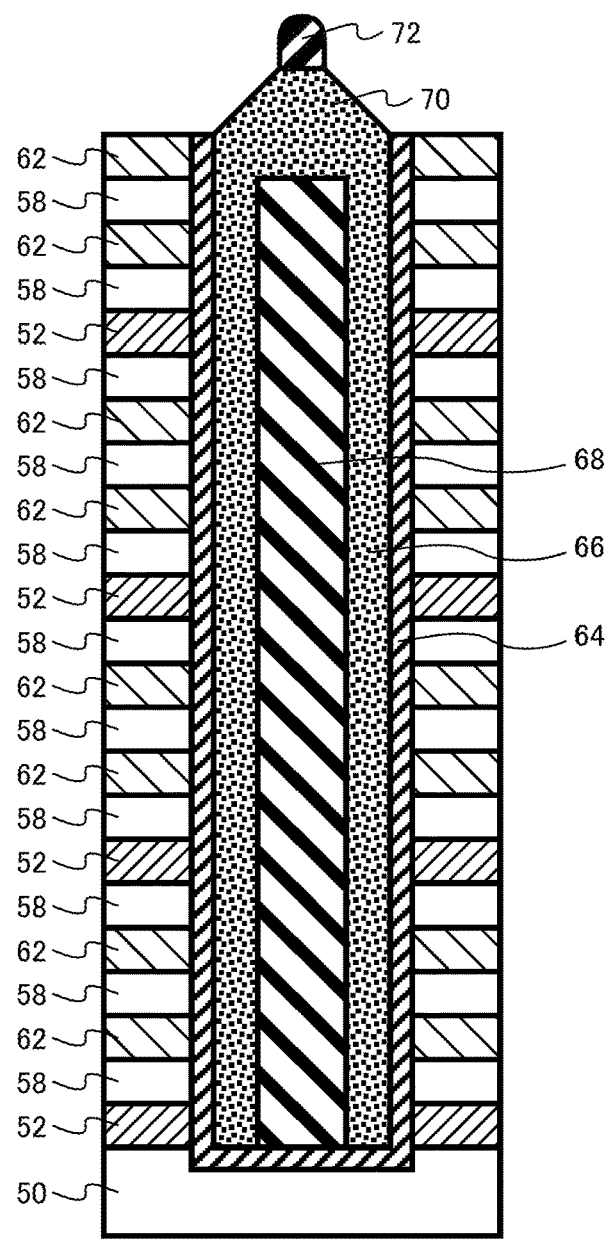
FIG. 20 is a schematic cross-sectional view illustrating an example of the method for manufacturing the memory device according to the first embodiment.

Subsequently, the second amorphous silicon film 70 is further removed by using the mask material 72 as a mask (FIG. 20). The second amorphous silicon film 70 is removed such that a side surface has a tapered shape.

Figure 21:
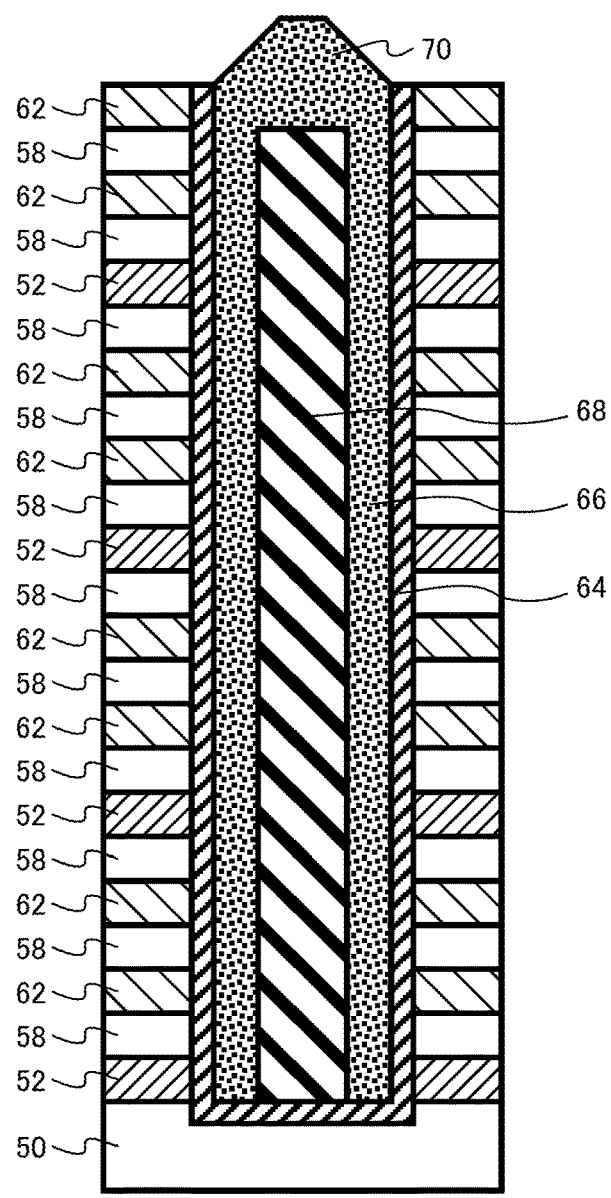
FIG. 21 is a schematic cross-sectional view illustrating an example of the method for manufacturing the memory device according to the first embodiment.

Subsequently, the mask material 72 is removed (FIG. 21).

Figure 22:
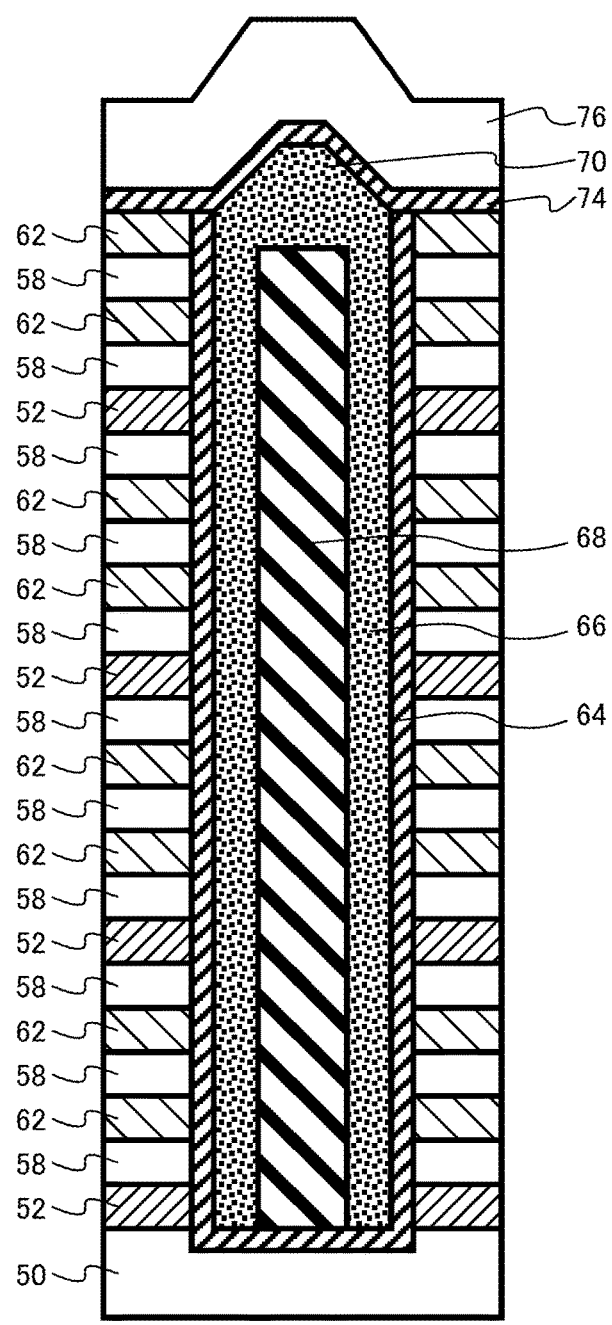
FIG. 22 is a schematic cross-sectional view illustrating an example of the method for manufacturing the memory device according to the first embodiment.

Subsequently, a second hafnium oxide film 74 is formed. The second hafnium oxide film 74 is formed by, for example, an ALD method. Subsequently, a fourth silicon oxide layer 76 is formed on the second hafnium oxide film 74 (FIG. 22). The fourth silicon oxide layer 76 is formed by, for example, a CVD method. The fourth silicon oxide layer 76 finally becomes the interlayer insulating layer 12.

Figure 23:
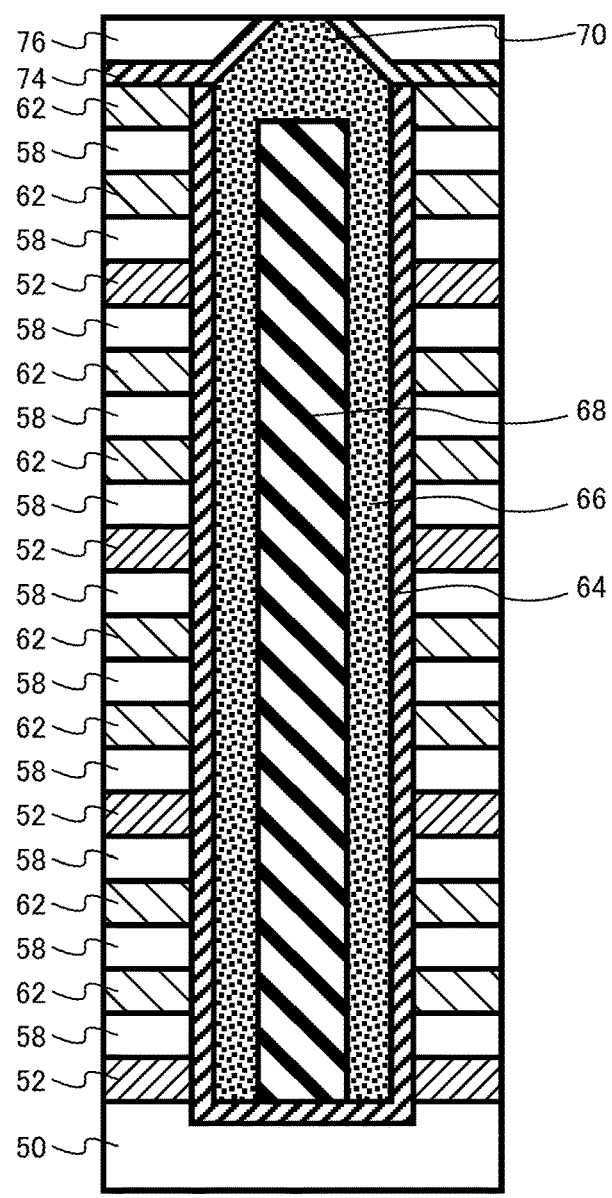
FIG. 23 is a schematic cross-sectional view illustrating an example of the method for manufacturing the memory device according to the first embodiment.

Subsequently, a part of the fourth silicon oxide layer 76 and the second hafnium oxide film 74 is removed (FIG. 23). A part of the fourth silicon oxide layer 76 and the second hafnium oxide film 74 is removed by, for example, a CMP method.

Figure 24:
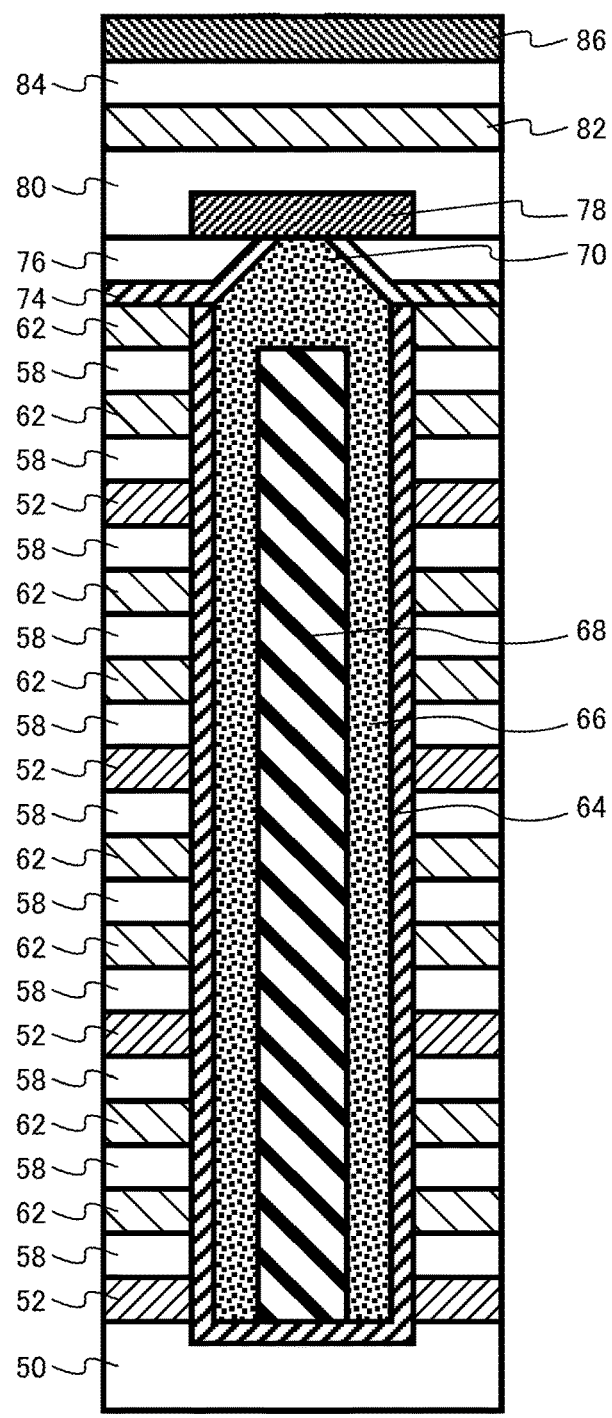
FIG. 24 is a schematic cross-sectional view illustrating an example of the method for manufacturing the memory device according to the first embodiment.

Subsequently, a first tungsten layer 78, a fifth silicon oxide layer 80, a second p-type polycrystalline silicon layer 82, a sixth silicon oxide layer 84, and a second tungsten layer 86 are formed on the fourth silicon oxide layer 76 (FIG. 24). The first tungsten layer 78 finally becomes the word line WL. The fifth silicon oxide layer 80 finally becomes the interlayer insulating layer 12. The second p-type polycrystalline silicon layer 82 finally becomes the cock gate electrode CG. The sixth silicon oxide layer 84 finally becomes the interlayer insulating layer 12. The second tungsten layer 86 finally becomes the bit line BL.

Figure 25:
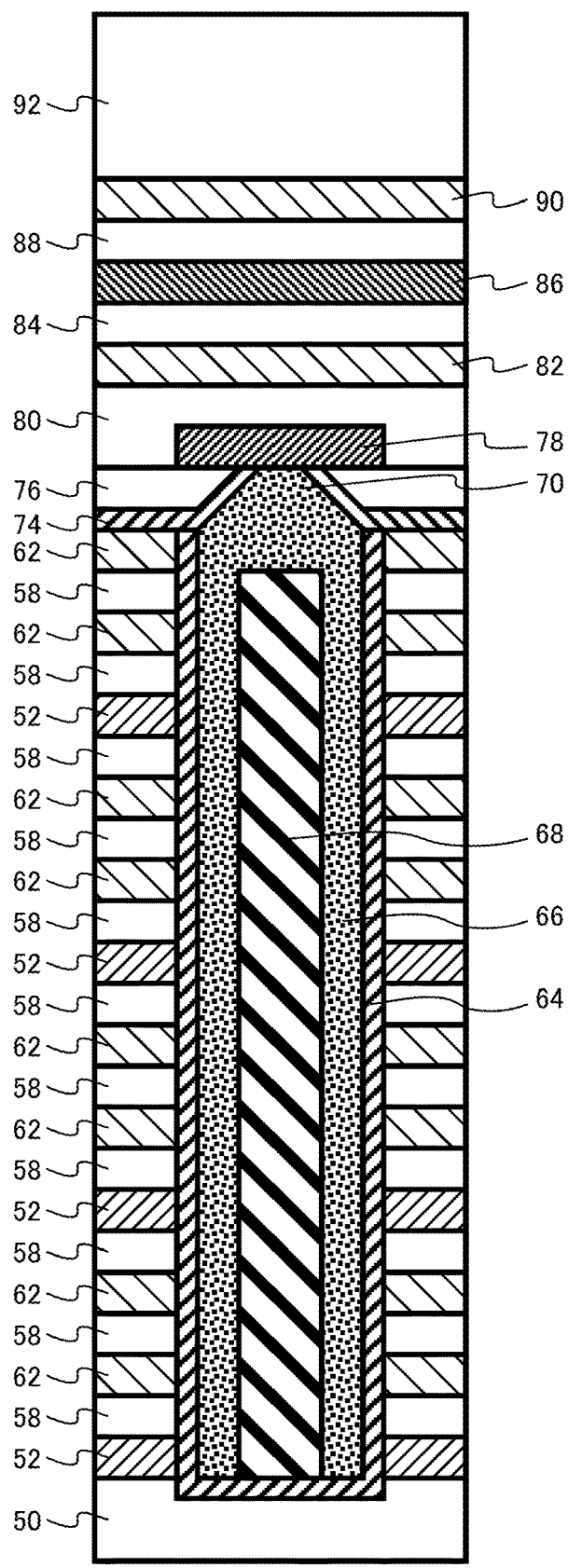
FIG. 25 is a schematic cross-sectional view illustrating an example of the method for manufacturing the memory device according to the first embodiment.

Subsequently, a seventh silicon oxide layer 88, a third p-type polycrystalline silicon layer 90, and an eighth silicon oxide layer 92 are formed on the second tungsten layer 86 (FIG. 25). The seventh silicon oxide layer 88 finally becomes the interlayer insulating layer 12. The third p-type polycrystalline silicon layer 90 finally becomes the reservoir gate electrode RG (conductive type needs to be confirmed). The eighth silicon oxide layer 92 finally becomes the interlayer insulating layer 12.

Figure 26:
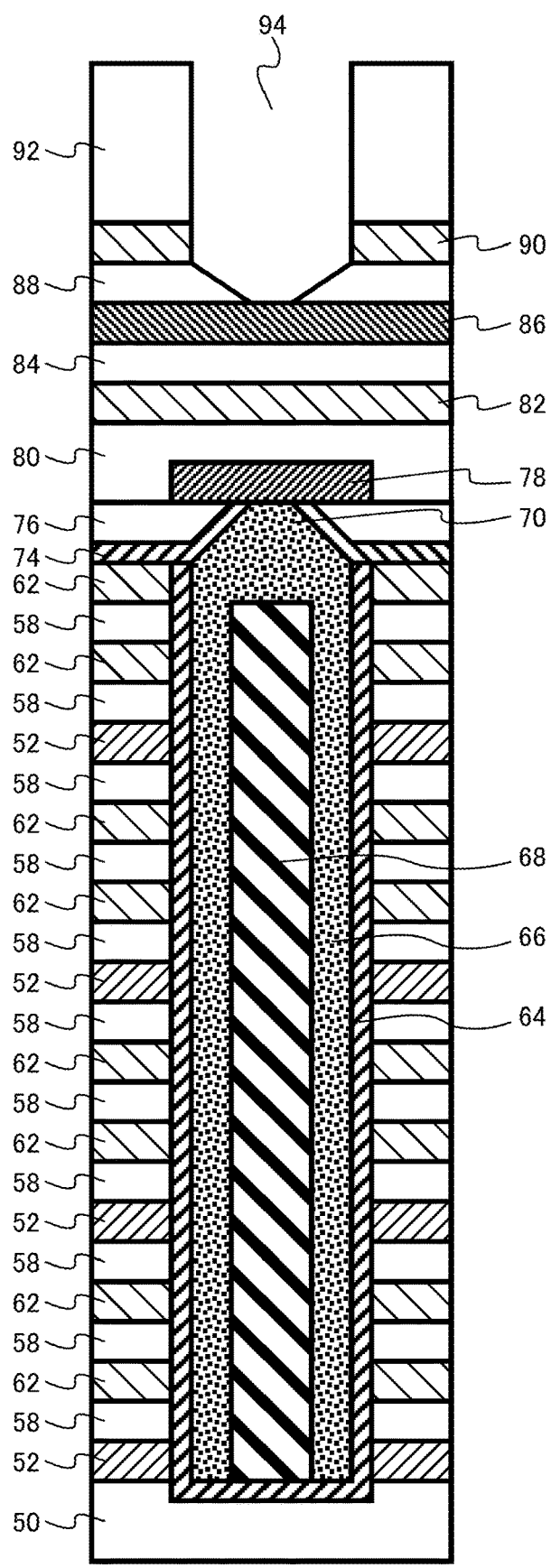
FIG. 26 is a schematic cross-sectional view illustrating an example of the method for manufacturing the memory device according to the first embodiment.

Subsequently, a second opening 94 is formed in the seventh silicon oxide layer 88, the third p-type polycrystalline silicon layer 90, and the eighth silicon oxide layer 92 (FIG. 26). A bottom of the second opening 94 has a tapered shape. The second opening 94 is formed by, for example, a lithography method and an RIE method.

Figure 27:
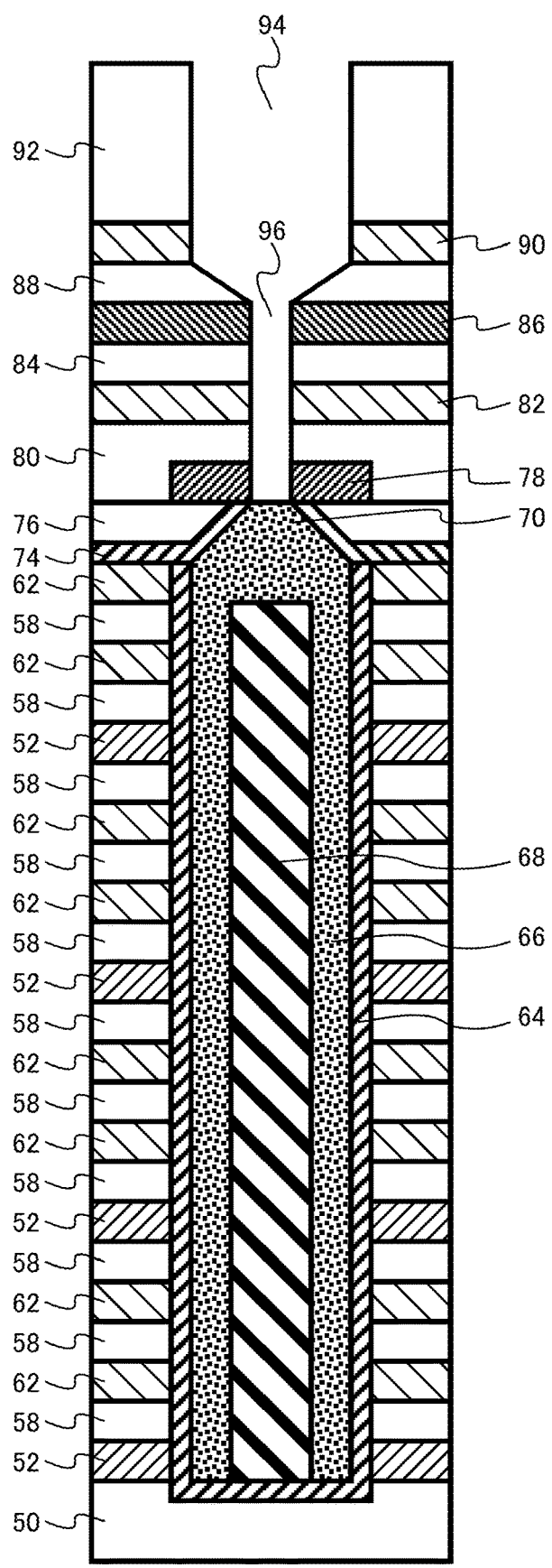
FIG. 27 is a schematic cross-sectional view illustrating an example of the method for manufacturing the memory device according to the first embodiment.

Subsequently, a third opening 96 reaching the second amorphous silicon film 70 is formed at the bottom of the second opening 94 (FIG. 27). A width of the third opening 96 is smaller than a width of the first opening 60 and a width of the second opening 94.

Figure 28:
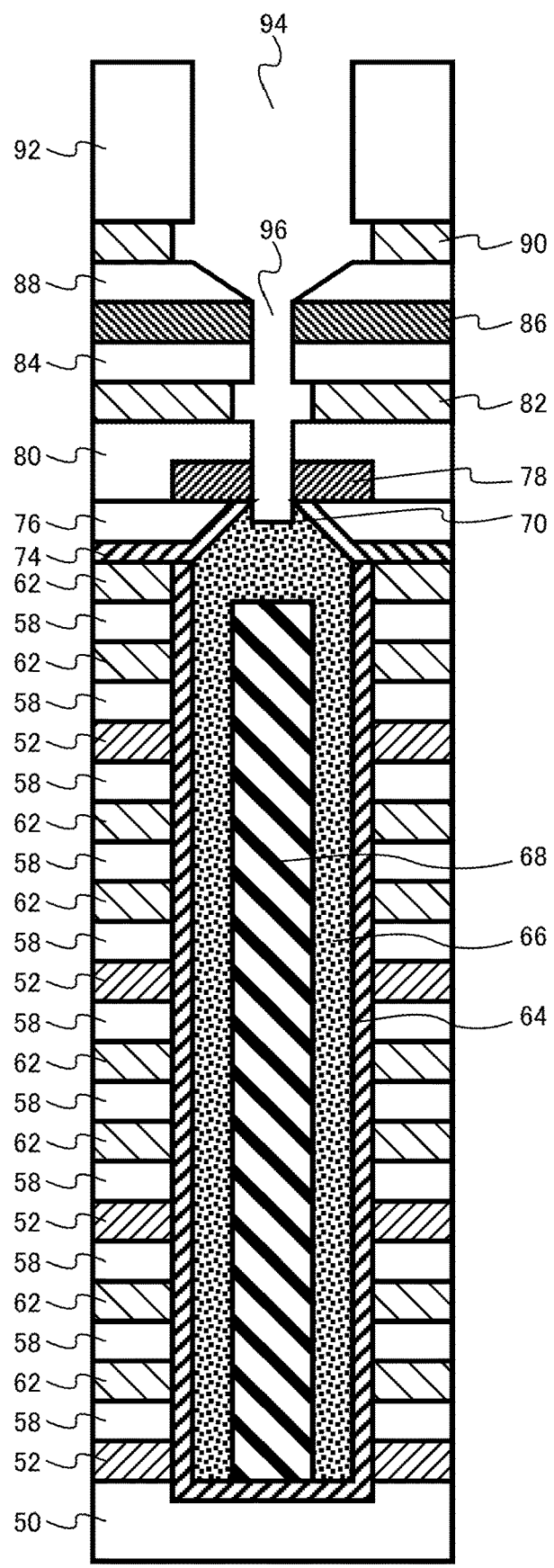
FIG. 28 is a schematic cross-sectional view illustrating an example of the method for manufacturing the memory device according to the first embodiment.

Subsequently, the second p-type polycrystalline silicon layer 82 and the third p-type polycrystalline silicon layer 90 are laterally retracted from inner surfaces of the second opening 94 and the third opening 96 (FIG. 28). The second p-type polycrystalline silicon layer 82 and the third p-type polycrystalline silicon layer 90 are retracted laterally by using, for example, isotropic dry etching.

Figure 29:
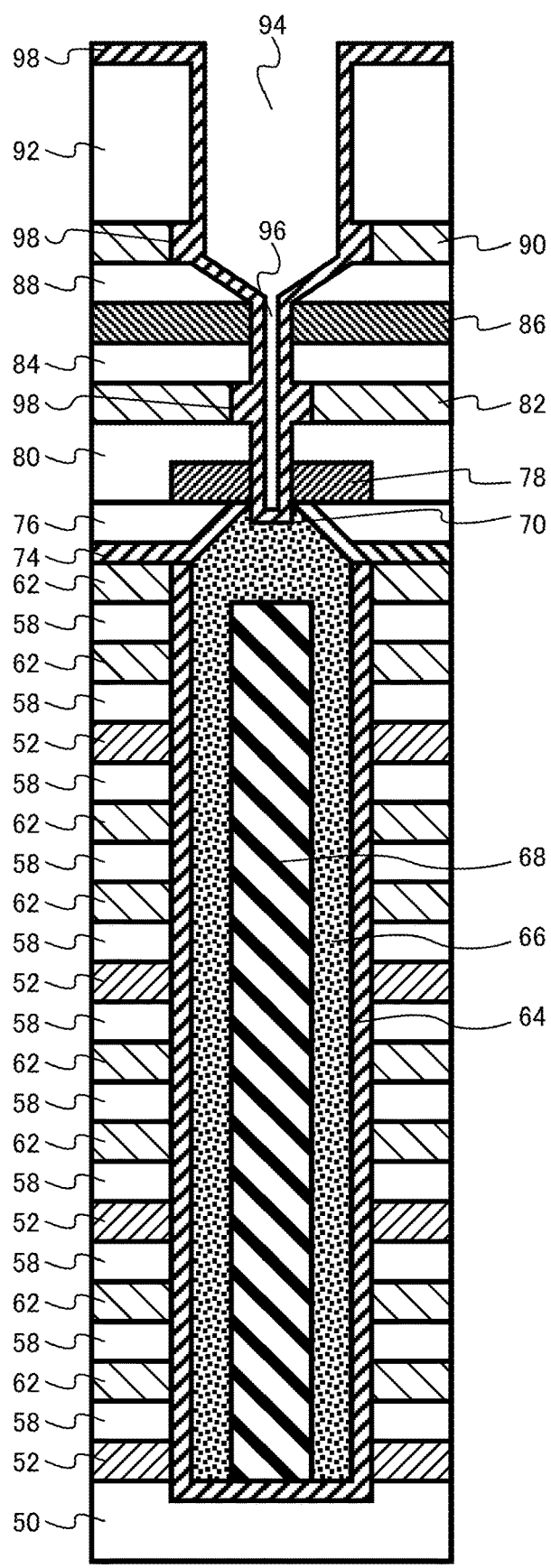
FIG. 29 is a schematic cross-sectional view illustrating an example of the method for manufacturing the memory device according to the first embodiment.

Subsequently, a third hafnium oxide film 98 is formed in the second opening 94 and the third opening 96 (FIG. 29). The third hafnium oxide film 98 is formed by, for example, an ALD method.

Figure 30:
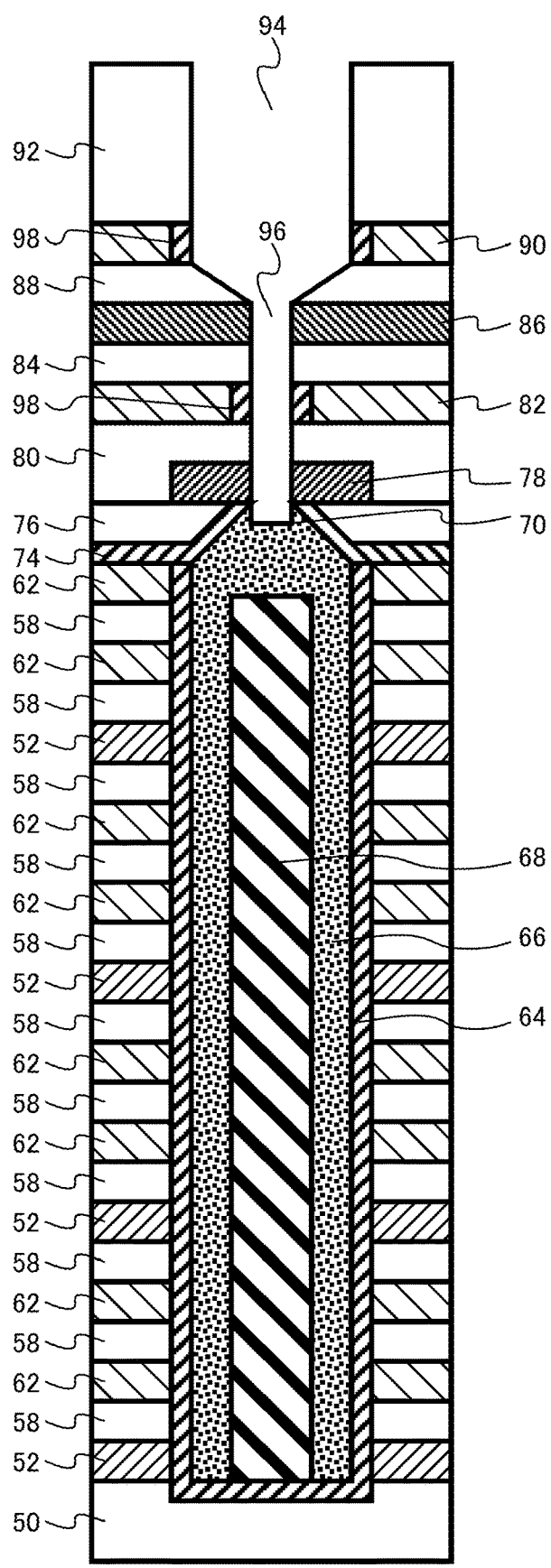
FIG. 30 is a schematic cross-sectional view illustrating an example of the method for manufacturing the memory device according to the first embodiment.

Subsequently, the third hafnium oxide film 98 on the inner surfaces of the second opening 94 and the third opening 96 is removed (FIG. 30). The third hafnium oxide film 98 is removed by using, for example, an RIB method. The third hafnium oxide film 98 remaining on a side surface of the second p-type polycrystalline silicon layer 82 and a side surface of the third p-type polycrystalline silicon layer 90 finally becomes the gate insulating film 14.

Figure 31:
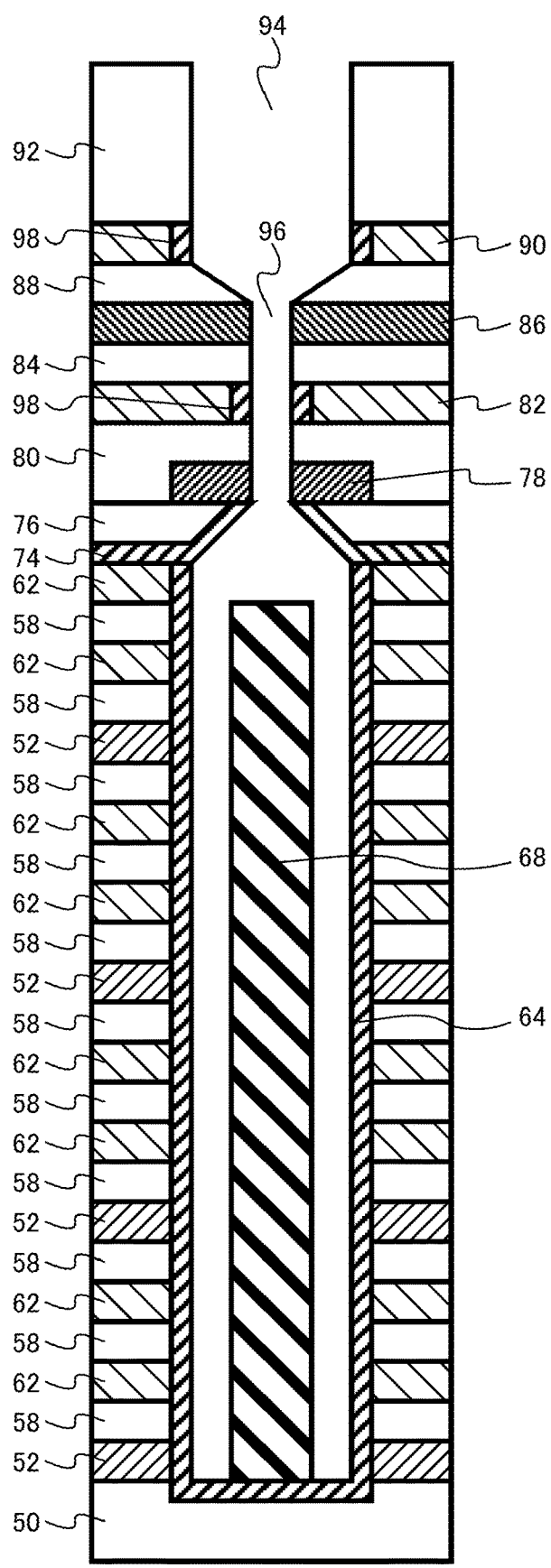
FIG. 31 is a schematic cross-sectional view illustrating an example of the method for manufacturing the memory device according to the first embodiment.

Subsequently, the first amorphous silicon film 66 and the second amorphous silicon film 70 are removed (FIG. 31). The first amorphous silicon film 66 and the second amorphous silicon film 70 are removed by, for example, a wet etching method.

Figure 32:
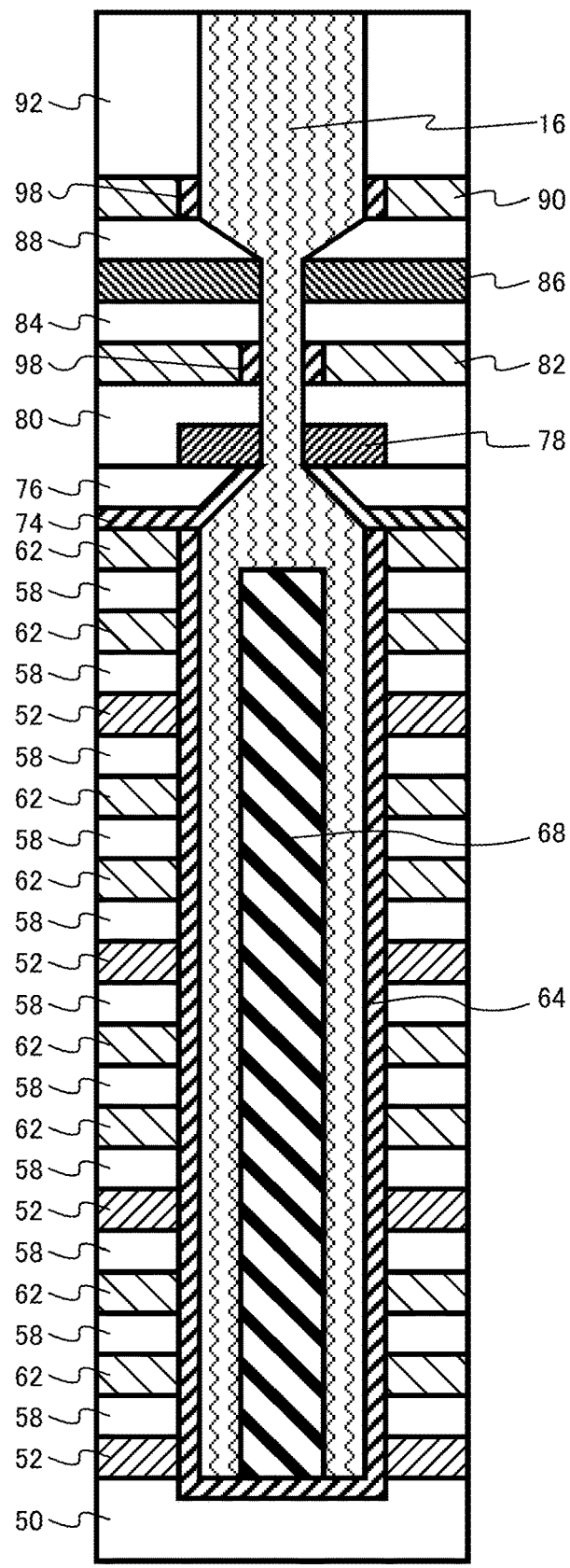
FIG. 32 is a schematic cross-sectional view illustrating an example of the method for manufacturing the memory device according to the first embodiment.

Subsequently, the fluid layer 16 is injected into an opening formed by removing the first amorphous silicon film 66 and the second amorphous silicon film 70 (FIG. 32). The fluid layer 16 is, for example, an electrolyte solution.

Figure 33:
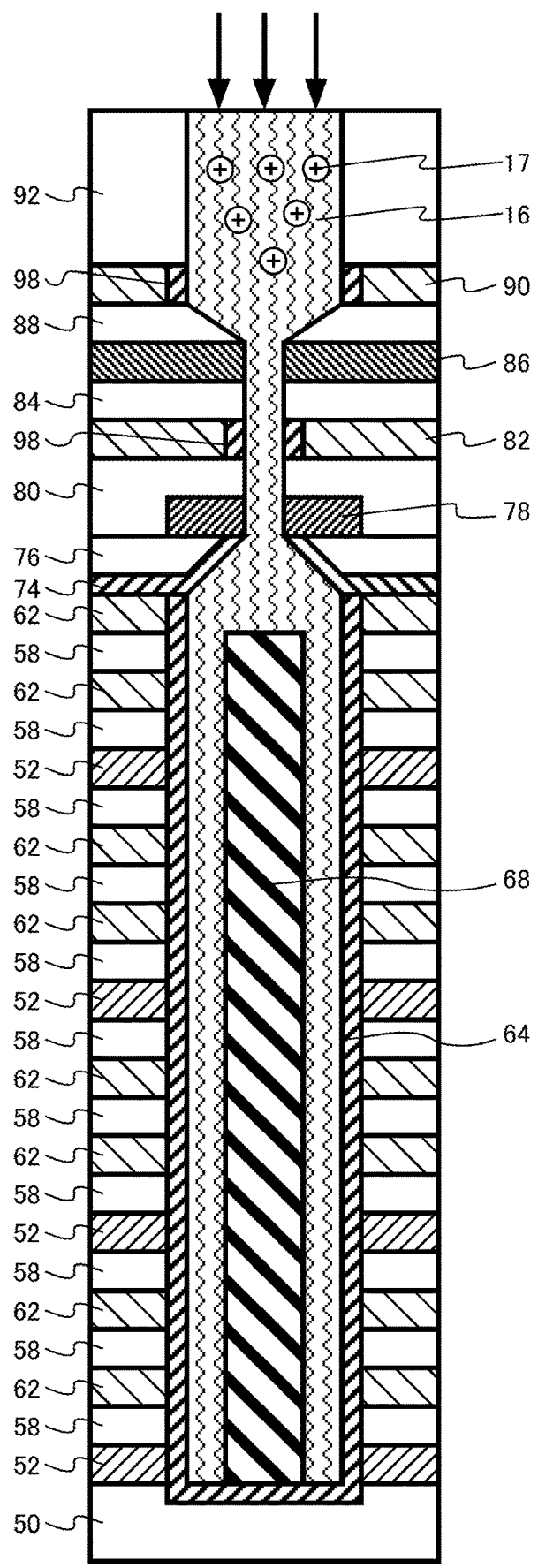
FIG. 33 is a schematic cross-sectional view illustrating an example of the method for manufacturing the memory device according to the first embodiment.

Subsequently, particles 17 are injected into the fluid layer 16 (FIG. 33). The particles 17 are, for example, derivative nanoparticles. The injection of the particles 17 is performed by, for example, a sputtering method. The particles 17 are, for example, positively charged particles in the fluid layer 16. The particles 17 finally become the charged particles 20.

Figure 34:
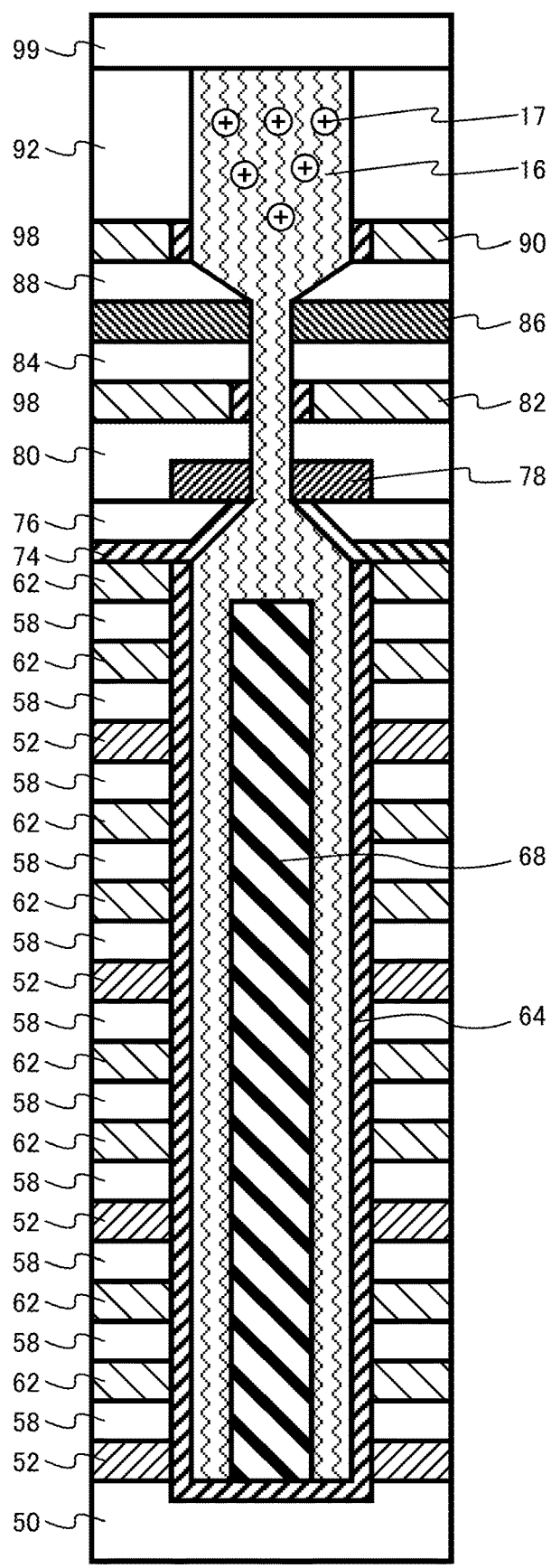
FIG. 34 is a schematic cross-sectional view illustrating an example of the method for manufacturing the memory device according to the first embodiment.

Subsequently, a ninth silicon oxide layer 99 is formed on the fluid layer 16 (FIG. 34). The ninth silicon oxide layer 99 finally becomes the interlayer insulating layer 12.

The memory cell array 101 of the nonvolatile memory 100 according to the first embodiment illustrated in FIGS. 3, 4, 5A, 5B, and 5C is manufactured by the above manufacturing method.

FIGS. 35A, 35B, 35C, 36A, 36B, 36C, 37A, 37B, 37C, 38A, 38B, 38C, 39A, 39B, and 39C are schematic diagrams illustrating an example of the method for manufacturing the memory device according to the first embodiment. FIGS. 35A to 39C are explanatory diagrams of a method for manufacturing the first contact plug CP1, the second contact plug CP2, and the third contact plug CP3. In FIGS. 35A to 39C, the memory bottle MB is not illustrated for the sake of convenience in description. FIGS. 35A to 39C illustrate only one layer of each of the barrier gate electrodes BG, the lower storage gate electrodes BSG, and the upper storage gate electrodes TSG for the sake of convenience in description.

The leftmost diagram in FIG. 35A illustrates a state in which the second silicon oxide layer 58, the n-type polycrystalline silicon layer 52, the second silicon oxide layer 58, the first silicon nitride layer 54, the second silicon oxide layer 58, the second silicon nitride layer 56, and the second silicon oxide layer 58 are stacked. In FIG. 35A, the leftmost diagram is a cross section parallel to the first direction. In FIG. 35A, the leftmost diagram is a cross section corresponding to FIG. 8.

In FIG. 35A, the right three diagrams are plan views including the second silicon nitride layer 56, the first silicon nitride layer 54, and the n-type polycrystalline silicon layer 52 from the left. In FIG. 35A, the right three diagrams are cross sections perpendicular to the first direction. In FIG. 35A, the leftmost diagram is a cross section taken along a line PP' in the right three diagrams.

Hereinafter, a mutual relationship between the four diagrams included in FIG. 35B, FIG. 35C, FIG. 36A, FIG. 36B, FIG. 36C, FIG. 37A, FIG. 37B, FIG. 37C, FIG. 38A, FIG. 38B, and FIG. 38C is similar to a mutual relationship in FIG. 35A. However, in FIGS. 36B, 36C, 37A, and 37B, the leftmost diagram is a cross section taken along a line QQ' in the right three diagrams.

A first slit St1 is formed in the second silicon oxide layer 58, the n-type polycrystalline silicon layer 52, the second silicon oxide layer 58, the first silicon nitride layer 54, the second silicon oxide layer 58, the second silicon nitride layer 56, and the second silicon oxide layer 58 (FIG. 35B). The first slit St1 is formed by using, for example, an RIE method.

Subsequently, the n-type polycrystalline silicon layer 52 is retracted in an A direction from a side surface of the first slit St1. The n-type polycrystalline silicon layer 52 is retracted by, for example, wet etching. Subsequently, the first silicon nitride layer 54 is retracted in the A direction from the side surface of the first slit St1 (FIG. 35C). The first silicon nitride layer 54 is retracted by, for example, wet etching using a chemical solution different from the chemical solution in the case of the n-type polycrystalline silicon layer 52.

Subsequently, the first slit St1 is filled with a silicon oxide layer 59a (FIGS. 36A and 36B).

Subsequently, a second slit St2 is formed in the second silicon oxide layer 58, the n-type polycrystalline silicon layer 52, the second silicon oxide layer 58, the first silicon nitride layer 54, the second silicon oxide layer 58, the second silicon nitride layer 56, and the second silicon oxide layer 58 (FIG. 36C). The second slit St2 is formed in a direction orthogonal to the first slit St1. The second slit St2 is formed by using, for example, an RIE method.

Subsequently, the n-type polycrystalline silicon layer 52 is retracted in a B direction from a side surface of the second slit St2. The n-type polycrystalline silicon layer 52 is retracted by, for example, wet etching. Subsequently, the second silicon nitride layer 56 is retracted in the B direction from the side surface of the second slit St2 (FIG. 37A). The second silicon nitride layer 56 is retracted by, for example, wet etching using a chemical solution different from the chemical solution in the case of the n-type polycrystalline silicon layer 52.

Subsequently, the second slit St2 is filled with a silicon oxide layer 59b (FIG. 37B).

Subsequently, a third slit St3 is formed in the second silicon oxide layer 58, the n-type polycrystalline silicon layer 52, the second silicon oxide layer 58, the first silicon nitride layer 54, the second silicon oxide layer 58, the second silicon nitride layer 56, and the second silicon oxide layer 58 (FIG. 37C). The third slit St3 is formed in a direction parallel to the first slit St1. The third slit St3 is formed by using, for example, an RIE method.

Subsequently, the first silicon nitride layer 54 is retracted in a C direction from a side surface of the third slit St3. The first silicon nitride layer 54 is retracted by, for example, wet etching. Subsequently, the second silicon nitride layer 56 is retracted in the C direction from the side surface of the third slit St3 (FIG. 38A). The second silicon nitride layer 56 is retracted by, for example, wet etching using a chemical solution different from the chemical solution in the case of the first silicon nitride layer 54.

Subsequently, the third slit St3 is filled with a silicon oxide layer 59c (FIG. 38B).

Subsequently, a first opening (not illustrated) is formed in the second silicon oxide layer 58, the n-type polycrystalline silicon layer 52, the second silicon oxide layer 58, the first silicon nitride layer 54, the second silicon oxide layer 58, the second silicon nitride layer 56, and the second silicon oxide layer 58. Subsequently, after the first silicon nitride layer 54 and the second silicon nitride layer 56 are removed from a side surface of the first opening by etching, the p-type polycrystalline silicon layer 62 is formed (FIG. 38C). The first silicon nitride layer 54 and the second silicon nitride layer 56 are replaced with the p-type polycrystalline silicon layers 62.

The n-type polycrystalline silicon layer 52 serves as the barrier gate electrode BG. The p-type polycrystalline silicon layer 62 with which the first silicon nitride layer 54 is replaced becomes the lower storage gate electrode BSG. The p-type polycrystalline silicon layer 62 with which the second silicon nitride layer 56 is replaced becomes the upper storage gate electrode TSG.

Subsequently, the first contact plug CP1, the second contact plug CP2, and the third contact plug CP3 are formed. For example, after contact holes respectively corresponding to the first contact plug CP1, the second contact plug CP2, and the third contact plug CP3 are formed by an RIE method, the contact holes are filled with a tungsten layer, and thus, the first contact plug CP1, the second contact plug CP2, and the third contact plug CP3 are formed (FIGS. 39A, 39B, and 39C). FIG. 39C is a cross-sectional view perpendicular to the first direction and including an interface between the upper storage gate electrode TSG and the first contact plug CP1, an interface between the lower storage gate electrode BSG and the second contact plug CP2, and an interface between the barrier gate electrode BG and the third contact plug CP3 from the left.

The first contact plug CP1 is in contact with the upper storage gate electrode TSG. The second contact plug CP2 is in contact with the lower storage gate electrode BSG. The third contact plug CP3 is in contact with the barrier gate electrode BG.

The first contact plug CP1, the second contact plug CP2, and the third contact plug CP3 illustrated in FIG. 6 or 7 are formed by the above manufacturing method.

Next, an operation of the nonvolatile memory 100 will be described. First, a data retention state of the nonvolatile memory 100 will be described.

Figure 40:
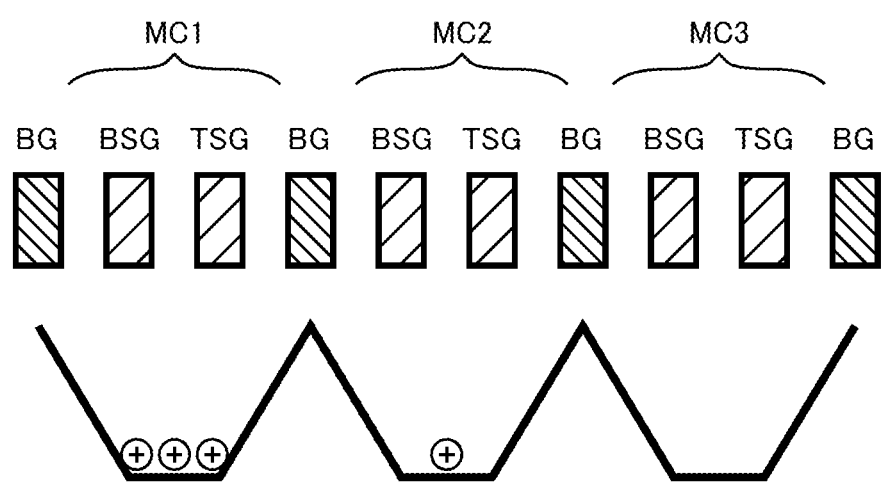
FIG. 40 is an explanatory diagram of a data retention state of the memory device according to the first embodiment.

FIG. 40 is an explanatory diagram of a data retention state of the memory device according to the first embodiment. The upper diagram of FIG. 40 illustrates the arrangement of the barrier gate electrode BG, the lower storage gate electrode BSG, and the upper storage gate electrode TSG included in one memory bottle MB. The lower diagram of FIG. 40 illustrates an electrostatic potential distribution and the charged particles in the fluid layer facing each of the barrier gate electrode BG, the lower storage gate electrode BSG, and the upper storage gate electrode TSG.

FIG. 40 illustrates a case where one memory bottle MB includes three memory cells MC of the first memory cell MC1, the second memory cell MC2, and the third memory cell MC3. In an initial state, a case where three charged particles are retained in the first memory cell MC1, one charged particle is retained in the second memory cell MC2, and zero charged particle is retained in the third memory cell MC3 will be described as an example. A value of data stored in the memory cell MC is decided by the number of charged particles retained in the memory cell MC.

In the data retention state, for example, voltages are not applied to the barrier gate electrode BG, the lower storage gate electrode BSG, and the upper storage gate electrode TSG.

The material constituting the lower storage gate electrode BSG is different from the material constituting the barrier gate electrode BG. The work function of the material constituting the lower storage gate electrode BSG is larger than the work function of the material constituting the barrier gate electrode BG.

Similarly, the material constituting the upper storage gate electrode TSG is different from the material constituting the barrier gate electrode BG. The material constituting the upper storage gate electrode TSG has a work function larger than the work function of the material constituting the barrier gate electrode BG.

The materials constituting the upper storage gate electrode TSG and the lower storage gate electrode BSG are, for example, p-type polycrystalline silicon. The material constituting the barrier gate electrode BG is, for example, n-type polycrystalline silicon. The work function of the p-type polycrystalline silicon is larger than the work function of the n-type polycrystalline silicon.

Thus, the electrostatic potential of the fluid layer facing the barrier gate electrode BG is higher than the electrostatic potential of the fluid layer facing the lower storage gate electrode BSG and the upper storage gate electrode TSG. Accordingly, the charged particles in the memory cell MC are blocked by a potential barrier formed by the barrier gate electrode BG, and the movement of the charged particles to the adjacent memory cell MC is suppressed. Thus, the charged particles are retained in the memory cell MC.

Next, the read operation and the write operation of the nonvolatile memory 100 will be described.

The nonvolatile memory 100 sequentially transfers the data stored in the memory cells MC connected in series in the memory bottle MB to the adjacent memory cells MC during the read operation and the write operation. The nonvolatile memory 100 performs a so-called shift register type operation during the read operation and the write operation. The read operation of the nonvolatile memory 100 is destructive reading in which the data stored in the memory cell MC is not stored.

Figure 41:
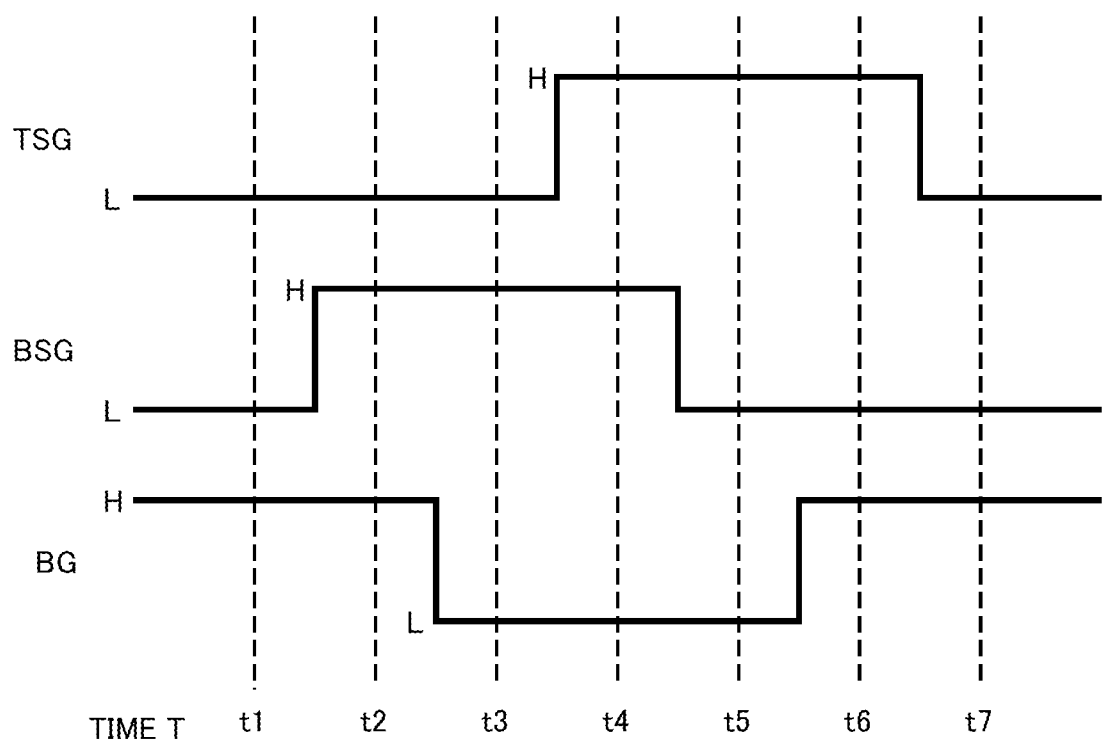
FIG. 41 is an explanatory diagram of a read operation of the memory device according to the first embodiment.
Figure 42:
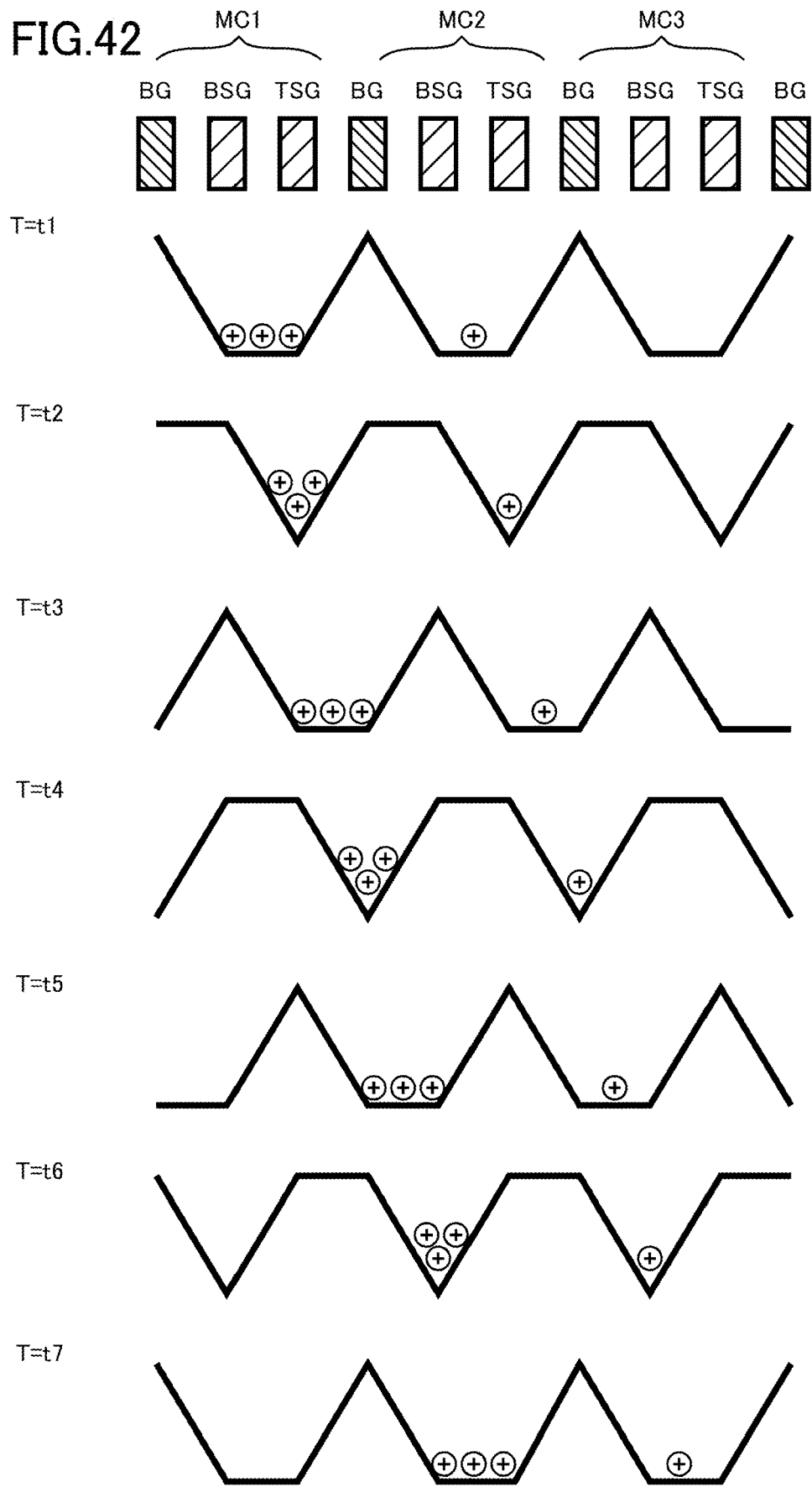
FIG. 42 is an explanatory diagram of a read operation of the memory device according to the first embodiment.

FIGS. 41 and 42 are explanatory diagrams of the read operation of the memory device according to the first embodiment. FIG. 41 is a timing chart of voltages to be applied to the barrier gate electrode BG, the lower storage gate electrode BSG, and the upper storage gate electrode TSG when data is transferred between the memory cells MC. FIG. 42 is a diagram illustrating a temporal change in the electrostatic potential distribution of the fluid layer and the movement of the charged particles.

As illustrated in FIG. 41, the voltages to be applied to the barrier gate electrode BG, the lower storage gate electrode BSG, and the upper storage gate electrode TSG change, and thus, the electrostatic potential distribution changes as illustrated in FIG. 42.

Due to the change in the electrostatic potential distribution, the charged particles are transferred rightward as illustrated in FIG. 42. For example, the three charged particles retained in the first memory cell MC1 at time t1 move to the second memory cell MC2 at time t7. For example, one charged particle retained in the second memory cell MC2 at time t1 moves to the third memory cell MC3 at time t7.

For example, the charged particles can be transferred leftward by changing timings of the voltages to be applied to the barrier gate electrode BG, the lower storage gate electrode BSG, and the upper storage gate electrode TSG. For example, unlike FIG. 41, the charged particles can be transferred leftward by increasing the voltage to be applied to the upper storage gate electrode TSG prior to the lower storage gate electrode BSG. For example, the charged particles are transferred leftward during the write operation.

Figure 43A:
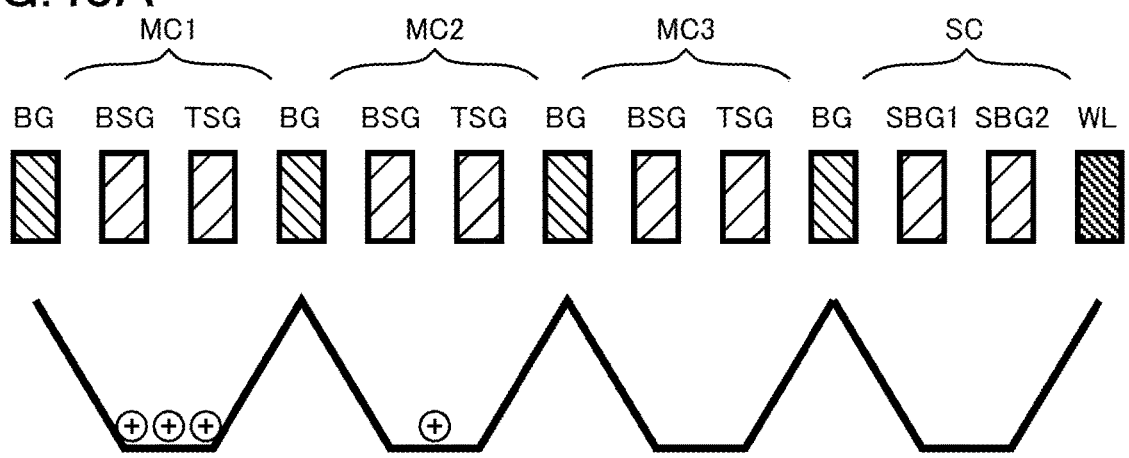
FIGS. 43A and 43B are explanatory diagrams of the read operation of the memory device according to the first embodiment.
Figure 43B:
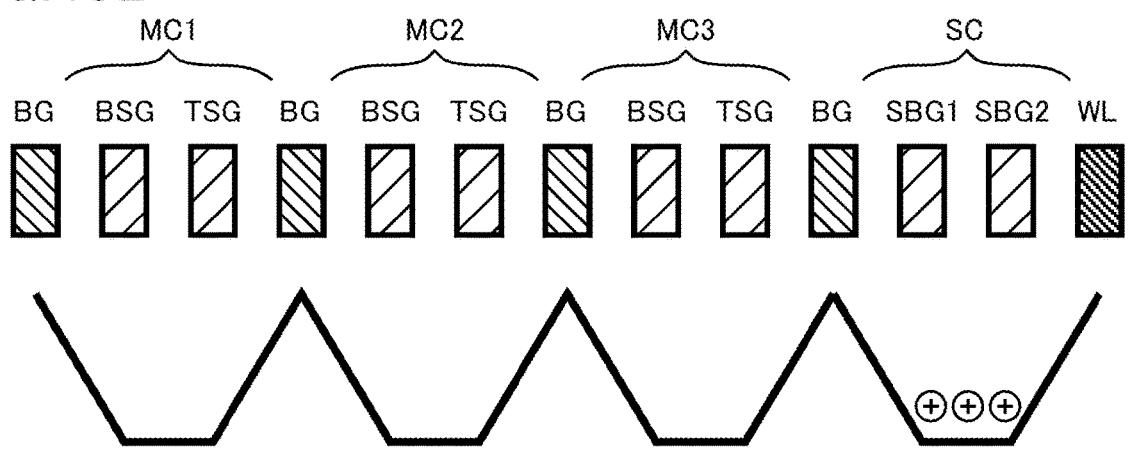

FIGS. 43A and 43B are explanatory diagrams of the read operation of the memory device according to the first embodiment. FIG. 43A illustrates the electrostatic potential distribution and the charged particles in the fluid layer in the initial state. FIG. 43B illustrates the electrostatic potential distribution and the charged particles in the fluid layer after the charged particles are transferred.

Hereinafter, a case where the data stored in the first memory cell MC1 is read will be described as an example.

As illustrated in FIGS. 43A and 43B, the three charged particles retained in the first memory cell MC1 in the initial state move to the stand-by cell SC by controlling the voltages to be applied to the barrier gate electrode BG, the lower storage gate electrode BSG, and the upper storage gate electrode TSG. The data stored in the first memory cell MC1 is transferred to the stand-by cell SC.

FIGS. 44, 45A, 45B, 45C, 45D, 46A, 46B, 46C, and 46D are explanatory diagrams of the read operation of the memory device according to the first embodiment.

Figure 44:
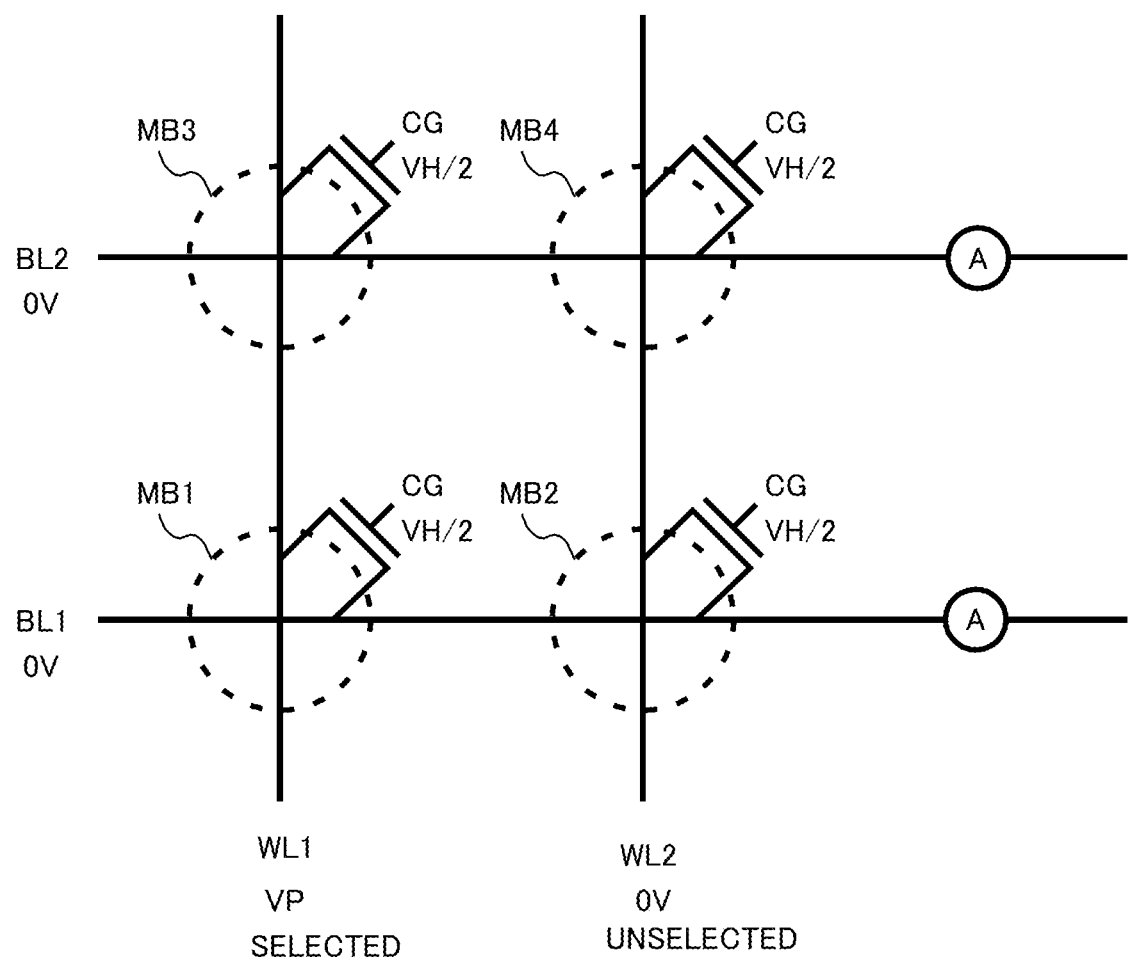
FIG. 44 is an explanatory diagram of the read operation of the memory device according to the first embodiment.

FIG. 44 is an equivalent circuit diagram of a part of the memory cell array. FIG. 44 illustrates the first memory bottle MB1, the second memory bottle MB2, the third memory bottle MB3, and the fourth memory bottle MB4. The first word line WL1, the second word line WL2, the first bit line BL1, and the second bit line BL2 are illustrated. The cock gate electrode for controlling the current flowing between the word line WL and the bit line BL connected to the memory bottles MB is illustrated.

FIG. 44 illustrates the voltages to be applied to the word line WL and the bit line BL when the data stored in the first memory bottle MB1 is read. Hereinafter, it is assumed that a high level of the word line WL is VP, a low level of the word line WL is 0 V, a high level of the bit line BL is VP, and a low level of the bit line BL is 0 V. VP is, for example, 1 V.

The first word line WL1 connected to the selected first memory bottle MB1 is a select word line. The second word line WL2 not connected to the first memory bottle MB1 is a non-select word line.

VP is applied to the first word line WL1. 0 V is applied to the second word line WL2.

FIGS. 45A, 45B, 45C, and 45D are explanatory diagrams of an operation of the selected first memory bottle MB1. FIGS. 46A, 46B, 46C, and 46D are explanatory diagrams of an operation of the unselected second memory bottle MB2.

Figure 45A:
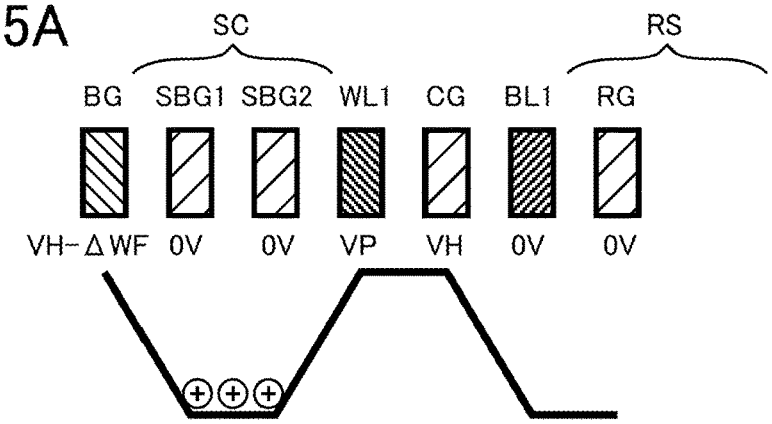
FIGS. 45A, 45B, 45C, and 45D are explanatory diagrams of the read operation of the memory device according to the first embodiment.
Figure 45B:
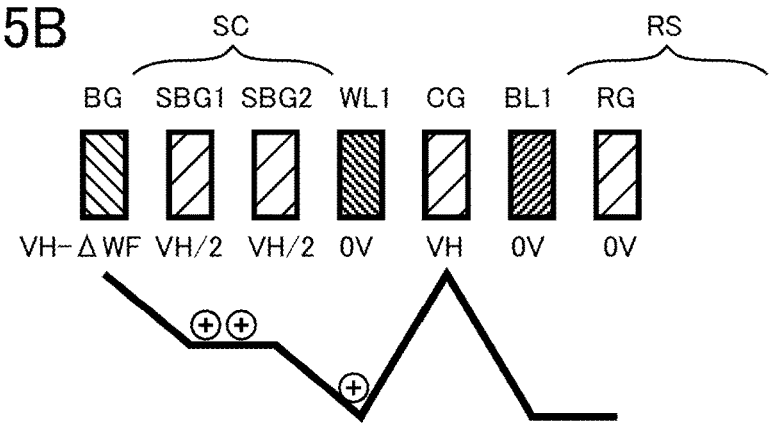
Figure 45C:
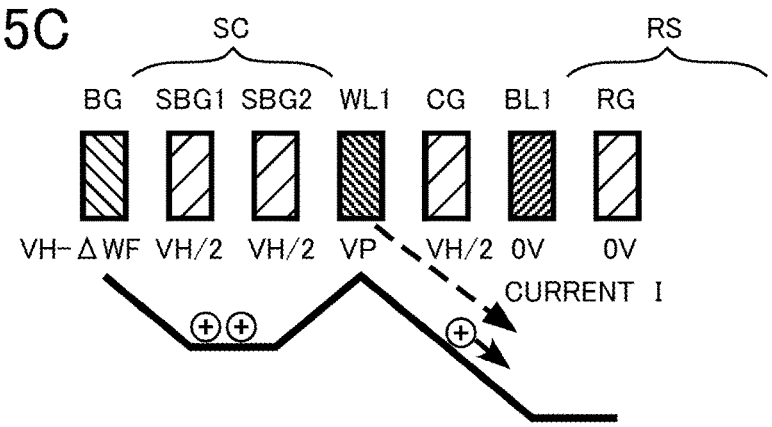

FIGS. 45A, 45B, and 45C illustrate the voltages to be applied to the barrier gate electrode BG, the first stand-by electrode SBG1, the second stand-by electrode SBG2, the first word line WL1, the cock gate electrode CG, the first bit line BL1, and the reservoir gate electrode RG during the read operation of the first memory bottle MB1. The electrostatic potential distribution of the fluid layer and the charged particles in the fluid layer are illustrated.

Hereinafter, it is assumed that the high level of the voltages to be applied to the first stand-by electrode SBG1, the second stand-by electrode SBG2, the cock gate electrode CG, and the reservoir gate electrode RG is VH, the intermediate level is VH/2, and the low level is 0 V. It is assumed that the high level of the voltage to be applied to the barrier gate electrode BG is (VH-ΔWF) and the low level is 0 V. ΔWF is a work function difference between the barrier gate electrode BG and the stand-by electrode SBG, between the barrier gate electrode BG and the cock gate electrode CG, and between the barrier gate electrode BG and the reservoir gate electrode RG. The VH is, for example, 5 V. ΔWF is, for example, 1 V.

Figure 45D:
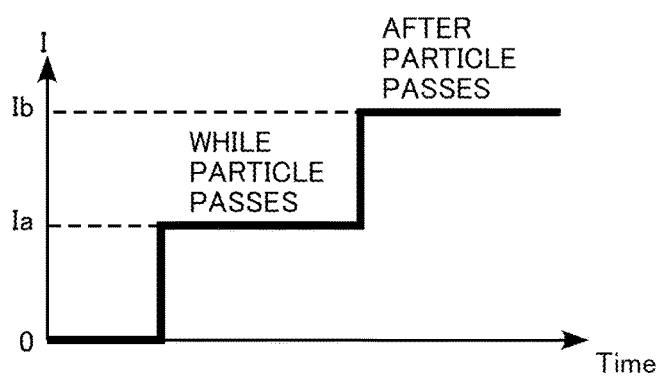
Figure 46A:
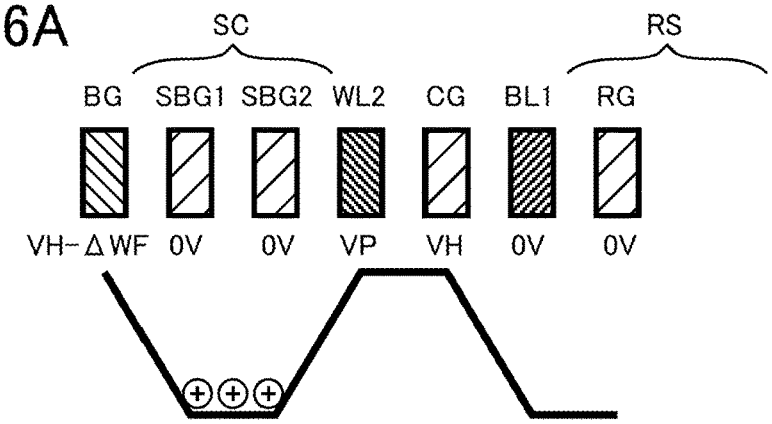
FIGS. 46A, 46B, 46C, and 46D are explanatory diagrams of the read operation of the memory device according to the first embodiment.
Figure 46B:
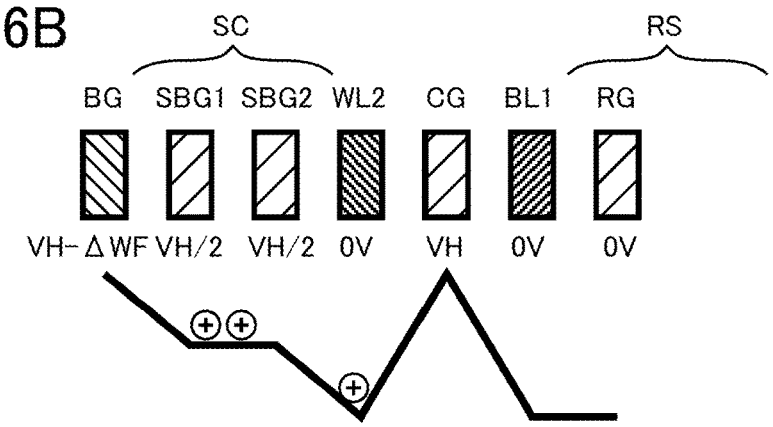
Figure 46C:
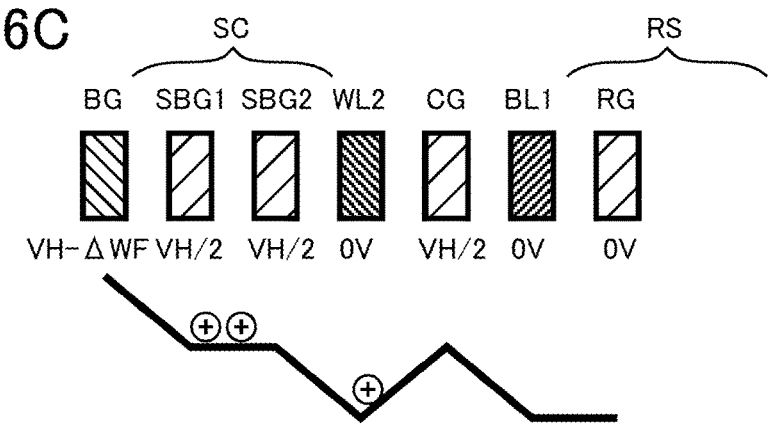
Figure 46D:

FIG. 45D illustrates a temporal change in the current flowing between the first word line WL1 and the first bit line BL1 during the read operation of the first memory bottle MB1.

As illustrated in FIG. 45A, the three charged particles retained in the first memory cell MC1 are moved to and are retained in the stand-by cell SC.

As illustrated in FIG. 45B, the voltages of the first stand-by electrode SBG1 and the second stand-by electrode SBG2 are increased from 0 V to VH/2 and the voltage of the first word line WL1 is decreased from VP to 0 V once, and thus, one of the three charged particles moves toward the first word line WL1. In the state of FIG. 45B, since the cock transistor enters an off state and there is no electric potential difference between the first word line WL1 and the first bit line BL1, a current does not flow.

Subsequently, as illustrated in FIG. 45C, the voltage of the first word line WL1 is increased from 0 V to VP, and the voltage of the cock gate electrode CG is decreased from VH to VH/2. One charged particle moved to the first word line WL1 side moves to the first bit line BL1 side. In the state of FIG. 45C, since the cock transistor enters an on state and there is an electric potential difference between the first word line WL1 and the first bit line BL1, a current flows between the first word line WL1 and the first bit line BL1.

As illustrated in FIG. 45D, a current Ia flows while the charged particles pass through the fluid layer facing the cock gate electrode CG. On the other hand, after the charged particles pass through the fluid layer facing the cock gate electrode CG, a current Ib flows. While the charged particles pass through the fluid layer facing the cock gate electrode CG, a flow rate of the fluid is reduced by the charged particles. Accordingly, the current Ia is smaller than the current Ib.

A change in the current flowing between the first word line WL1 and the first bit line BL1 is monitored by an ammeter connected to the first bit line BL1. The change in the current is monitored by repeating the operations illustrated in FIGS. 45B and 45C, and thus, it is possible to determine the number of charged particles retained in the stand-by cell SC.

In the cases of FIGS. 45A, 45B, 45C, and 45D, it is possible to determine that the number of charged particles retained in the first memory cell MC1 is 3. Thus, the data stored in the first memory cell MC1 can be determined.

As illustrated in FIGS. 46A, 46B, 46C, and 46D, in the unselected second memory bottle MB2, since there is no electric potential difference between the second word line WL2 and the first bit line BL1, a current does not flow.

FIG. 47 is an explanatory diagram of the read operation of the memory device according to the first embodiment. FIG. 47 is a diagram illustrating a sequence of transferring and reading of data stored in the memory cell MC.

FIG. 47 illustrates a case where six charged particles are retained in the first memory cell MC1, two charged particles are retained in the second memory cell MC2, and four charged particles are retained in the third memory cell MC3 as an example.

When data stored in the first memory cell MC1 is read, after data transferring, data reading from the third memory cell MC3, data transferring, data reading from the second memory cell MC2, and data transferring are performed, data from the first memory cell MC1 is read. When data is transferred, the charged particles move to the adjacent memory cell MC.

The charged particles retained in each memory cell MC are accumulated in the reservoir RS after data is read. The data reading of each memory cell MC is destructive reading.

For example, data read from each memory cell MC is stored in a memory in the nonvolatile memory 100 or outside the nonvolatile memory 100. Rewriting is performed to each memory cell MC based on the data stored in the memory.

The data stored in the plurality of memory bottles MB to be controlled by using the common barrier gate electrode BG, the common lower storage gate electrode BSG, and the common upper storage gate electrode TSG is collectively read, for example. For example, data reading from the third memory cells MC3 of the plurality of memory bottles MB, data transferring, data reading from the second memory cells MC2 of the plurality of memory bottles MB, data transferring, and data reading from the first memory cells MC1 of the plurality of memory bottles MB are sequentially performed.

FIGS. 48, 49A, 49B, 49C, 49D, 50A, 50B, 50C, and 50D are explanatory diagrams of the write operation of the memory device according to the first embodiment.

Figure 48:
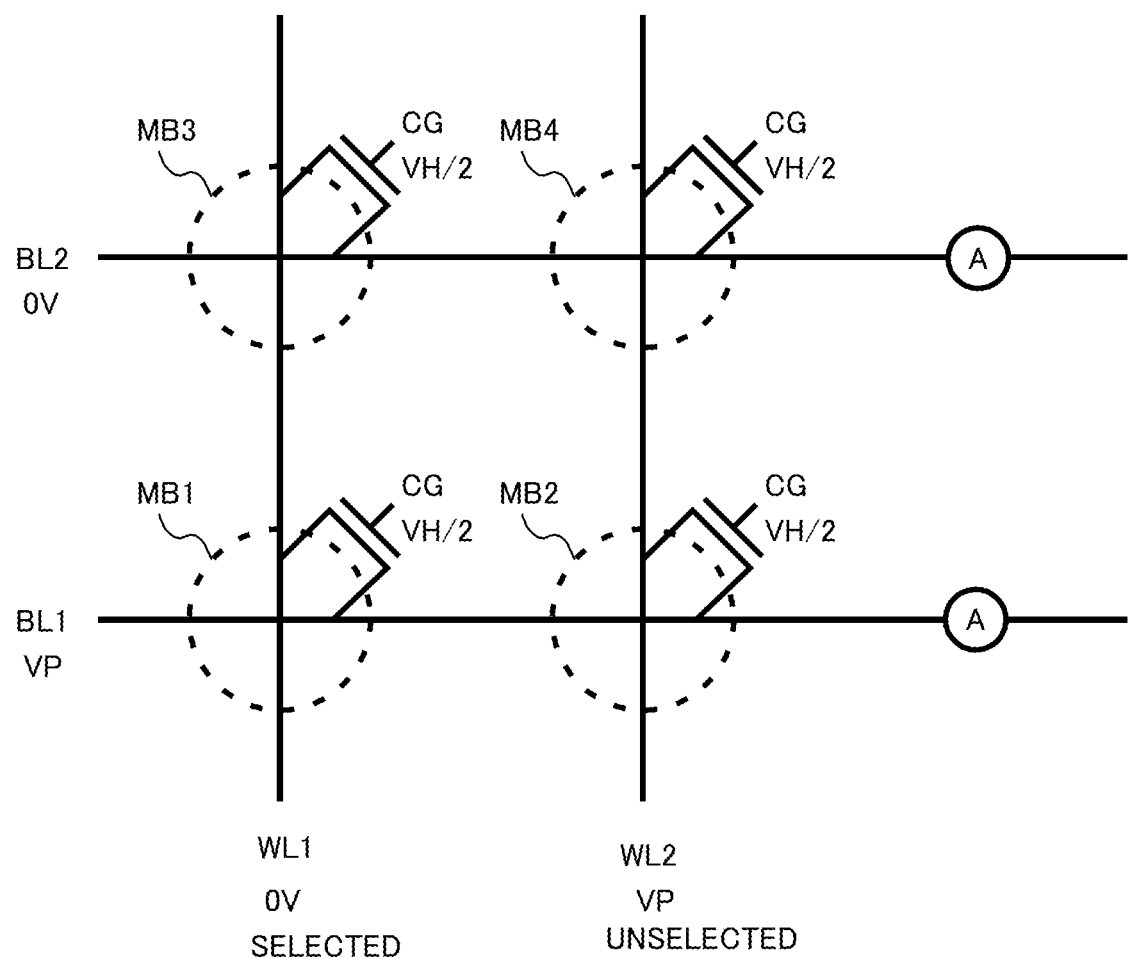
FIG. 48 is an explanatory diagram of a write operation of the memory device according to the first embodiment.

FIG. 48 is an equivalent circuit diagram of a part of the memory cell array. FIG. 48 illustrates the first memory bottle MB1, the second memory bottle MB2, the third memory bottle MB3, and the fourth memory bottle MB4. The first word line WL1, the second word line WL2, the first bit line BL1, and the second bit line BL2 are illustrated. The cock gate electrode for controlling the current flowing between the word line WL and the bit line BL connected to the memory bottles MB is illustrated.

FIG. 48 illustrates the voltages to be applied to the word line WL and the bit line BL when data stored in the first memory bottle MB1 is written. Hereinafter, it is assumed that a high level of the word line WL is VP, a low level of the word line WL is 0 V, a high level of the bit line BL is VP, and a low level of the bit line BL is 0 V. VP is, for example, 1 V.

The first word line WL1 connected to the selected first memory bottle MB1 is a select word line. The second word line WL2 not connected to the first memory bottle MB1 is a non-select word line.

0 V is applied to the first word line WL1. VP is applied to the second word line WL2.

FIGS. 49A, 49B, 49C, and 49D are explanatory diagrams of an operation of the selected first memory bottle MB1. FIGS. 50A, 50B, 50C, and 50D are explanatory diagrams of an operation of the unselected second memory bottle MB2.

Figure 49A:
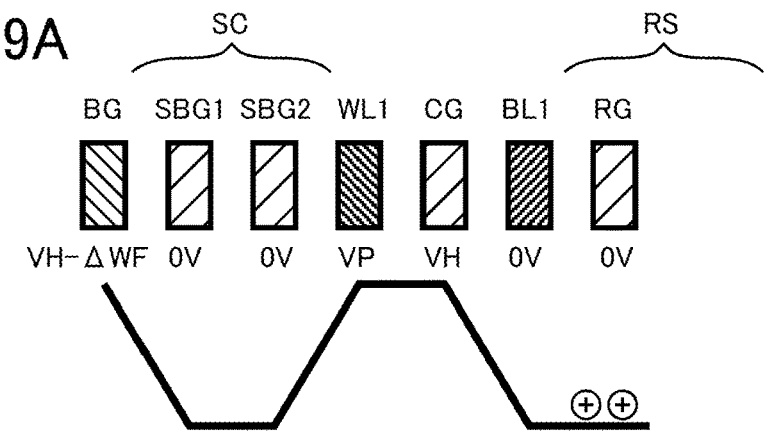
FIGS. 49A, 49B, 49C, and 49D are explanatory diagrams of the write operation of the memory device according to the first embodiment.
Figure 49B:
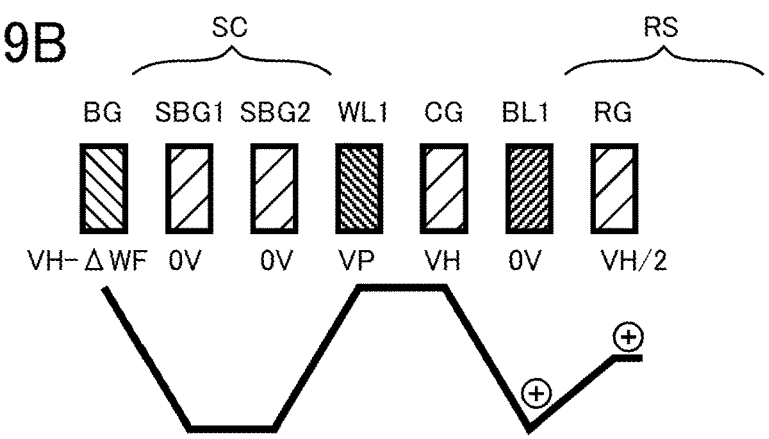
Figure 49C:
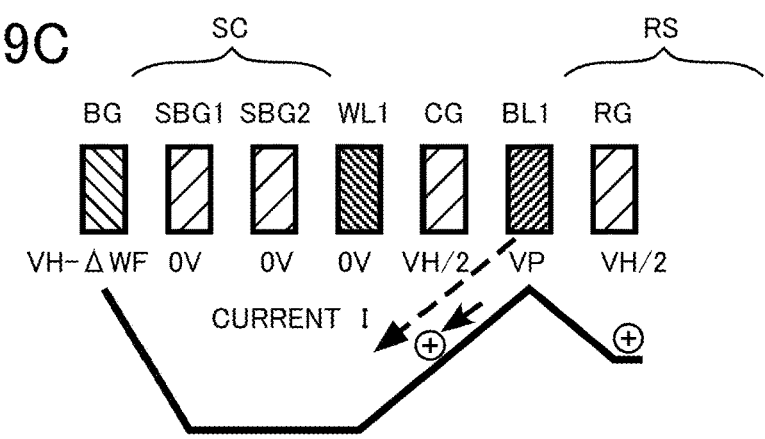

FIGS. 49A, 49B, and 49C illustrate the voltages to be applied to the barrier gate electrode BG, the first stand-by electrode SBG1, the second stand-by electrode SBG2, the first word line WL1, the cock gate electrode CG, the first bit line BL1, and the reservoir gate electrode RG during the read operation of the first memory bottle MB1. The electrostatic potential distribution of the fluid layer and the charged particles in the fluid layer are illustrated.

Hereinafter, it is assumed that the high level of the voltages to be applied to the first stand-by electrode SBG1, the second stand-by electrode SBG2, the cock gate electrode CG, and the reservoir gate electrode RG is VH, the intermediate level is VH/2, and the low level is 0 V. It is assumed that the high level of the voltage to be applied to the barrier gate electrode BG is (VH-ΔWF) and the low level is 0 V. ΔWF is a work function difference between the barrier gate electrode BG and the stand-by electrode SG, between the barrier gate electrode BG and the cock gate electrode CG, and between the barrier gate electrode BG and the reservoir gate electrode RG. The VH is, for example, 5 V. ΔWF is, for example, 1 V.

Figure 49D:
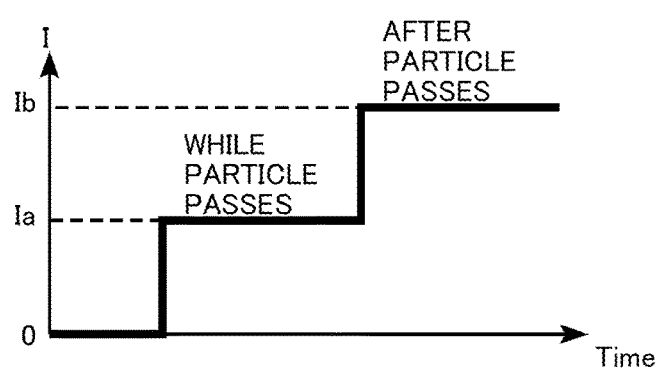

FIG. 49D illustrates a temporal change in the current flowing between the first word line WL1 and the first bit line BL1 during the write operation of the first memory bottle MB1.

As illustrated in FIG. 49A, a plurality of charged particles is accumulated in the reservoir RS.

As illustrated in FIG. 49B, the voltage of the reservoir gate electrode RG is increased from 0 V to VH/2, and thus, one of the plurality of charged particles moves toward the first bit line BL1. In the state of FIG. 49B, the cock transistor enters an off state, and a current does not flow between the first word line WL1 and the first bit line BL1.

Subsequently, as illustrated in FIG. 49C, the voltage of the first bit line BL1 is increased from 0 V to VP, and the voltage of the cock gate electrode CG is decreased from VH to VH/2. The voltage of the first word line WL1 is lowered from VP to 0 V.

One charged particle moved to the first bit line BL1 side moves to the first word line WL1 side. The moved charged particle is retained in the stand-by cell SC. In the state of FIG. 49C, since the cock transistor enters an on state and there is an electric potential difference between the first word line WL1 and the first bit line BL1, a current flows between the first word line WL1 and the first bit line BL1.

As illustrated in FIG. 49D, a current Ia flows while the charged particles pass through the fluid layer facing the cock gate electrode CG. After the charged particles pass through the fluid layer facing the cock gate electrode CG, a current Ib flows. While the charged particles pass through the fluid layer facing the cock gate electrode CG, a flow rate of the fluid is reduced by the charged particles. Accordingly, the current Ia is smaller than the current Ib.

A change in the current flowing between the first word line WL1 and the first bit line BL1 is monitored by an ammeter connected to the first bit line BL1. The change in the current is monitored by repeating the operations illustrated in FIGS. 49B and 49C, and thus, it is possible to determine the number of charged particles moving from the reservoir RS to the stand-by cell SC.

After the desired number of charged particles is moved to the stand-by cell SC, the charged particles in the stand-by cell SC move to the desired memory cell MC. Accordingly, desired data can be written to the desired memory cell MC.

When it is not desired to move the charged particles from the reservoir RS to the stand-by cell SC, the voltage of the first bit line BL1 may be maintained at 0 V in the state of FIG. 49C.

Figure 50A:
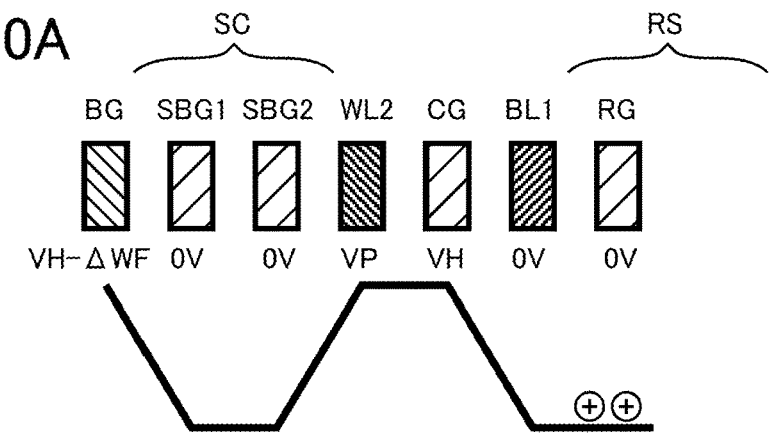
FIGS. 50A, 50B, 50C, and 50D are explanatory diagrams of the write operation of the memory device according to the first embodiment.
Figure 50B:
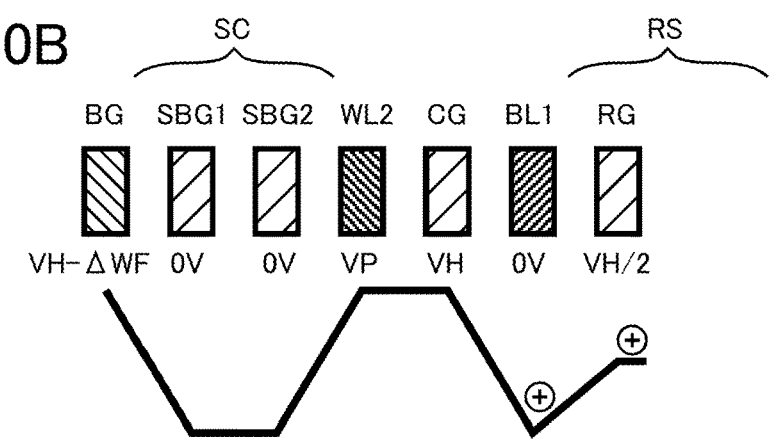
Figure 50C:
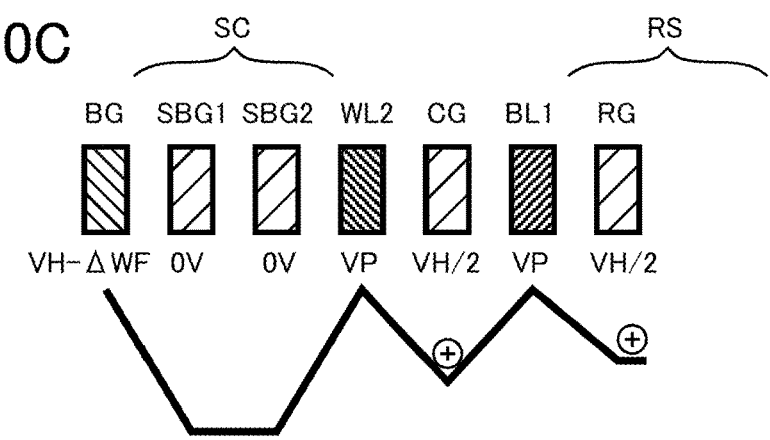
Figure 50D:

As illustrated in FIG. 50C, in the unselected second memory bottle MB2, since there is no electric potential difference between the second word line WL2 and the first bit line BL1, a current does not flow.

For example, the data writing to the plurality of memory bottles MB to be controlled by using the common barrier gate electrode BG, the common lower storage gate electrode BSG, and the common upper storage gate electrode TSG is collectively performed. For example, data writing to the first memory cells MC1 of the plurality of memory bottles MB, data transferring, data writing to the second memory cells MC2 of the plurality of memory bottles MB, data transferring, and data writing to the third memory cells MC3 of the plurality of memory bottles MB are sequentially performed.

Next, functions and effects of the memory device according to the first embodiment will be described.

In order to realize a large capacity of the nonvolatile memory, it is desirable to three-dimensionally arrange the memory cells. In order to realize a large capacity of the nonvolatile memory, it is desired to set data stored in one memory cell to be multivalued.

In the nonvolatile memory 100 according to the first embodiment, the memory cell array 101 includes the plurality of memory bottles MB in which the plurality of memory cells MC is connected in series. Thus, the memory cells MC are three-dimensionally arranged in the memory cell array 101. Accordingly, a large capacity of the nonvolatile memory 100 can be realized.

The nonvolatile memory 100 according to the first embodiment uses the number of charged particles 20 present in the fluid layer 16 of the memory cell MC as a basis of the data. Accordingly, it is easy to set the data stored in one memory cell MC to be multivalued. The multivalued data can be stably read from the memory cell MC. The multivalued data can be stably written to the memory cell MC.

For example, it is assumed that the maximum number of charged particles 20 that can be present in one memory cell MC is $2^N-1$. In this case, N-bit data can be stored in one memory cell MC. For example, when the maximum number of charged particles 20 that can be present in one memory cell MC is 1023 ($2^{10}-1$), 10-bit data can be stored in one memory cell MC.

The nonvolatile memory 100 according to the first embodiment can increase the data stored in one memory cell MC by increasing the maximum number of charged particles 20 that can be present in one memory cell MC. Accordingly, it is easy to set the data stored in one memory cell MC to be multivalued.

In the nonvolatile memory 100 according to the first embodiment, the data stored in the memory cell MC is based on the number of charged particles 20 of the memory cell MC. Thus, the data of the memory cell MC is completely digitized. The number of charged particles 20 passing through the cock transistor is counted, and thus, the data stored in the memory cell MC is determined. Thus, data reading accuracy is high. Accordingly, it is possible to stably read the multivalued data from the memory cell MC.

The nonvolatile memory 100 according to the first embodiment writes desired data to the memory cell MC by counting the number of charged particles 20 passing through the cock transistor. Thus, data writing accuracy is high. Accordingly, it is possible to stably write the multivalued data to the memory cell MC.

A difference between the work function of the material of the lower storage gate electrode BSG and the work function of the material of the barrier gate electrode BG is preferably equal to or more than 0.5 eV, more preferably equal to or more than 0.8 eV, and still more preferably equal to or more than 1.0 eV. A difference between the work function of the material of the upper storage gate electrode TSG and the work function of the material of the barrier gate electrode BG is preferably equal to or more than 0.5 eV, more preferably equal to or more than 0.8 eV, and still more preferably equal to or more than 1.0 eV.

A difference between the third work function and the first work function is preferably equal to or more than 0.5 eV, more preferably equal to or more than 0.8 eV, and still more preferably equal to or more than 1.0 eV. A difference between the third work function and the second work function is preferably equal to or more than 0.5 eV, more preferably equal to or more than 0.8 eV, and still more preferably equal to or more than 1.0 eV.

When a lower limit value is satisfied, the barrier against the movement of the charged particles increases, and charge retention characteristics of the memory cell MC are improved.

The charged particles 20 are allowed to be isolated and pass through the fluid layer 16 facing the cock gate electrode CG one by one, and thus, it is possible to read and write data with high accuracy. From the viewpoint of allowing the charged particles 20 to be isolated and pass through the fluid layer 16 facing the cock gate electrode CG one by one, the first cross-sectional area S1 of the fluid layer 16 is preferably smaller than the second cross-sectional area S2. From the same viewpoint, the first cross-sectional area S1 is preferably smaller than the third cross-sectional area S3.

From the viewpoint of allowing the charged particles 20 to be isolated and pass through the fluid layer 16 facing the cock gate electrode CG one by one, the width (w in FIG. 5B) of the fluid layer 16 in the first cross section is preferably, for example, smaller than twice the diameter of the charged particle 20.

The first cross-sectional area S1 is decreased, and thus, the channel region of the cock transistor is narrowed. Thus, it is easy to allow the charged particles 20 to pass through one by one. Thus, it is easy to count the number of charged particles 20 passing through the cock transistor. Accordingly, the data reading accuracy and the data writing accuracy are improved.

A volume of the fluid layer 16 of the memory cell MC can be increased by increasing the second cross-sectional area S2. Accordingly, the maximum number of charged particles 20 that can be present in the memory cell MC can be increased.

A volume of the fluid layer 16 of the reservoir RS can be increased by increasing the third cross-sectional area S3. Accordingly, the maximum number of charged particles 20 that can be accumulated in the reservoir RS can be increased.

Modification Example

Figure 51:
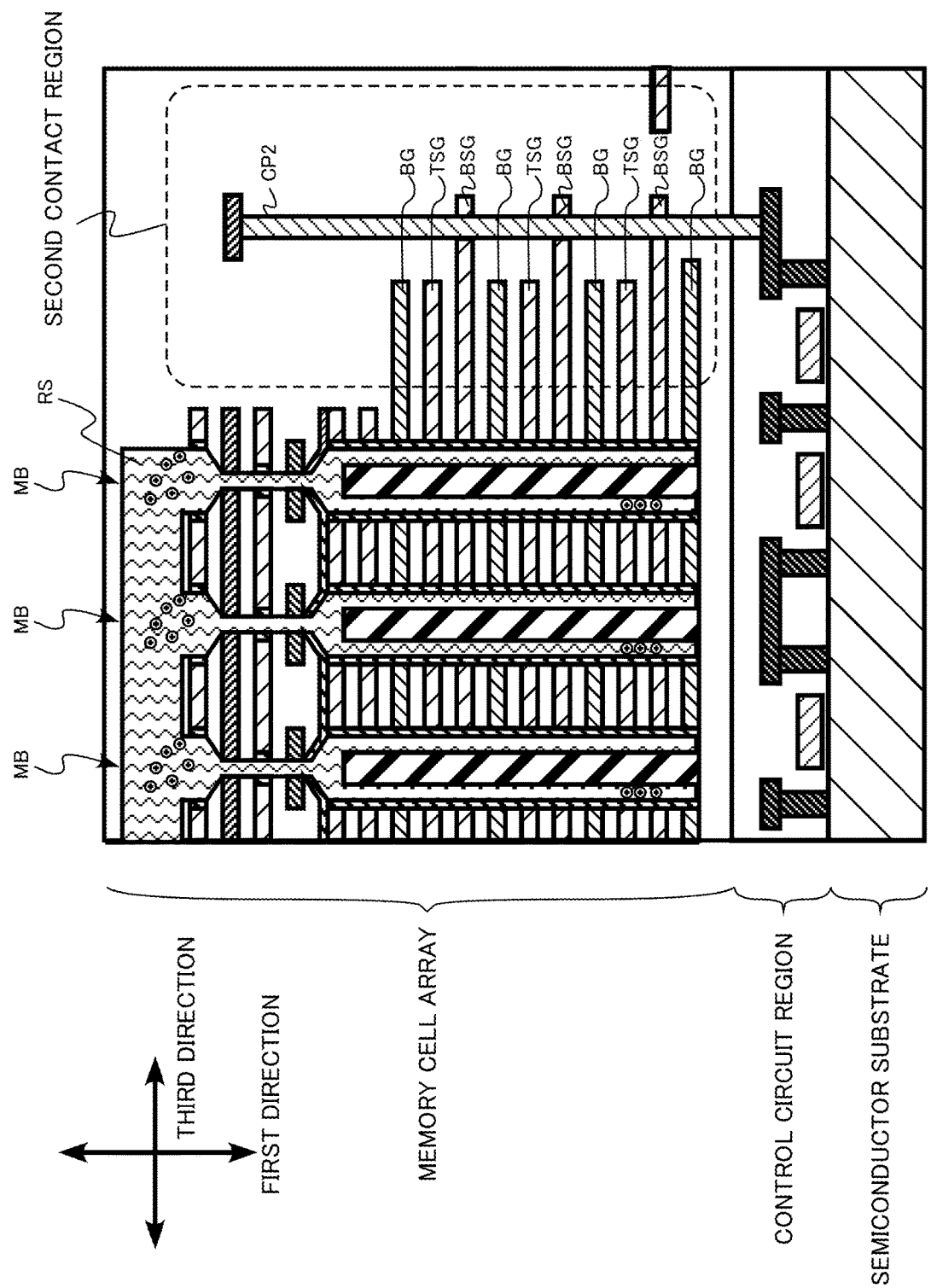
FIG. 51 is a schematic cross-sectional view of a modification example of the memory device according to the first embodiment.

FIG. 51 is a schematic cross-sectional view of a modification example of the memory device according to the first embodiment. FIG. 51 is a cross-sectional view corresponding to FIG. 6. A nonvolatile memory according to the modification example is different from the nonvolatile memory according to the first embodiment in that the reservoir RS is shared among the plurality of memory bottles MB.

As described above, according to the first embodiment and the modification example, it is possible to realize the memory device capable of setting the data stored in the memory cell to be multivalued.

Second Embodiment

A memory device according to a second embodiment includes an insulator extending in a first direction, a fluid layer having a first region extending in the first direction, a second region extending in the first direction, the insulator being provided between the second region and the first region, a third region connecting the first region and the second region, and a fourth region connecting the first region and the second region, the insulator being provided between the fourth region and the third region, a particle in the fluid layer, a first control electrode made of a first material, a first insulating film provided between the first region and the first control electrode, a second control electrode made of a second material and provided so as to be spaced apart from the first control electrode in the first direction, a second insulating film provided between the first region and the second control electrode, a third control electrode made of a third material and provided between the first control electrode and the second control electrode, a third insulating film provided between the first region and the third control electrode, a fourth control electrode made of a fourth material, a fourth insulating film provided between the second region and the fourth control electrode, a fifth control electrode made of a fifth material and provided so as to be spaced apart from the fourth control electrode in the first direction, a fifth insulating film provided between the second region and the fifth control electrode, a sixth control electrode made of a sixth material and provided between the fourth control electrode and the fifth control electrode, and a sixth insulating film provided between the second region and the sixth control electrode.

The memory device according to the second embodiment is a nonvolatile memory in which memory cells are three-dimensionally arranged. In the nonvolatile memory according to the second embodiment, the memory cell stores data by using charged particles in a fluid layer.

The nonvolatile memory according to the second embodiment is different from the nonvolatile memory 100 according to the first embodiment in that non-destructive reading of data stored in the memory cell can be performed. Hereinafter, a part of contents overlapping with the contents of the first embodiment will not be described.

FIGS. 52, 53, 54A, 54B, 54C, and 55 are schematic cross-sectional views of the memory device according to the second embodiment. FIGS. 52, 53, 54A, 54B, 54C, and 55 are schematic cross-sectional views of a memory cell array.

FIGS. 52, 53, 54A, 54B, 54C, and 55 are schematic cross-sectional views including a first memory bottle MB1.

Figure 52:
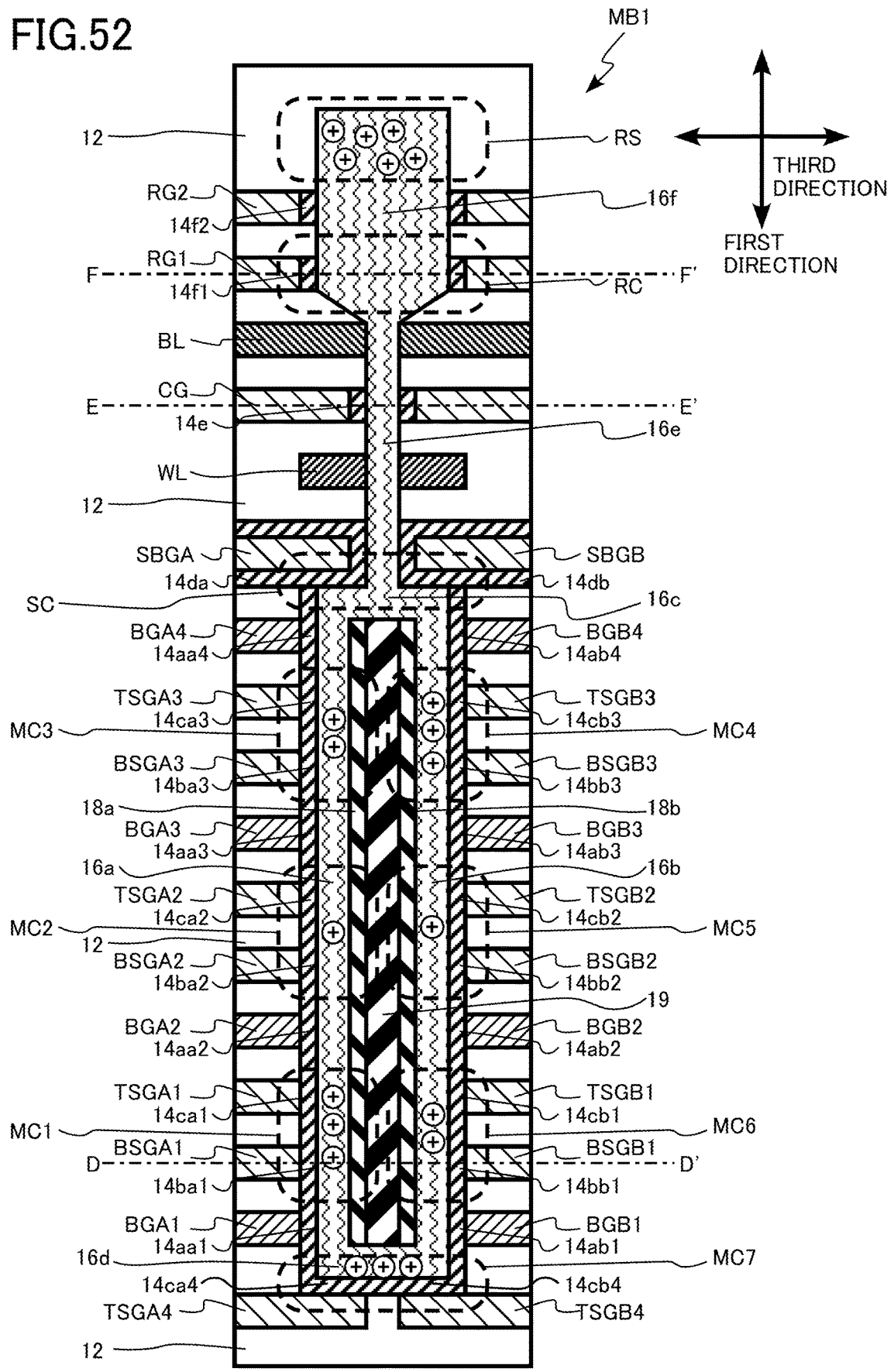
FIG. 52 is a schematic cross-sectional view of a memory device according to a second embodiment.
Figure 53:
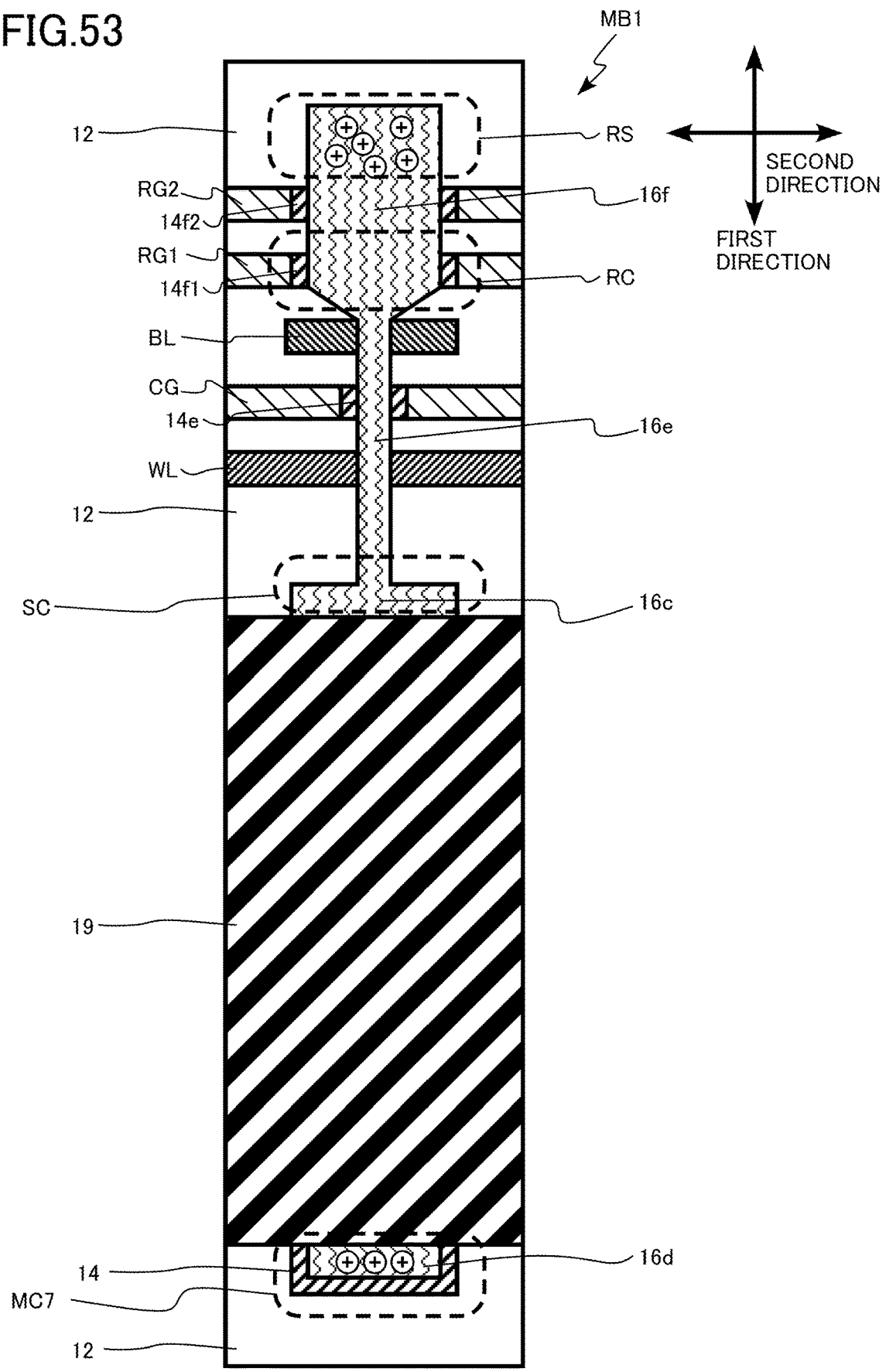
FIG. 53 is a schematic cross-sectional view of the memory device according to the second embodiment.
Figure 54A:
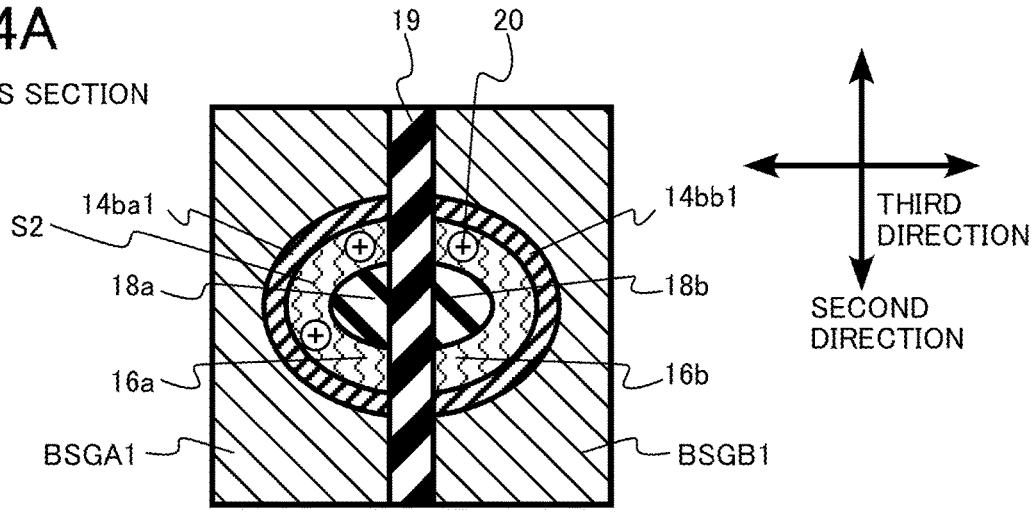
FIGS. 54A, 54B, and 54C are schematic cross-sectional views of the memory device according to the second embodiment.
Figure 54B:
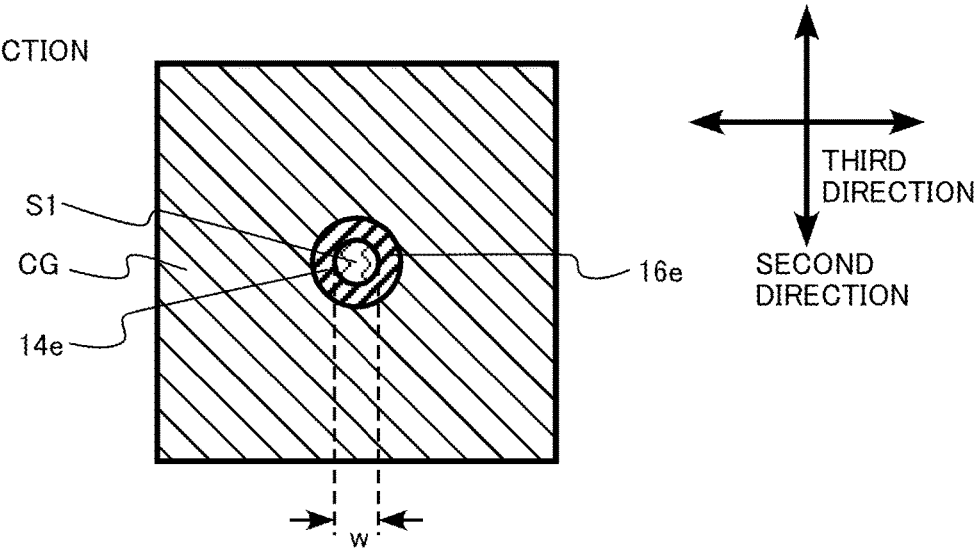
Figure 54C:
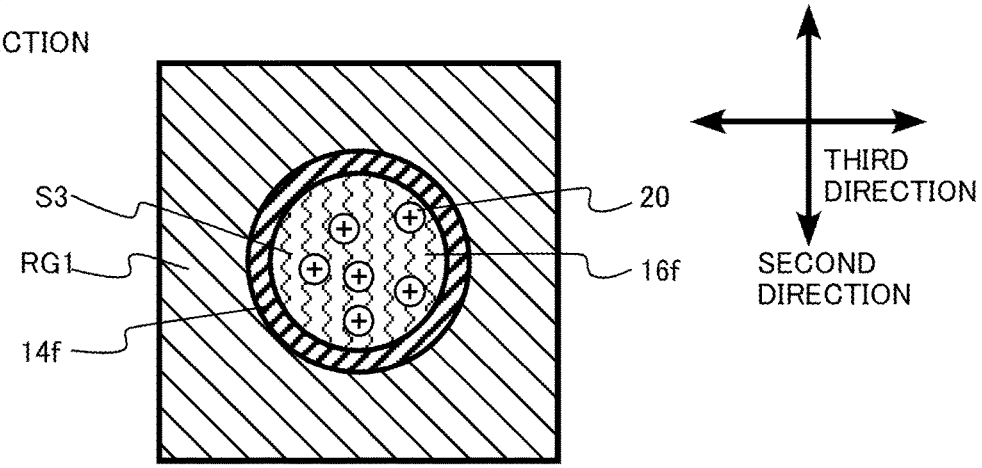
Figure 55:
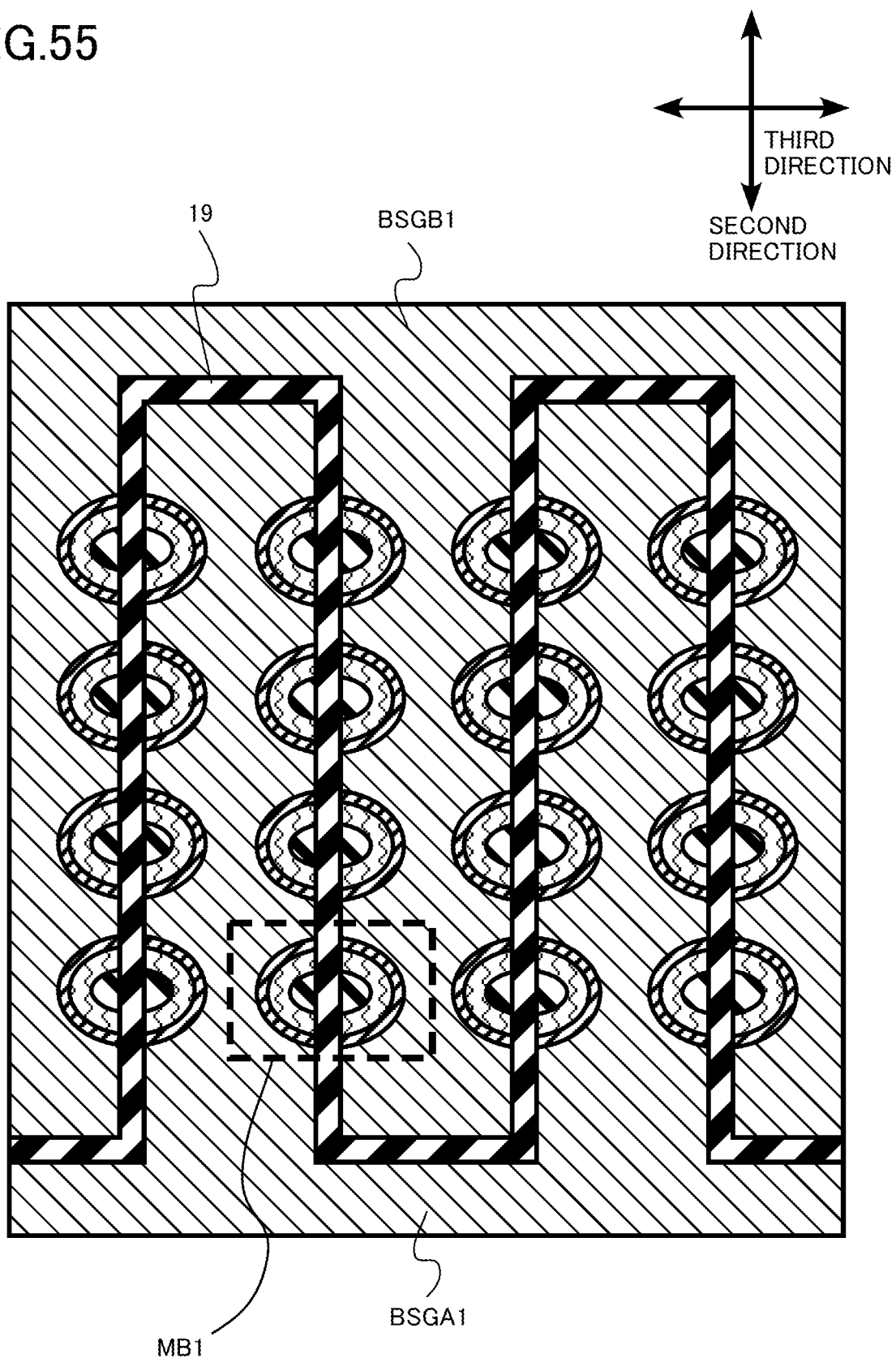
FIG. 55 is a schematic cross-sectional view of the memory device according to the second embodiment.

FIG. 52 is a cross section parallel to the first direction and the third direction. FIG. 53 is a cross section parallel to the first direction and the second direction. FIGS. 54A, 54B, and 54C are cross sections perpendicular to a first direction of the memory cell array. FIG. 54A is a cross section taken along a line DD' of FIG. 52, FIG. 54B is a cross section taken along a line EE' of FIG. 52, and FIG. 54C is a cross section taken along a line FF' of FIG. 52. FIG. 55 is a cross section perpendicular to the first direction of the memory cell array. FIG. 55 is a cross section including the cross section taken along the line DD' of FIG. 52. FIG. 55 illustrates a cross section of a plurality of memory bottles MB.

The memory cell array includes a first left barrier gate electrode BGA1, a second left barrier gate electrode BGA2, a third left barrier gate electrode BGA3, a fourth left barrier gate electrode BGA4, a first right barrier gate electrode BGB1, a second right barrier gate electrode BGB2, a third right barrier gate electrode BGB3, a fourth right barrier gate electrode BGB4, a first left lower storage gate electrode BSGA1, a second left lower storage gate electrode BSGA2, a third left lower storage gate electrode BSGA3, a first right lower storage gate electrode BSGB1, a second right lower storage gate electrode BSGB2, a third right lower storage gate electrode BSGB3, a first left upper storage gate electrode TSGA1, a second left upper storage gate electrode TSGA2, a third left upper storage gate electrode TSGA3, a fourth left upper storage gate electrode TSGA4, a first right upper storage gate electrode TSGB1, a second right upper storage gate electrode TSGB2, a third right upper storage gate electrode TSGB3, a fourth right upper storage gate electrode TSGB4, a left stand-by electrode SBGA, a right stand-by electrode SBGB, a word line WL, a cock gate electrode CG, a bit line BL, a first reservoir gate electrode RG1, and a second reservoir gate electrode RG2.

Hereinafter, the first left barrier gate electrode BGA1, the second left barrier gate electrode BGA2, the third left barrier gate electrode BGA3, and the fourth left barrier gate electrode BGA4 may be individually or collectively referred to as a left barrier gate electrode BGA. The first right barrier gate electrode BGB1, the second right barrier gate electrode BGB2, and the third right barrier gate electrode BGB3 may be individually or collectively referred to as a right barrier gate electrode BGB. The first left lower storage gate electrode BSGA1, the second left lower storage gate electrode BSGA2, and the third left lower storage gate electrode BSGA3 may be individually or collectively referred to as a left lower storage gate electrode BSGA. The first right lower storage gate electrode BSGB1, the second right lower storage gate electrode BSGB2, and the third right lower storage gate electrode BSGB3 may be individually or collectively referred to as a right lower storage gate electrode BSGB. The first left upper storage gate electrode TSGA1, the second left upper storage gate electrode TSGA2, the third left upper storage gate electrode TSGA3, and the fourth left upper storage gate electrode TSGA4 may be individually or collectively referred to as a left upper storage gate electrode TSGA. The first right upper storage gate electrode TSGB1, the second right upper storage gate electrode TSGB2, the third right upper storage gate electrode TSGB3, and the fourth right upper storage gate electrode TSGB4 may be individually or collectively referred to as a right upper storage gate electrode TSGB.

The memory cell array 101 includes interlayer insulating layers 12, a first left barrier gate insulating film 14$aa$1, a second left barrier gate insulating film 14$aa$2, a third left barrier gate insulating film 14$aa$3, a fourth left barrier gate insulating film 14$aa$4, a first right barrier gate insulating film 14$ab$1, a second right barrier gate insulating film 14$ab$2, a third right barrier gate insulating film 14$ab$3, a fourth right barrier gate insulating film 14$ab$4, a first left lower storage gate insulating film 14$ba$1, a second left lower storage gate insulating film 14$ba$2, a third left lower storage gate insulating film 14$ba$3, a first right lower storage gate insulating film 14$bb$1, a second right lower storage gate insulating film 14$bb$2, a third right lower storage gate insulating film 14$bb$3, a first left upper storage gate insulating film 14$ca$1, a second left upper storage gate insulating film 14$ca$2, a third left upper storage gate insulating film 14$ca$3, a fourth left upper storage gate insulating film 14$ca$4, a first right upper storage gate insulating film 14$cb$1, a second right upper storage gate insulating film 14$cb$2, a third right upper storage gate insulating film 14$cb$3, a fourth right upper storage gate insulating film 14$cb$4, a left stand-by gate insulating film 14$da$, a right stand-by gate insulating film 14$db$, a cock gate insulating film 14$e$, a first reservoir gate insulating film 14$f$1, a second reservoir gate insulating film 14$f$2, a fluid layer 16, a first core insulator 18$a$, a second core insulator 18$b$, an isolation insulating layer 19, and charged particles 20. The fluid layer 16 includes a first region 16$a$, a second region 16$b$, a third region 16$c$, a fourth region 16$d$, a fifth region 16$e$, and a sixth region 16$f$.

Hereinafter, the first left barrier gate insulating film 14$aa$1, the second left barrier gate insulating film 14$aa$2, the third left barrier gate insulating film 14$aa$3, the fourth left barrier gate insulating film 14$aa$4, the first right barrier gate insulating film 14$ab$1, the second right barrier gate insulating film 14$ab$2, the third right barrier gate insulating film 14$ab$3, the fourth right barrier gate insulating film 14$ab$4, the first left lower storage gate insulating film 14$ba$1, the second left lower storage gate insulating film 14$ba$2, the third left lower storage gate insulating film 14$ba$3, the first right lower storage gate insulating film 14$bb$1, the second right lower storage gate insulating film 14$bb$2, the third right lower storage gate insulating film 14$bb$3, the first left upper storage gate insulating film 14$ca$1, the second left upper storage gate insulating film 14$ca$2, the third left upper storage gate insulating film 14$ca$3, the fourth left upper storage gate insulating film 14$ca$4, the first right upper storage gate insulating film 14$cb$1, the second right upper storage gate insulating film 14$cb$2, the third right upper storage gate insulating film 14$cb$3, the fourth right upper storage gate insulating film 14$cb$4, the left stand-by gate insulating film 14$da$, the right stand-by gate insulating film 14$db$, the cock gate insulating film 14$e$, the first reservoir gate insulating film 14$f$1, and the second reservoir gate insulating film 14$f$2 may be individually or collectively referred to as a gate insulating film 14.

The memory cell array includes a first memory cell MC1, a second memory cell MC2, a third memory cell MC3, a fourth memory cell MC4, a fifth memory cell MC5, a sixth memory cell MC6, a seventh memory cell MC7, a stand-by cell SC, a reservoir cell RC, and a reservoir RS. Hereinafter, the first memory cell MC1, the second memory cell MC2, the third memory cell MC3, the fourth memory cell MC4, the fifth memory cell MC5, the sixth memory cell MC6, and the seventh memory cell MC7 may be individually or collectively referred to as a memory cell MC. The number of memory cells MC included in one memory bottle MB is not limited to seven.

The first left barrier gate electrode BGA1 is an example of a first control electrode. The second left barrier gate electrode BGA2 is an example of a second control electrode. The first left lower storage gate electrode BSGA1 is an example of a third control electrode. The first right barrier gate electrode BGB1 is an example of a fourth control electrode. The second right barrier gate electrode BGB2 is an example of a fifth control electrode. The first right lower storage gate electrode BSGB1 is an example of a sixth control electrode. The first left upper storage gate electrode TSGA1 is an example of a seventh control electrode. The first right upper storage gate electrode TSGB1 is an example of an eighth control electrode. The cock gate electrode CG is an example of a ninth control electrode. The left stand-by electrode SBGA is an example of a tenth control electrode. The right stand-by electrode SBGB is an example of an eleventh control electrode. The second reservoir gate electrode RG2 is an example of a twelfth control electrode. The first reservoir gate electrode RG1 is an example of a thirteenth control electrode. The fourth left upper storage gate electrode TSGA4 is an example of a fourteenth control electrode. The fourth right upper storage gate electrode TSGB4 is an example of a fifteenth control electrode.

The word line WL is an example of a first conductive layer. The bit line BL is an example of a second conductive layer.

The first core insulator 18a or the second core insulator 18b is an example of an insulator. The charged particles 20 are an example of particles.

The first left barrier gate insulating film 14aa1 is an example of a first insulating film. The second left barrier gate insulating film 14aa2 is an example of a second insulating film. The first left lower storage gate insulating film 14ba1 is an example of a third insulating film. The first right barrier gate insulating film 14ab1 is an example of a fourth insulating film. The second right barrier gate insulating film 14ab2 is an example of a fifth insulating film. The first right lower storage gate insulating film 14bb1 is an example of a sixth insulating film. The first left upper storage gate insulating film 14ca1 is an example of a seventh insulating film. The first right upper storage gate insulating film 14cb1 is an example of an eighth insulating film. The cock gate insulating film 14e is an example of a ninth insulating film. The left stand-by gate insulating film 14da is an example of a tenth insulating film. The right stand-by gate insulating film 14db is an example of an eleventh insulating film. The second reservoir gate insulating film 14f2 is an example of a twelfth insulating film. The first reservoir gate insulating film 14f1 is an example of a thirteenth insulating film. The fourth left upper storage gate insulating film 14ca4 is an example of a fourteenth insulating film. The fourth right upper storage gate insulating film 14cb4 is an example of a fifteenth insulating film.

The first core insulator 18a and the second core insulator 18b extend in the first direction. The first core insulator 18a and the second core insulator 18b are surrounded by the fluid layer 16.

The first core insulator 18a and the second core insulator 18b are, for example, an oxide, an oxynitride, or a nitride.

The isolation insulating layer 19 is provided between the first core insulator 18a and the second core insulator 18b. The isolation insulating layer 19 isolates the left barrier gate electrode BGA and the right barrier gate electrode BGB. The isolation insulating layer 19 isolates the left lower storage gate electrode BSGA and the right lower storage gate electrode BSGB. The isolation insulating layer 19 isolates the left upper storage gate electrode TSGA and the right upper storage gate electrode TSGB, but does not isolate the fourth left upper storage gate electrode TSGA4 and the fourth right upper storage gate electrode TSGB4.

The fluid layer 16 includes a first region 16a, a second region 16b, a third region 16c, a fourth region 16d, a fifth region 16e, and a sixth region 16f.

The first region 16a and the second region 16b extend, for example, in the first direction. The first core insulator 18a, the second core insulator 18b, and the isolation insulating layer 19 are provided between the first region 16a and the second region 16b.

The third region 16c and the fourth region 16d extend in a third direction perpendicular to the first direction. For example, the first core insulator 18a, the second core insulator 18b, and the isolation insulating layer 19 are provided between the third region 16c and the fourth region 16d. The third region 16c connects the first region 16a and the second region 16b. The fourth region 16d connects the first region 16a and the second region 16b.

An annular structure is formed by the first region 16a, the third region 16c, the second region 16b, and the fourth region 16d.

The fifth region 16e extends in the first direction. fifth region 16e is provided in the first direction of the third region 16c. The fifth region 16e is connected to the third region 16c. The third region 16c is provided between the first core insulator 18a, the second core insulator 18b, and the isolation insulating layer 19, and the fifth region 16e.

The fifth region 16e is surrounded by the cock gate electrode CG. The fifth region 16e is surrounded by, for example, the word line WL. The fifth region 16e is surrounded by, for example, the bit line BL.

The fifth region 16e is in contact with the word line WL. The fifth region 16e is in contact with the bit line BL.

The sixth region 16f extends in the first direction. The sixth region 16f is provided in the first direction of the fifth region 16e. The sixth region 16f is connected to the fifth region 16e. The fifth region 16e is provided between the sixth region 16f and the third region 16c.

The sixth region 16f is surrounded by the first reservoir gate electrode RG1 and the second reservoir gate electrode RG2.

The fluid layer 16 is surrounded by the interlayer insulating layers 12. The fluid layer 16 is in contact with, for example, the interlayer insulating layer 12 and the gate insulating film 14.

The fluid layer 16 surrounds the first core insulator 18a and the second core insulator 18b.

The fluid layer 16 has a function of causing a current to flow between the word line WL and the bit line BL.

The fluid layer 16 contains a liquid. A melting point of the liquid contained in the fluid layer 16 is, for example, equal to or more than minus 100° C. and equal to or less than 0° C. A boiling point of the liquid contained in the fluid layer 16 is, for example, equal to or more than 400° C. and equal to or less than 2000° C.

The fluid layer 16 contains, for example, charges. The liquid contained in the fluid layer 16 is, for example, an ionic liquid or an electrolytic solution. The liquid contained in the fluid layer 16 contains, for example, ions.

The charged particles 20 are contained in the fluid layer 16. The charged particles 20 are particles with charges. The charged particles 20 are an example of particles. The memory cell MC stores data by using the charged particles 20.

Hereinafter, although a case where the charged particles 20 have positive charges will be described as an example, the charged particles 20 may have negative charges.

The charged particles 20 are, for example, spherical. A particle size of the charged particle 20 is, for example, equal to or more than 1 nm and equal to or less than 10 nm.

The charged particles 20 are, for example, metal nanoparticles, dielectric nanoparticles, colloidal particles, or molecules.

The plurality of left barrier gate electrodes BGA is stacked in the first direction. The second left barrier gate electrode BGA2 is provided to be spaced apart from the first left barrier gate electrode BGA1 in the first direction. The third left barrier gate electrode BGA3 is provided to be spaced apart from the second left barrier gate electrode BGA2 in the first direction.

The left barrier gate electrode BGA is provided to face the first region 16a of the fluid layer 16. Similarly to the left lower storage gate electrode BSGA illustrated in FIG. 55, the left barrier gate electrode BGA is, for example, a comb-shaped conductor. The left barrier gate electrode BGA has a function of retaining the charged particles 20 in the memory cell MC. The left barrier gate electrode BGA has a function of moving the charged particles 20 by changing the electrostatic potential of the fluid layer 16.

The first left barrier gate electrode BGA1 is made of a first material. The first material has a first work function. The second left barrier gate electrode BGA2 is made of a second material. The second material has a second work function.

The first material and the second material are, for example, a metal, a metal nitride, a metal carbide, or a semiconductor. The first material and the second material are, for example, n-type polycrystalline silicon. The first material and the second material are, for example, polycrystalline silicon containing phosphorus (P) or arsenic (As) as n-type impurities.

The first material and the second material are, for example, the same. The first work function and the second work function are, for example, the same.

The third left barrier gate electrode BGA3 and the fourth left barrier gate electrode BGA4 are made of, for example, the first material or the second material.

A thickness of the left barrier gate electrode BGA in the first direction is, for example, equal to or more than 10 nm and equal to or less than 50 nm.

The plurality of left lower storage gate electrodes BSGA is stacked in the first direction. The left lower storage gate electrode BSGA is provided between the two left barrier gate electrodes BGA. The first left lower storage gate electrode BSGA1 is provided between the first left barrier gate electrode BGA1 and the second left barrier gate electrode BGA2.

The left lower storage gate electrode BSGA and the left barrier gate electrode BGA are spaced apart from each other. The left lower storage gate electrode BSGA and the left barrier gate electrode BGA are electrically isolated from each other.

The left lower storage gate electrode BSGA is provided to face the first region 16a of the fluid layer 16. The left lower storage gate electrode BSGA is, for example, a comb-shaped conductor as illustrated in FIG. 55. The left lower storage gate electrode BSGA has a function of moving the charged particles 20 by changing the electrostatic potential of the fluid layer 16.

The first left lower storage gate electrode BSGA1 is made of a third material. The third material has a third work function.

The third material is different from the first material and the second material. A chemical composition of the third material is different from chemical compositions of the first material and the second material.

The third work function is different from the first work function and the second work function. The third work function is larger than, for example, the first work function and the second work function.

A difference between the third work function and the first work function is, for example, equal to or more than 0.5 eV. A difference between the third work function and the second work function is, for example, equal to or more than 0.5 eV.

The third material is, for example, a metal, a metal nitride, a metal carbide, or a semiconductor. The third material is, for example, p-type polycrystalline silicon. The third material is, for example, polycrystalline silicon containing boron (B) as a p-type impurity.

The second left lower storage gate electrode BSGA2 and the third left lower storage gate electrode BSGA3 are made of, for example, the third material.

A thickness of the left lower storage gate electrode BSGA in the first direction is, for example, equal to or more than 10 nm and equal to or less than 50 nm.

The plurality of left upper storage gate electrodes TSGA is stacked in the first direction. The first, second, and third left upper storage gate electrodes TSGA are provided between the left lower storage gate electrode BSGA and the left barrier gate electrode BGA. The first left upper storage gate electrode TSGA1 is provided between the second left barrier gate electrode BGA2 and the first left lower storage gate electrode BSGA1.

The first, second, and third left upper storage gate electrodes TSGA are provided to face the first region 16a of the fluid layer 16. Similarly to the left lower storage gate electrode BSGA illustrated in FIG. 55, the left upper storage gate electrode TSGA is, for example, a comb-shaped conductor. The left upper storage gate electrode TSGA has a function of moving the charged particles 20 by changing the electrostatic potential of the fluid layer 16. The fourth left upper storage gate electrode TSGA 4 is provided to face the fourth region 16d of the fluid layer 16.

The left upper storage gate electrode TSGA is spaced apart from the left lower storage gate electrode BSGA and the left barrier gate electrode BGA. The left upper storage gate electrode TSGA is electrically isolated from the left lower storage gate electrode BSGA and the left barrier gate electrode BGA.

The first left upper storage gate electrode TSGA1 is made of a seventh material. The seventh material has a seventh work function.

The seventh material is different from the first material and the second material. The seventh material is, for example, the same as the third material.

A chemical composition of the seventh material is different from the chemical compositions of the first material and the second material. The chemical composition of the seventh material and the chemical composition of the third material are, for example, the same.

The seventh work function is different from the first work function and the second work function. In the seventh work function, for example, the seventh work function and the third work function larger than the first work function and the second work function are, for example, the same.

A difference between the seventh work function and the first work function is, for example, equal to or more than 0.5 eV. A difference between the seventh work function and the second work function is, for example, equal to or more than 0.5 eV.

The seventh material is, for example, a metal, a metal nitride, a metal carbide, or a semiconductor. The seventh material is, for example, p-type polycrystalline silicon. The third material is, for example, polycrystalline silicon containing boron (B) as a p-type impurity.

The second left upper storage gate electrode TSGA2, the third left upper storage gate electrode TSGA3, and the fourth left upper storage gate electrode TSGA4 are made of, for example, the seventh material.

A thickness of the left upper storage gate electrode TSGA in the first direction is, for example, equal to or more than 10 nm and equal to or less than 50 nm.

The plurality of right barrier gate electrodes BGB is stacked in the first direction. The fluid layer 16, the first core insulator 18a, the second core insulator 18b, and the isolation insulating layer 19 are provided between the right barrier gate electrode BGB and the left barrier gate electrode BGA.

The right barrier gate electrode BGB and the left barrier gate electrode BGA are spaced apart from each other. The right barrier gate electrode BGB and the left barrier gate electrode BGA are electrically isolated from each other.

The second right barrier gate electrode BGB2 is provided spaced apart from the first right barrier gate electrode BGB1 in the first direction. The third right barrier gate electrode BGB3 is provided spaced apart from the second right barrier gate electrode BGB2 in the first direction.

The right barrier gate electrode BGB is provided to face the second region 16b of the fluid layer 16. Similarly to the right lower storage gate electrode BSGB illustrated in FIG. 55, the right barrier gate electrode BGB is, for example, a comb-shaped conductor. The right barrier gate electrode BGB has a function of retaining the charged particles 20 in the memory cell MC. The right barrier gate electrode BGB has a function of moving the charged particles 20 by changing the electrostatic potential of the fluid layer 16.

The first right barrier gate electrode BGB1 is made of a fourth material. The fourth material has a fourth work function. The second right barrier gate electrode BGB2 is made of a fifth material. The fifth material has a fifth work function.

The fourth material and the fifth material are, for example, a metal, a metal nitride, a metal carbide, or a semiconductor. The fourth material and the fifth material are, for example, n-type polycrystalline silicon. The fourth material and the fifth material are, for example, polycrystalline silicon containing phosphorus (P) or arsenic (As) as n-type impurities.

The fourth material and the fifth material are, for example, the same. The fourth work function and the fifth work function are, for example, the same.

The third right barrier gate electrode BGB3 and the fourth right barrier gate electrode BGB4 are made of, for example, the fourth material or the fifth material.

A thickness of the right barrier gate electrode BGB in the first direction is, for example, equal to or more than 10 nm and equal to or less than 50 nm.

The plurality of right lower storage gate electrodes BSGB is stacked in the first direction. The fluid layer 16, the first core insulator 18a, the second core insulator 18b, and the isolation insulating layer 19 are provided between the right lower storage gate electrode BSGB and the left lower storage gate electrode BSGA.

The right lower storage gate electrode BSGB and the left lower storage gate electrode BSGA are spaced apart from each other. The right lower storage gate electrode BSGB and the left lower storage gate electrode BSGA are electrically isolated from each other.

The right lower storage gate electrode BSGB is provided between the two right barrier gate electrodes BGB. The right lower storage gate electrode BSGB is, for example, a comb-shaped conductor as illustrated in FIG. 55. The first right lower storage gate electrode BSGB1 is provided between the first right barrier gate electrode BGB1 and the second right barrier gate electrode BGB2.

The right lower storage gate electrode BSGB and the right barrier gate electrode BGB are spaced apart from each other. The right lower storage gate electrode BSGB and the right barrier gate electrode BGB are electrically isolated from each other.

The right lower storage gate electrode BSGB is provided to face the second region 16b of the fluid layer 16. The right lower storage gate electrode BSGB has a function of moving the charged particles 20 by changing the electrostatic potential of the fluid layer 16.

The first right lower storage gate electrode BSGB1 is made of a sixth material. The sixth material has a sixth work function.

The sixth material is different from the fourth material and the fifth material. A chemical composition of the sixth material is different from the chemical compositions of the fourth material and the fifth material.

The sixth work function is different from the fourth work function and the fifth work function. The sixth work function is larger than, for example, the fourth work function and the fifth work function.

A difference between the sixth work function and the fourth work function is, for example, equal to or more than 0.5 eV. A difference between the sixth work function and the fourth work function is, for example, equal to or more than 0.5 eV.

The sixth material is, for example, a metal, a metal nitride, a metal carbide, or a semiconductor. The sixth material is, for example, p-type polycrystalline silicon. The sixth material is, for example, polycrystalline silicon containing boron (B) as a p-type impurity.

The second right lower storage gate electrode BSGB2 and the third right lower storage gate electrode BSGB3 are made of, for example, the sixth material.

A thickness of the right lower storage gate electrode BSGB in the first direction is, for example, equal to or more than 10 nm and equal to or less than 50 nm.

The plurality of right upper storage gate electrodes TSGB is stacked in the first direction. The fluid layer 16, the first core insulator 18a, the second core insulator 18b, and the isolation insulating layer 19 are provided between the right upper storage gate electrode TSGB and the left upper storage gate electrode TSGA.

The right upper storage gate electrode TSGB and the left upper storage gate electrode TSGA are spaced apart from each other. The right upper storage gate electrode TSGB and the left upper storage gate electrode TSGA are electrically isolated from each other.

The first, second, and third right upper storage gate electrodes TSGB are provided between the right lower storage gate electrode BSGB and the right barrier gate electrode BGB. The first right upper storage gate electrode TSGB1 is provided between the second right barrier gate electrode BGB2 and the first right lower storage gate electrode BSGB1.

The first, second, and third right upper storage gate electrodes TSGB are provided to face the second region 16b of the fluid layer 16. Similarly to the right lower storage gate electrode BSGB illustrated in FIG. 55, for example, the right upper storage gate electrode TSGB is a comb-shaped conductor. The right upper storage gate electrode TSGB has a function of moving the charged particles 20 by changing the electrostatic potential of the fluid layer 16. The fourth right upper storage gate electrode TSGB4 is provided to face the fourth region 16d of the fluid layer 16.

The right upper storage gate electrode TSGB is spaced apart from the right lower storage gate electrode BSGB and the right barrier gate electrode BGB. The right upper storage gate electrode TSGB is electrically isolated from the right lower storage gate electrode BSGB and the right barrier gate electrode BGB.

The first right upper storage gate electrode TSGB1 is made of an eighth material. The eighth material has an eighth work function.

The eighth material is different from the fourth material and the fifth material. The eighth material is, for example, the same as the sixth material.

A chemical composition of the eighth material is different from the chemical compositions of the fourth material and the fifth material. The chemical composition of the eighth material and the chemical composition of the sixth material are, for example, the same.

The eighth work function is different from the fourth work function and the fifth work function. In the eighth work function, for example, the eighth work function and the sixth work function larger than the fourth work function and the fifth work function are, for example, the same.

A difference between the eighth work function and the fourth work function is, for example, equal to or more than 0.5 eV. A difference between the eighth work function and the fifth work function is, for example, equal to or more than 0.5 eV.

The eighth material is, for example, a metal, a metal nitride, a metal carbide, or a semiconductor. The eighth material is, for example, p-type polycrystalline silicon. The eighth material is, for example, polycrystalline silicon containing boron (B) as a p-type impurity.

The second right upper storage gate electrode TSGB2, the third right upper storage gate electrode TSGB3, and the fourth right upper storage gate electrode TSGB4 are made of, for example, the eighth material.

A thickness of the right upper storage gate electrode TSGB in the first direction is, for example, equal to or more than 10 nm and equal to or less than 50 nm.

The left stand-by electrode SBGA is provided to be spaced apart from the fourth left barrier gate electrode BGA4 in the first direction. The left stand-by electrode SBGA is provided between the fourth left barrier gate electrode BGA4 and the word line WL.

The left stand-by electrode SBGA is provided to face the third region 16c and the fifth region 16e of the fluid layer 16. The left stand-by electrode SBGA has a function of moving the charged particles 20 by changing an electrostatic potential of the fluid layer 16.

The left stand-by electrode SBGA is made of a tenth material. The tenth material has a tenth work function.

The tenth material is different from the first material and the second material. The tenth material is, for example, the same as the third material.

The tenth work function is different from the first work function and the second work function. In the tenth work function, for example, the tenth work function and a third work function larger than the first work function and the second work function are, for example, the same.

A difference between the tenth work function and the first work function is, for example, equal to or more than 0.5 eV.

A difference between the tenth work function and the second work function is, for example, equal to or more than 0.5 eV.

The tenth material is, for example, a metal, a metal nitride, a metal carbide, or a semiconductor. The tenth material is, for example, p-type polycrystalline silicon. The tenth material is, for example, polycrystalline silicon containing boron (B) as a p-type impurity.

A thickness of the left stand-by electrode SBGA in the first direction is, for example, equal to or more than 10 nm and equal to or less than 50 nm.

The right stand-by electrode SBGB is provided to be spaced apart from the left stand-by electrode SBGA in the third direction. The fifth region 16e of the fluid layer 16 is provided between the right stand-by electrode SBGB and the left stand-by electrode SBGA. The right stand-by electrode SBGB and the left stand-by electrode SBGA are electrically isolated from each other.

The right stand-by electrode SBGB is provided to face the third region 16c and the fifth region 16e of the fluid layer 16. The right stand-by electrode SBGB has a function of moving the charged particles 20 by changing the electrostatic potential of the fluid layer 16.

The right stand-by electrode SBGB is made of an eleventh material. The eleventh material has an eleventh work function.

The eleventh material is different from the fourth material and the fifth material. The eleventh material is, for example, the same as the sixth material.

A chemical composition of the eleventh material is different from the chemical compositions of the fourth material and the fifth material. The chemical composition of the eleventh material and the chemical composition of the sixth material are, for example, the same.

The eleventh work function is different from the fourth work function and the fifth work function. In the eleventh work function, for example, the eleventh work function and the sixth work function larger than the fourth work function and the fifth work function are, for example, the same.

The eleventh material is, for example, a metal, a metal nitride, a metal carbide, or a semiconductor. The eleventh material is, for example, p-type polycrystalline silicon. The eleventh material is, for example, polycrystalline silicon containing boron (B) as a p-type impurity.

A thickness of the right stand-by electrode SBGB in the first direction is, for example, equal to or more than 10 nm and equal to or less than 50 nm.

The word line WL is provided, for example, between the left stand-by electrode SBGA and the cock gate electrode CG. The word line WL is provided, for example, between the right stand-by electrode SBGB and the cock gate electrode CG. The word line WL is provided to be spaced apart from the second left barrier gate electrode BGA2 in the first direction. The word line WL is provided to be spaced apart from the second right barrier gate electrode BGB2 in the first direction. The word line WL extends in a second direction intersecting the first direction. The second direction is, for example, perpendicular to the first direction.

The word line WL surrounds, for example, the fifth region 16e of the fluid layer 16. The word line WL is electrically connected to the fluid layer 16. The word line WL is in contact with the fluid layer 16.

The word line WL is, for example, a linear conductor. The word line WL includes, for example, a metal, a metal nitride, a metal carbide, or a semiconductor. The word line WL includes, for example, tungsten (W).

A thickness of the word line WL in the first direction is, for example, equal to or more than 10 nm and equal to or less than 50 nm.

The cock gate electrode CG is provided between the word line WL and the bit line BL. The cock gate electrode CG is, for example, a plate-like conductor. The cock gate electrode CG surrounds the fifth region 16e of the fluid layer 16. The cock gate electrode CG has a function of controlling the movement of the charged particles 20 by changing the electrostatic potential of the fluid layer 16.

The cock gate electrode CG functions as a gate electrode of a cock transistor. The cock transistor includes the cock gate electrode CG, the cock gate insulating film 14e, and the fifth region 16e of the fluid layer 16. The fifth region 16e of the fluid layer 16 is a channel region of the cock transistor.

The cock gate electrode CG includes, for example, a metal, a metal nitride, a metal carbide, or a semiconductor. The cock gate electrode CG contains, for example, tungsten (W). The cock gate electrode CG is, for example, p-type polycrystalline silicon.

A thickness of the cock gate electrode CG in the first direction is, for example, equal to or more than 10 nm and equal to or less than 50 nm.

The bit line BL is provided to be spaced apart from the word line WL in the first direction. The bit line BL is provided, for example, between the cock gate electrode CG and the first reservoir gate electrode RG1. The bit line BL extends in the third direction intersecting the first direction and the second direction. The first direction and the third direction, and the second direction and the third direction are, for example, perpendicular.

The bit line BL surrounds, for example, the fifth region 16e of the fluid layer 16. The bit line BL is electrically connected to the fluid layer 16. The bit line BL is in contact with the fluid layer 16.

The bit line BL is, for example, a linear conductor. The bit line BL includes, for example, a metal, a metal nitride, a metal carbide, or a semiconductor. The bit line BL includes, for example, tungsten (W).

A thickness of the bit line BL in the first direction is, for example, equal to or more than 10 nm and equal to or less than 50 nm.

The first reservoir gate electrode RG1 is provided to be spaced apart from the bit line BL in the first direction. The bit line BL is provided between the first reservoir gate electrode RG1 and the cock gate electrode CG.

The first reservoir gate electrode RG1 is, for example, a plate-like conductor. The first reservoir gate electrode RG1 surrounds the sixth region 16f of the fluid layer 16. The first reservoir gate electrode RG1 has a function of moving and retaining the charged particles 20 by changing the electrostatic potential of the fluid layer 16.

The second reservoir gate electrode RG2 is provided to be spaced apart from the first reservoir gate electrode RG1 in the first direction. The first reservoir gate electrode RG1 is provided between the second reservoir gate electrode RG2 and the bit line BL.

The second reservoir gate electrode RG2 is, for example, a plate-like conductor. The second reservoir gate electrode RG2 surrounds the sixth region 16f of the fluid layer 16. The second reservoir gate electrode RG2 has a function of moving and retaining the charged particles 20 by changing the electrostatic potential of the fluid layer 16.

The first reservoir gate electrode RG1 and the second reservoir gate electrode RG2 contain, for example, a metal, a metal nitride, a metal carbide, or a semiconductor. The reservoir gate electrode RG contains, for example, tungsten (W). The reservoir gate electrode RG is, for example, p-type polycrystalline silicon.

Thicknesses of the first reservoir gate electrode RG1 and the second reservoir gate electrode RG2 in the first direction are, for example, equal to or more than 10 nm and equal to or less than 50 nm.

The gate insulating film 14 is provided between the left barrier gate electrode BGA and the fluid layer 16. The gate insulating film 14 is provided between the right barrier gate electrode BGB and the fluid layer 16. The gate insulating film 14 is provided between the left lower storage gate electrode BSGA and the fluid layer 16. The gate insulating film 14 is provided between the right lower storage gate electrode BSGB and the fluid layer 16. The gate insulating film 14 is provided between the left upper storage gate electrode TSGA and the fluid layer 16. The gate insulating film 14 is provided between the right upper storage gate electrode TSGB and the fluid layer 16. The gate insulating film 14 is provided, for example, between the interlayer insulating layer 12 and the fluid layer 16.

The gate insulating film 14 is in contact with the fluid layer 16, for example.

The first left barrier gate insulating film 14aa1 is provided between the first region 16a and the first left barrier gate electrode BGA1. The second left barrier gate insulating film 14aa2 is provided between the first region 16a and the second left barrier gate electrode BGA2. The first left lower storage gate insulating film 14ba1 is provided between the first region 16a and the first left lower storage gate electrode BSGA1. The first right barrier gate insulating film 14ab1 is provided between the second region 16b and the first right barrier gate electrode BGB1. The second right barrier gate insulating film 14ab2 is provided between the second region 16b and the second right barrier gate electrode BGB2. The first right lower storage gate insulating film 14bb1 is provided between the second region 16b and the first right lower storage gate electrode BSGB1. The first left upper storage gate insulating film 14ca1 is provided between the first region 16a and the first left upper storage gate electrode TSGA1. The first right upper storage gate insulating film 14cb1 is provided between the second region 16b and the first right upper storage gate electrode TSGB1.

The cock gate insulating film 14e is provided between the fifth region 16e and the cock gate electrode CG. The left stand-by gate insulating film 14da is provided between the third region 16c and the left stand-by electrode SBGA. The right stand-by gate insulating film 14db is provided between the third region 16c and the right stand-by electrode SBGB. The first reservoir gate insulating film 14f1 is provided between the sixth region 16f and the first reservoir gate electrode RG1. The second reservoir gate insulating film 14f2 is provided between the sixth region 16f and the second reservoir gate electrode RG2.

The gate insulating film 14 is, for example, an oxide, a nitride, or an oxynitride. The gate insulating film 14 is, for example, a stacked film of materials selected from an oxide, a nitride, and an oxynitride. The gate insulating film 14 is, for example, an aluminum oxide, a hafnium oxide, or a silicon oxide. The gate insulating film 14 is, for example, a stacked film of materials selected from an aluminum oxide, a hafnium oxide, and a silicon oxide.

A thickness of the gate insulating film 14 in the second direction and the third direction is, for example, equal to or more than 1 nm and equal to or less than 10 nm.

The interlayer insulating layer 12 is provided between the left barrier gate electrode BGA and the left lower storage gate electrode BSGA. The interlayer insulating layer 12 is provided between the right barrier gate electrode BGB and the right lower storage gate electrode BSGB. The interlayer insulating layer 12 is provided between the left lower storage gate electrode BSGA and the left upper storage gate electrode TSGA. The interlayer insulating layer 12 is provided between the right lower storage gate electrode BSGB and the right upper storage gate electrode TSGB. The interlayer insulating layer 12 is provided between the left upper storage gate electrode TSGA and the left barrier gate electrode BGA. The interlayer insulating layer 12 is provided between the right upper storage gate electrode TSGB and the right barrier gate electrode BGB. The interlayer insulating layer 12 is provided between the left barrier gate electrode BGA and the left stand-by electrode SBGA. The interlayer insulating layer 12 is provided between the right barrier gate electrode BGB and the right stand-by electrode SBGB.

The interlayer insulating layer 12 is provided between the word line WL and the left stand-by electrode SBGA and the right stand-by electrode SBGB. The interlayer insulating layer 12 is provided between the word line WL and the cock gate electrode CG. The interlayer insulating layer 12 is provided between the cock gate electrode CG and the bit line BL. The interlayer insulating layer 12 is provided between the bit line BL and the first reservoir gate electrode RG1. The interlayer insulating layer 12 is provided between the first reservoir gate electrode RG1 and the second reservoir gate electrode RG2.

The interlayer insulating layer 12 surrounds the fluid layer 16.

The interlayer insulating layer 12 is, for example, an oxide, an oxynitride, or a nitride. The interlayer insulating layer 12 is, for example, a silicon oxide.

A region sandwiched between the two left barrier gate electrodes BGA is the memory cell MC. A region sandwiched between the two right barrier gate electrodes BGB is the memory cell MC. The memory cell MC has a function of storing data by retaining the charged particles 20.

For example, a region sandwiched between the first left barrier gate electrode BGA1 and the second left barrier gate electrode BGA2 is the first memory cell MC1. For example, a region sandwiched between the second left barrier gate electrode BGA2 and the third left barrier gate electrode BGA3 is the second memory cell MC2. For example, a region sandwiched between the third left barrier gate electrode BGA3 and the fourth left barrier gate electrode BGA4 is the third memory cell MC3. For example, a region sandwiched between the fourth right barrier gate electrode BGB4 and the third right barrier gate electrode BGB3 is the fourth memory cell MC4. For example, a region sandwiched between the third right barrier gate electrode BGB3 and the second right barrier gate electrode BGB2 is the fifth memory cell MC5. For example, a region sandwiched between the second right barrier gate electrode BGB2 and the first right barrier gate electrode BGB1 is the sixth memory cell MC6. For example, a region sandwiched between the first right barrier gate electrode BGB1 and the fourth right upper storage gate electrode TSGB4 and a region sandwiched between the first left barrier gate electrode and the fourth left upper storage gate electrode TSGA4 are the seventh memory cell MC7.

A region sandwiched between the fourth left barrier gate electrode BGA4 and the left stand-by electrode SBGA and a region sandwiched between the right stand-by electrode SBGB and the fourth right barrier gate electrode BGB4 is the stand-by cells SC. The stand-by cell SC has a function of temporarily retaining the charged particles 20 moved from the memory cell MC when data is read from the memory cell MC. The stand-by cell has a function of temporarily retaining the charged particles 20 moving to the memory cell MC when data is written to the memory cell MC.

A region between the bit line BL and the second reservoir gate electrode RG2 is the reservoir cell RC. The reservoir cell RC has a function of temporarily storing read data when data is read from the memory cell MC. Data rewriting is performed to the memory cell MC by using the data temporarily stored in the reservoir cell RC.

A region of the second reservoir gate electrode RG2 opposite to the first reservoir gate electrode RG1 is the reservoir RS. The reservoir RS has a function of storing the charged particles 20 for retaining in the memory cell MC.

As illustrated in FIG. 54B, a cross-sectional area of the fifth region 16e of the fluid layer 16 in a first cross section perpendicular to the first direction and including the cock gate electrode CG is defined as a first cross-sectional area S1. As illustrated in FIG. 54A, a cross-sectional area of the first region 16a of the fluid layer 16 in a second cross section perpendicular to the first direction and including the left lower storage gate electrode BSGA and the right lower storage gate electrode BSGB is defined as a second cross-sectional area S2. As illustrated in FIG. 54C, a cross-sectional area of the sixth region 16f of the fluid layer 16 in a third cross section perpendicular to the first direction and including the first reservoir gate electrode RG1 is defined as a third cross-sectional area S3.

The first cross-sectional area S1 is smaller than the second cross-sectional area S2. The first cross-sectional area S1 is smaller than the third cross-sectional area S3.

A width (w in FIG. 54B) of the fluid layer 16 in the first cross section is smaller than, for example, twice a diameter of the charged particle 20.

Next, an operation of the nonvolatile memory according to the second embodiment will be described. First, a data retention state of the nonvolatile memory will be described.

Similarly to the nonvolatile memory 100 according to the first embodiment, in the nonvolatile memory according to the second embodiment, the charged particles are retained in the memory cell MC by controlling the electrostatic potential in the fluid layer 16.

FIG. 52 illustrates a case where three charged particles are retained in the first memory cell MC1, one charged particle is retained in the second memory cell MC2, two charged particles are retained in the third memory cell MC3, three charged particles are retained in the fourth memory cell MC4, one charged particle is retained in the fifth memory cell MC5, two charged particles are retained in the sixth memory cell MC6, and three charged particles are retained in the seventh memory cell MC7 as an example. A value of data stored in the memory cell MC is decided by the number of charged particles retained in the memory cell MC.

In the data retention state, for example, voltages are not applied to the left barrier gate electrode BGA, the right barrier gate electrode BGB, the left lower storage gate electrode BSGA, the right lower storage gate electrode BSGB, the left upper storage gate electrode TSGA, and the right upper storage gate electrode TSGB.

The material constituting the left lower storage gate electrode BSGA is different from the material constituting the left barrier gate electrode BGA. The work function of the material constituting the left lower storage gate electrode BSGA is larger than the work function of the material constituting the left barrier gate electrode BGA.

Similarly, the material constituting the left upper storage gate electrode TSGA is different from the material constituting the left barrier gate electrode BGA. The material constituting the left upper storage gate electrode TSGA has, for example, a work function larger than the work function of the material constituting the left barrier gate electrode BGA.

The materials constituting the left upper storage gate electrode TSGA and the left lower storage gate electrode BSGA are, for example, p-type polycrystalline silicon. The material constituting the left barrier gate electrode BGA is, for example, n-type polycrystalline silicon. The work function of the p-type polycrystalline silicon is larger than the work function of the n-type polycrystalline silicon.

Thus, the electrostatic potential of the fluid layer facing the left barrier gate electrode BGA is higher than the electrostatic potential of the fluid layer facing the left lower storage gate electrode BSGA and the left upper storage gate electrode TSGA. Accordingly, the charged particles in the memory cell MC are blocked by a potential barrier formed by the left barrier gate electrode BGA, and the movement of the charged particles to the adjacent memory cell MC is suppressed. Thus, the charged particles are retained in the memory cell MC.

The material constituting the right lower storage gate electrode BSGB is different from the material constituting the right barrier gate electrode BGB. The work function of the material constituting the right lower storage gate electrode BSGB is larger than the work function of the material constituting the right barrier gate electrode BGB.

Similarly, the material constituting the right upper storage gate electrode TSGB is different from the material constituting the right barrier gate electrode BGB. The material constituting the right upper storage gate electrode TSGB has, for example, a work function larger than the work function of the material constituting the right barrier gate electrode BGB.

The materials constituting the right upper storage gate electrode TSGB and the right lower storage gate electrode BSGB are, for example, p-type polycrystalline silicon. The material constituting the right barrier gate electrode BGB is, for example, n-type polycrystalline silicon. The work function of the p-type polycrystalline silicon is larger than the work function of the n-type polycrystalline silicon.

Thus, the electrostatic potential of the fluid layer facing the right barrier gate electrode BGB is higher than the electrostatic potential of the fluid layer facing the right lower storage gate electrode BSGB and the right upper storage gate electrode TSGB. Accordingly, the charged particles in the memory cell MC are blocked by a potential barrier formed by the right barrier gate electrode BGB, and the movement of the charged particles to the adjacent memory cell MC is suppressed. Thus, the charged particles are retained in the memory cell MC.

Next, a read operation and a write operation of the nonvolatile memory according to the second embodiment will be described.

Similarly to the nonvolatile memory 100 according to the first embodiment, the nonvolatile memory according to the second embodiment sequentially transfers the data stored in the connected memory cells MC in the memory bottle MB to the adjacent memory cells MC during the read operation and the write operation. The nonvolatile memory moves the charged particles 20 in the fluid layer 16 by controlling the electrostatic potential in the fluid layer 16. The electrostatic potential in the fluid layer 16 is controlled by changing voltages to be applied to the left barrier gate electrode BGA, the right barrier gate electrode BGB, the left lower storage gate electrode BSGA, the right lower storage gate electrode BSGB, the left upper storage gate electrode TSGA, the right upper storage gate electrode TSGB, the left stand-by electrode SBGA, and the right stand-by electrode SBGB.

The nonvolatile memory according to the second embodiment performs a so-called shift register type operation during the read operation and the write operation. Unlike the nonvolatile memory 100 according to the first embodiment, the read operation of the nonvolatile memory according to the second embodiment is non-destructive reading for storing data stored in the memory cell MC.

Figure 56:
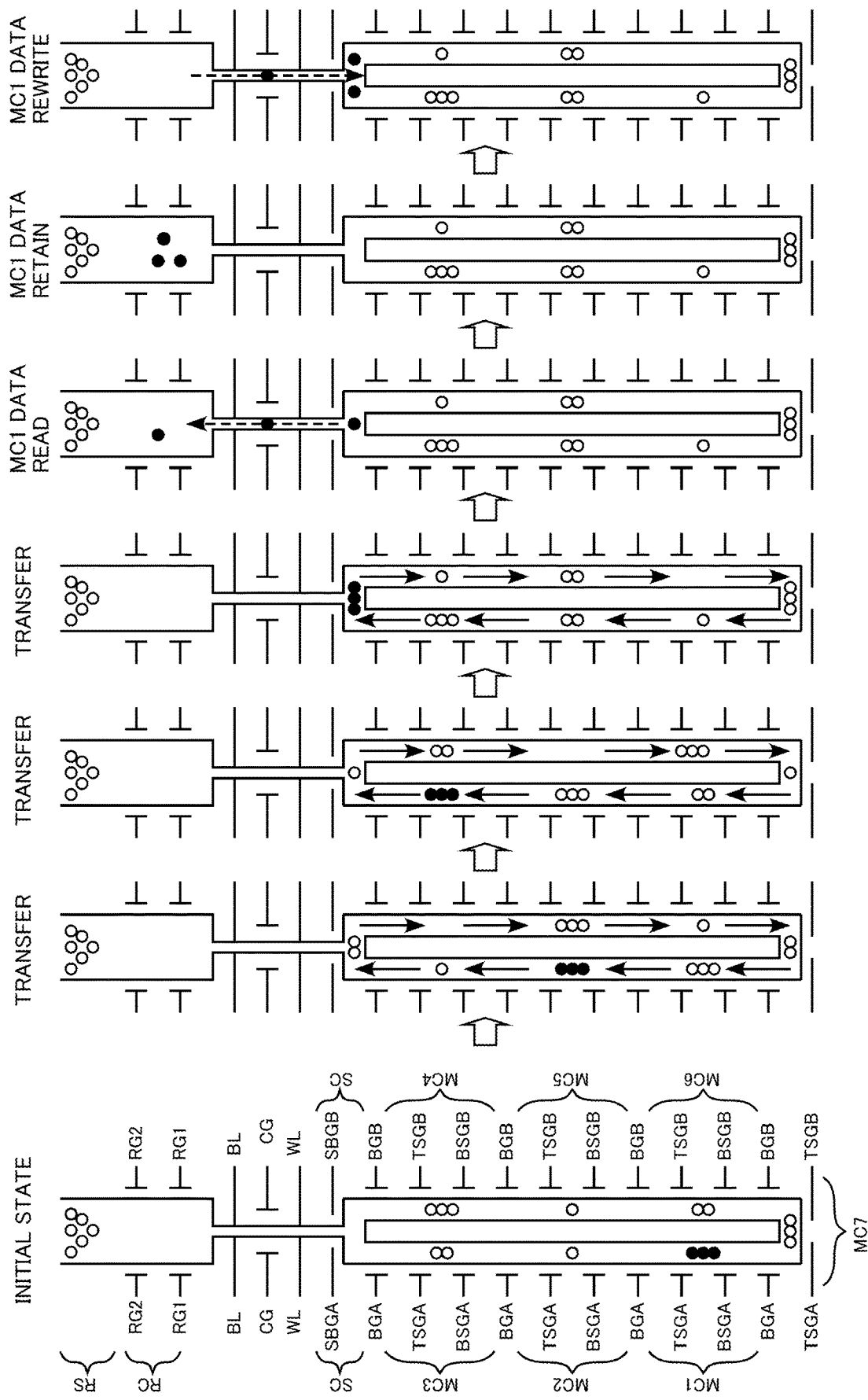
FIG. 56 is an explanatory diagram of a read operation of the memory device according to the second embodiment.

FIG. 56 is an explanatory diagram of the read operation of the memory device according to the second embodiment. FIG. 56 illustrates a sequence when data stored in the first memory cell MC1 is read. FIG. 56 illustrates a case where three charged particles are retained in the first memory cell MC1, one charged particle is retained in the second memory cell MC2, two charged particles are retained in the third memory cell MC3, three charged particles are retained in the fourth memory cell MC4, one charged particle is retained in the fifth memory cell MC5, two charged particles are retained in the sixth memory cell MC6, and three charged particles are retained in the seventh memory cell MC7 in an initial state as an example. In FIG. 56, the three charged particles retained in the first memory cell MC1 in the initial state are indicated by black circles.

When the data stored in the first memory cell MC1 is read, the charged particles retained in the first memory cell MC1 are transferred to the stand-by cell SC. After the charged particles retained in the first memory cell MC1 are transferred to the stand-by cell SC, the data of the first memory cell MC1 is read by reading the number of charged particles retained in the stand-by cell SC. Similarly to the nonvolatile memory 100 according to the first embodiment, the number of charged particles retained in the stand-by cell SC is read by monitoring a change in the current flowing through the bit line BL.

The charged particles read from the stand-by cell SC are retained in the reservoir cell RC. The data stored in the first memory cell MC1 is stored in the reservoir cell RC.

Subsequently, the charged particles retained in the reservoir cell RC are moved to the stand-by cell SC. The data stored in the first memory cell MC1 is stored in the stand-by cell SC. The data stored in the first memory cell MC1 is rewritten to the stand-by cell SC.

Then, the charged particles retained in the stand-by cell SC are moved to the first memory cell MC1. The data stored in the first memory cell MC1 is the same as the data before the reading. The data reading of the first memory cell MC1 is non-destructive reading.

The data stored in the plurality of memory bottles MB to be controlled by using the common barrier gate electrode BG, the common lower storage gate electrode BSG, and the common upper storage gate electrode TSG is collectively read, for example. For example, data reading of the third memory cells MC3 of the plurality of memory bottles MB, data transferring, data reading of the second memory cells MC2 of the plurality of memory bottles MB, data transferring, data reading of the first memory cells MC1 of the plurality of memory bottles MB, data transferring, data reading of the seventh memory cells MC7 of the plurality of memory bottles MB, data transferring, data reading of the sixth memory cells MC6 of the plurality of memory bottles MB, data transferring, data reading of the fifth memory cells MC5 of the plurality of memory bottles MB, data transferring, and data reading of the fourth memory cells MC4 of the plurality of memory bottles MB are sequentially performed.

Figure 57:
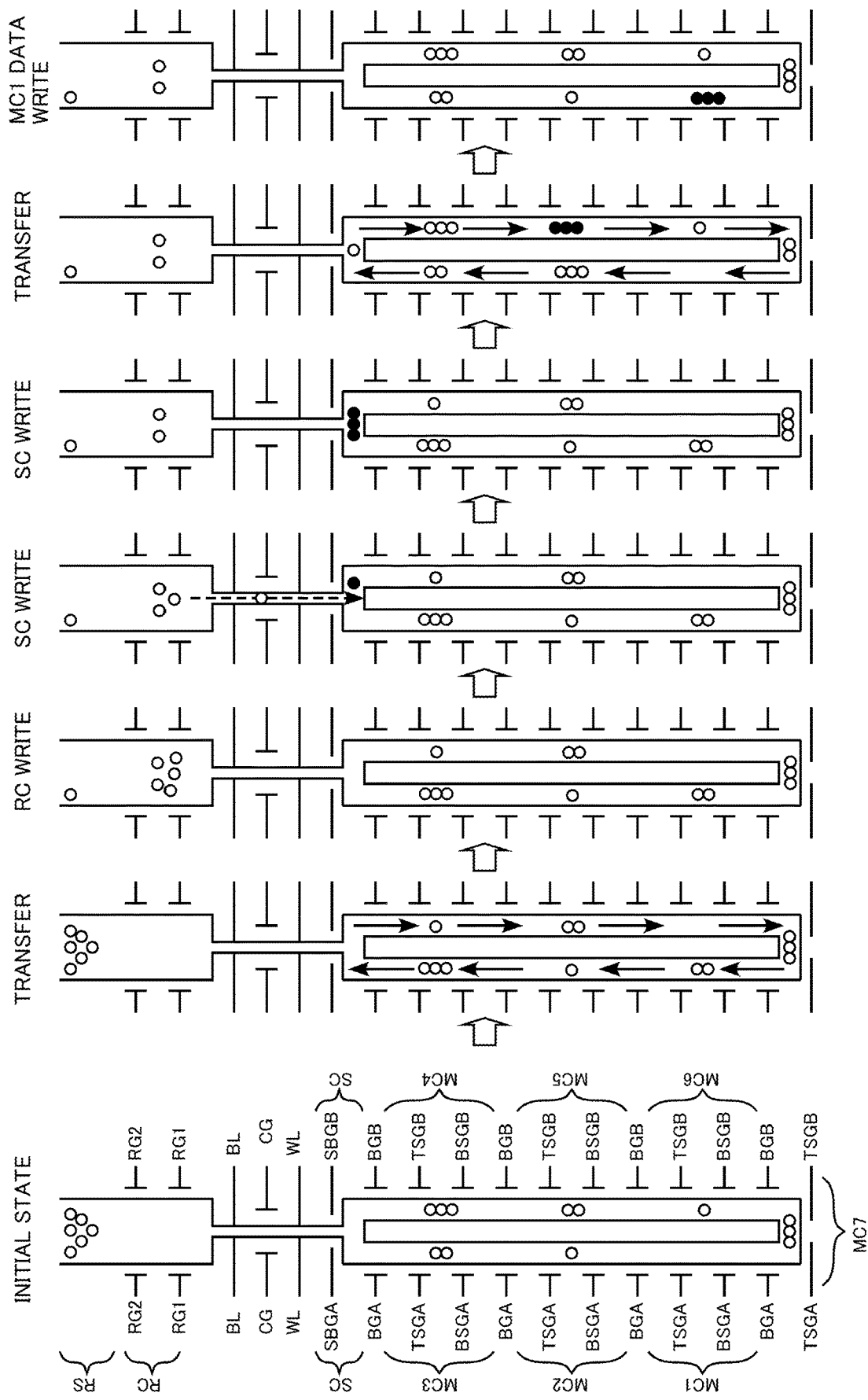
FIG. 57 is an explanatory diagram of a write operation of the memory device according to the second embodiment.

FIG. 57 is an explanatory diagram of the write operation of the memory device according to the second embodiment. FIG. 57 illustrates a sequence when data is written to the first memory cell MC1. FIG. 57 illustrates a case where three charged particles are written to the first memory cell MC1 as an example.

FIG. 57 illustrates a case where zero charged particle is retained in the first memory cell MC1, one charged particle is retained in the second memory cell MC2, two charged particles are retained in the third memory cell MC3, three charged particles are retained in the fourth memory cell MC4, two charged particles are retained in the fifth memory cell MC5, one charged particle is retained in the sixth memory cell MC6, and three charged particles are retained in the seventh memory cell MC7 in an initial state as an example. In FIG. 57, the three charged particles to be written into the first memory cell MC1 are indicated by black circles.

When data is written to the first memory cell MC1, the data of the first memory cell MC1 is transferred to the stand-by cell SC. Subsequently, the charged particles accumulated in the reservoir cell RC are moved to the reservoir cell RC. Then, the three charged particles are moved from the reservoir cell RC to the stand-by cell SC. The data to be written to the first memory cell MC1 is written to the stand-by cell SC. Similarly to the nonvolatile memory 100 according to the first embodiment, the number of charged particles moving to the stand-by cell SC is read by monitoring a change in the current flowing through the bit line BL.

Subsequently, the three charged particles retained in the stand-by cell SC are moved. Finally, the three charged particles are moved to the first memory cell MC1. The data of the stand-by cell SC is transferred to the first memory cell MC1. The data writing to the first memory cell MC1 is completed.

For example, the data writing to the plurality of memory bottles MB to be controlled by using the common barrier gate electrode BG, the common lower storage gate electrode BSG, and the common upper storage gate electrode TSG is collectively performed. For example, data writing of the third memory cells MC3 of the plurality of memory bottles MB, data transferring, data writing of the second memory cells MC2 of the plurality of memory bottles MB, data transferring, data writing of the first memory cells MC1 of the plurality of memory bottles MB, data transferring, data writing of the seventh memory cells MC7 of the plurality of memory bottles MB, data transferring, data writing of the sixth memory cells MC6 of the plurality of memory bottles MB, data transferring, data writing of the fifth memory cells MC5 of the plurality of memory bottles MB, data transferring, and data writing of the fourth memory cells MC4 of the plurality of memory bottles MB are sequentially performed.

Modification Example

Figure 58:
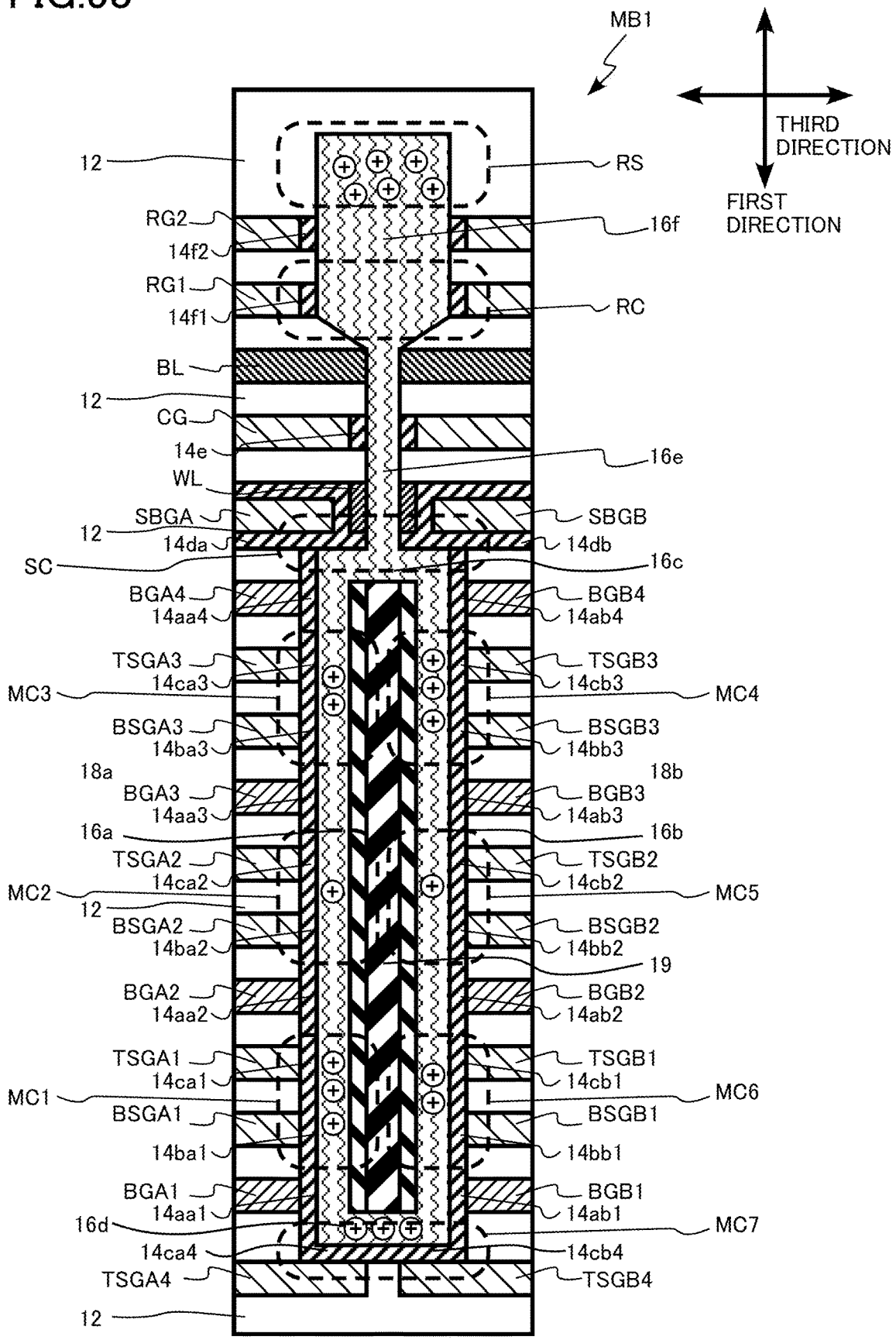
FIG. 58 is a schematic cross-sectional view of a modification example of the memory device according to the second embodiment.

FIG. 58 is a schematic cross-sectional view of a modification example of the memory device according to the second embodiment. FIG. 58 is a cross-sectional view corresponding to FIG. 52. The nonvolatile memory according to the modification example is different from the nonvolatile memory according to the second embodiment in that the word line WL is provided between the left stand-by electrode SBGA and the right stand-by electrode SBGB.

According to the nonvolatile memory according to the modification example, the charged particles retained in the stand-by cell SC can be easily moved to the fifth region 16e of the fluid layer 16 during the read operation.

As described above, according to the second embodiment and the modification example, it is possible to realize the memory device capable of setting the data stored in the memory cell to be multivalued.

In the first and second embodiments, although the case where the charged particles 20 have positive charges has been described as an example, the charged particles 20 may have negative charges. When the charged particles 20 have negative charges, for example, in the nonvolatile memory similar to the nonvolatile memory according to the first embodiment, the work functions of the materials constituting the lower storage gate electrode BSG and the upper storage gate electrode TSG are smaller than the work function of the material constituting the barrier gate electrode BG.

For example, in the nonvolatile memory similar to the nonvolatile memory according to the first embodiment, when the charged particles 20 have negative charges, the third work function is smaller than the first work function and the second work function. The fourth work function is smaller than the first work function and the second work function. The sixth work function is smaller than the first work function and the second work function. The ninth work function is smaller than the eighth work function. The tenth work function is smaller than the first work function and the second work function.

In the first and second embodiments, although the case where the number of storage gate electrodes between the barrier gate electrodes is two has been described as an example, the number of storage gate electrodes between the barrier gate electrodes may be equal to or more than one or three.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
   a fluid layer extending in a first direction;
   a particle in the fluid layer;
   a first control electrode made of a first material;
   a first insulating film provided between the fluid layer and the first control electrode;
   a second control electrode made of a second material, the second control electrode being spaced apart from the first control electrode in the first direction;
   a second insulating film provided between the fluid layer and the second control electrode;
   a third control electrode made of a third material different from the first material and the second material, the third control electrode provided between the first control electrode and the second control electrode; and
   a third insulating film provided between the fluid layer and the third control electrode.

2. The memory device according to claim 1, wherein the first material and the second material are the same.

3. The memory device according to claim 1, wherein a third work function of the third material is different from a first work function of the first material and a second work function of the second material.

4. The memory device according to claim 3, wherein the third work function is smaller than the first work function and the second work function.

5. The memory device according to claim 3, wherein the third work function is larger than the first work function and the second work function.

6. The memory device according to claim 1, wherein the first control electrode and the third control electrode are electrically isolated from each other, and the second control electrode and the third control electrode are electrically isolated from each other.

7. The memory device according to claim 1, further comprising:
- a fourth control electrode made of a fourth material different from the first material and the second material, and the fourth control electrode provided between the second control electrode and the third control electrode; and
- a fourth insulating film provided between the fluid layer and the fourth control electrode.

8. The memory device according to claim 1, further comprising:
- a first conductive layer extending in a second direction intersecting the first direction, the first conductive layer electrically connected to the fluid layer, and the second control electrode provided between the first conductive layer and the third control electrode;
- a second conductive layer extending in a third direction intersecting the first and second directions, the second conductive layer electrically connected to the fluid layer, and the first conductive layer provided between the second conductive layer and the second control electrode;
- a fifth control electrode provided between the first conductive layer and the second conductive layer; and
- a fifth insulating film provided between the fluid layer and the fifth control electrode.

9. The memory device according to claim 8, further comprising:
- a sixth control electrode made of a sixth material different from the second material, and the sixth control electrode provided between the second control electrode and the first conductive layer;
- a sixth insulating film provided between the fluid layer and the sixth control electrode;
- a seventh control electrode, the second conductive layer provided between the seventh control electrode and the fifth control electrode; and
- a seventh insulating film provided between the fluid layer and the seventh control electrode.

10. The memory device according to claim 9, wherein a first cross-sectional area of the fluid layer in a first cross section perpendicular to the first direction and including the fifth control electrode is smaller than a second cross-sectional area of the fluid layer in a second cross section perpendicular to the first direction and including the third control electrode, and the first cross-sectional area is smaller than a third cross-sectional area of the fluid layer in a third cross section perpendicular to the first direction and including the seventh control electrode.

11. The memory device according to claim 9, further comprising:
- an eighth control electrode made of an eighth material, and the eighth control electrode provided between the second control electrode and the sixth control electrode;
- an eighth insulating film provided between the fluid layer and the eighth control electrode;
- a ninth control electrode made of a ninth material different from the eighth material, and the ninth control electrode provided between the second control electrode and the eighth control electrode; and
- a ninth insulating film provided between the fluid layer and the ninth control electrode.

12. The memory device according to claim 1, further comprising:
- an insulator extending in the first direction and surrounded by the fluid layer.

13. A memory device comprising:
- an insulator extending in a first direction;
- a fluid layer including a first region, a second region, a third region, and a fourth region, the first region extending in the first direction, the second region extending in the first direction, the insulator being provided between the second region and the first region, the third region connecting the first region and the second region, the fourth region connecting the first region and the second region, and the insulator being provided between the fourth region and the third region;
- a particle in the fluid layer;
- a first control electrode made of a first material;
- a first insulating film provided between the first region and the first control electrode;
- a second control electrode made of a second material, and the second control electrode being spaced apart from the first control electrode in the first direction;
- a second insulating film provided between the first region and the second control electrode;
- a third control electrode made of a third material, and the third control electrode provided between the first control electrode and the second control electrode;
- a third insulating film provided between the first region and the third control electrode;
- a fourth control electrode made of a fourth material;
- a fourth insulating film provided between the second region and the fourth control electrode;
- a fifth control electrode made of a fifth material, and the fifth control electrode being spaced apart from the fourth control electrode in the first direction;
- a fifth insulating film provided between the second region and the fifth control electrode;
- a sixth control electrode made of a sixth material, and the sixth control electrode provided between the fourth control electrode and the fifth control electrode; and
- a sixth insulating film provided between the second region and the sixth control electrode.

14. The memory device according to claim 13, wherein the third material is different from the first material and the second material, and the sixth material is different from the fourth material and the fifth material.

15. The memory device according to claim 13, wherein the first material and the second material are the same, and the fourth material and the fifth material are the same.

16. The memory device according to claim 13, wherein a third work function of the third material is different from a first work function of the first material and a second work function of the second material, and a sixth work function of the sixth material is different from a fourth work function of the fourth material and a fifth work function of the fifth material.

17. The memory device according to claim 13, wherein the first control electrode and the third control electrode are electrically isolated from each other, the second control electrode and the third control electrode are electrically isolated from each other, the fourth control electrode and the sixth control electrode are electrically isolated from each other, and the fifth control electrode and the sixth control electrode are electrically isolated from each other.

18. The memory device according to claim 13, further comprising:
a seventh control electrode made of a seventh material different from the first material and the second material, and the seventh control electrode provided between the second control electrode and the third control electrode;
a seventh insulating film provided between the first region and the seventh control electrode;
an eighth control electrode made of an eighth material different from the fourth material and the fifth material, and the eighth control electrode provided between the fifth control electrode and the sixth control electrode; and
an eighth insulating film provided between the second region and the eighth control electrode.

19. The memory device according to claim 18,
the fluid layer further includes a fifth region connected to the third region, and the third region is provided between the fifth region and the insulator, and
the memory device further comprising:
a first conductive layer extending in a second direction intersecting the first direction, the first conductive layer electrically connected to the fifth region, and the second control electrode provided between the first conductive layer and the third control electrode;
a second conductive layer extending in a third direction intersecting the first and second directions, the second conductive layer electrically connected to the fifth region, and the first conductive layer provided between the second conductive layer and the second control electrode;
a ninth control electrode provided between the first conductive layer and the second conductive layer; and
a ninth insulating film provided between the fifth region and the ninth control electrode.

20. The memory device according to claim 19,
wherein the fluid layer further includes a sixth region connected to the fifth region, and the fifth region is provided between the sixth region and the third region, and
the memory device further comprising:
a tenth control electrode provided between the second control electrode and the first conductive layer;
a tenth insulating film provided between the third region and the tenth control electrode;
an eleventh control electrode provided between the fourth control electrode and the first conductive layer, and the fifth region provided between the eleventh control electrode and the tenth control electrode;
an eleventh insulating film provided between the third region and the eleventh control electrode;
a twelfth control electrode, the second conductive layer provided between the twelfth control electrode and the ninth control electrode;
a twelfth insulating film provided between the sixth region and the twelfth control electrode;
a thirteenth control electrode provided between the second conductive layer and the twelfth control electrode;
a thirteenth insulating film provided between the sixth region and the thirteenth control electrode;
a fourteenth control electrode;
a fourteenth insulating film provided between the fourth region and the fourteenth control electrode;
a fifteenth control electrode spaced apart from the fourteenth control electrode; and
a fifteenth insulating film provided between the fourth region and the fifteenth control electrode.

* * * * *